(12) United States Patent
Rubin et al.

(10) Patent No.: US 9,342,904 B2
(45) Date of Patent: May 17, 2016

(54) COMPOSING SHAPES AND DATA SERIES IN GEOMETRIES

(71) Applicant: Microsoft Technology Licensing, LLC, Redmond, WA (US)

(72) Inventors: Darryl E. Rubin, Duvall, WA (US); Vijay Mital, Sammamish, WA (US); David G. Green, Redmond, WA (US); Brian C. Beckman, Newcasstle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 14/496,511

(22) Filed: Sep. 25, 2014

(65) Prior Publication Data

US 2015/0009219 A1 Jan. 8, 2015

Related U.S. Application Data

(63) Continuation of application No. 12/488,300, filed on Jun. 19, 2009, now Pat. No. 8,866,818.

(51) Int. Cl.
*G06T 11/20* (2006.01)
*G06T 19/00* (2011.01)
(Continued)

(52) U.S. Cl.
CPC .............. *G06T 11/20* (2013.01); *G06F 17/50* (2013.01); *G06T 3/40* (2013.01); *G06T 11/206* (2013.01);
(Continued)

(58) Field of Classification Search
CPC ..... G06T 17/00; G06T 15/00; G06T 2200/04; G06Q 10/06; G06Q 30/02
See application file for complete search history.

(56) References Cited

U.S. PATENT DOCUMENTS

| | | |
|---|---|---|
| 5,189,633 A | 2/1993 | Bonadio |
| 5,469,538 A | 11/1995 | Razdow |

(Continued)

FOREIGN PATENT DOCUMENTS

| | | |
|---|---|---|
| EP | 1069534 | 1/2001 |
| WO | WO 2007079131 | 7/2007 |
| WO | WO 2007113573 | 10/2007 |

OTHER PUBLICATIONS

3D Representations for Software Visualization, Published: 2003 http://www.cs.wayne.edu/~vip/publications/Marcus.SoftVis.2003.3DRepresentation.pdf (10 pages).

(Continued)

*Primary Examiner* — Jeffrey Chow
(74) *Attorney, Agent, or Firm* — Jessica Meyers; Fehmi Chebil; Micky Minhas

(57) ABSTRACT

Formulating a visual scene includes accessing shapes, each corresponding to an object that is to be visually represented. Formulating the visual scene also includes accessing a data series, which includes data points to be applied to the shapes. Formulating the visual scene also includes accessing a geometry, which includes a container, a binding definition, and an arrangement definition. The data series is visualized within the container by visually rendering each shape within the container. The binding definition defines how to apply each data point to a shape. The arrangement definition defines how to map an axis set to a coordinate system of the container, and how to lay out the shapes within dimensions of the container. Formulating the visual scene includes populating the geometry with a visual representation of the data series using the shapes, including visually rendering each shape within the container according to the binding and arrangement definitions.

21 Claims, 39 Drawing Sheets

(51) Int. Cl.
 *G06F 17/50* (2006.01)
 *G06T 3/40* (2006.01)
 *G06T 19/20* (2011.01)

(52) U.S. Cl.
 CPC ............... *G06T 19/00* (2013.01); *G06T 19/20* (2013.01); *G06T 2219/012* (2013.01); *G06T 2219/2012* (2013.01); *G06T 2219/2021* (2013.01)

(56) References Cited

U.S. PATENT DOCUMENTS

| | | | |
|---|---|---|---|
| 5,481,741 A | 1/1996 | McKaskle | |
| 5,491,779 A | 2/1996 | Bezjian | |
| 5,528,735 A | 6/1996 | Strasnick | |
| 5,535,385 A | 7/1996 | Griffin | |
| 5,537,618 A | 7/1996 | Boulton et al. | |
| 5,555,354 A | 9/1996 | Strasnick | |
| 5,675,746 A | 10/1997 | Marshall | |
| 5,732,001 A | 3/1998 | Nakayama | |
| 5,764,241 A | 6/1998 | Elliott | |
| 5,809,499 A | 9/1998 | Wong | |
| 5,818,737 A | 10/1998 | Orr | |
| 5,860,810 A | 1/1999 | Faul | |
| 5,874,955 A | 2/1999 | Rogowitz et al. | |
| 5,923,324 A | 7/1999 | Berry | |
| 5,945,976 A | 8/1999 | Iwamura | |
| 6,034,697 A | 3/2000 | Becker | |
| 6,063,126 A | 5/2000 | Borduin | |
| 6,073,115 A | 6/2000 | Marshall | |
| 6,085,978 A | 7/2000 | Knowles et al. | |
| 6,088,698 A | 7/2000 | Lipkin | |
| 6,104,410 A | 8/2000 | Wong | |
| 6,175,954 B1 | 1/2001 | Nelson | |
| 6,189,012 B1 | 2/2001 | Mital | |
| 6,208,985 B1 | 3/2001 | Krehel | |
| 6,211,887 B1 | 4/2001 | Meier | |
| 6,222,533 B1 | 4/2001 | Notani | |
| 6,239,796 B1 | 5/2001 | Alexander | |
| 6,260,035 B1 | 7/2001 | Horvitz | |
| 6,263,339 B1 | 7/2001 | Hirsch | |
| 6,266,053 B1 | 7/2001 | French | |
| 6,269,325 B1 | 7/2001 | Lee | |
| 6,286,017 B1 | 9/2001 | Egilsson | |
| 6,385,563 B1 | 5/2002 | Vora et al. | |
| 6,484,164 B1 | 11/2002 | Nikolovska | |
| 6,536,037 B1 | 3/2003 | Guheen et al. | |
| 6,611,738 B2 | 8/2003 | Ruffner | |
| 6,639,614 B1 | 10/2003 | Kosslyn | |
| 6,647,119 B1 | 11/2003 | Slezak | |
| 6,662,146 B1 | 12/2003 | Watts | |
| 6,687,657 B2 | 2/2004 | Levin | |
| 6,690,370 B2 | 2/2004 | Ellenby | |
| 6,707,454 B1 | 3/2004 | Barg | |
| 6,714,868 B2 | 3/2004 | Picone | |
| 6,717,599 B1 | 4/2004 | Olano | |
| 6,753,885 B2 | 6/2004 | Stoakley | |
| 6,823,299 B1 | 11/2004 | Contreras | |
| 6,831,603 B2 | 12/2004 | Menache | |
| 6,836,270 B2 | 12/2004 | Du | |
| 6,842,175 B1 | 1/2005 | Schmalstieg et al. | |
| 6,856,980 B2 | 2/2005 | Feldman | |
| 6,867,788 B1 | 3/2005 | Takeda | |
| 6,868,525 B1 | 3/2005 | Szabo | |
| 6,904,561 B1 | 6/2005 | Faraday et al. | |
| 6,906,712 B2 | 6/2005 | Lee et al. | |
| 6,912,515 B2 | 6/2005 | Jackson | |
| 6,922,681 B2 | 7/2005 | Fromherz | |
| 6,928,436 B2 | 8/2005 | Baudel | |
| 6,948,154 B1 | 9/2005 | Rothermel | |
| 6,957,191 B1 | 10/2005 | Belcsak | |
| 6,959,432 B2 | 10/2005 | Crocker | |
| 6,963,824 B1 | 11/2005 | Davidson | |
| 6,982,712 B2 | 1/2006 | Ohto | |
| 6,983,227 B1 | 1/2006 | Thalhammer-Reyero | |
| 6,985,623 B2 | 1/2006 | Prakash | |
| 6,995,768 B2 | 2/2006 | Jou | |
| 7,038,680 B2 | 5/2006 | Pitkow | |
| 7,039,569 B1 | 5/2006 | Haws et al. | |
| 7,047,168 B2 | 5/2006 | Carballo | |
| 7,055,107 B1 | 5/2006 | Rappaport et al. | |
| 7,058,896 B2 | 6/2006 | Hughes | |
| 7,089,220 B2 | 8/2006 | Fromherz | |
| 7,089,221 B2 | 8/2006 | Fromherz | |
| 7,099,890 B2 | 8/2006 | Cahill | |
| 7,102,643 B2 | 9/2006 | Moore et al. | |
| 7,114,127 B2 | 9/2006 | Weitzman | |
| 7,139,764 B2 | 11/2006 | Lee | |
| 7,165,105 B2 | 1/2007 | Reiner | |
| 7,212,200 B2 | 5/2007 | Fujita | |
| 7,216,116 B1 | 5/2007 | Nilsson | |
| 7,219,307 B2 | 5/2007 | Senay | |
| 7,250,951 B1 | 7/2007 | Hurley | |
| 7,265,752 B2 | 9/2007 | Sander | |
| 7,266,515 B2 | 9/2007 | Costello et al. | |
| 7,272,815 B1 | 9/2007 | Eldridge | |
| 7,272,817 B1 | 9/2007 | Hinkle et al. | |
| 7,307,640 B2 | 12/2007 | Demers et al. | |
| 7,334,222 B2 | 2/2008 | Keller | |
| 7,365,311 B1 | 4/2008 | Cetto | |
| 7,392,312 B1 | 6/2008 | Philyaw | |
| 7,440,906 B1 | 10/2008 | Wetzer et al. | |
| 7,486,292 B2 | 2/2009 | Itoh | |
| 7,530,020 B2 | 5/2009 | Szabo | |
| 7,559,039 B2 | 7/2009 | Ridgley | |
| 7,574,336 B1 | 8/2009 | Jackson | |
| 7,574,659 B2 | 8/2009 | Szabo | |
| 7,598,976 B2 | 10/2009 | Sofer et al. | |
| 7,739,343 B2 | 6/2010 | Gardner et al. | |
| 7,765,175 B2 | 7/2010 | Crandall | |
| 7,817,150 B2 | 10/2010 | Reichard | |
| 7,823,122 B1 | 10/2010 | Englehard | |
| 7,831,608 B2 | 11/2010 | Aizenbud-Reshef et al. | |
| 7,873,946 B2 | 1/2011 | Lathrop | |
| 7,890,336 B2 | 2/2011 | Bimbaum et al. | |
| 7,912,807 B2 | 3/2011 | McLean | |
| 7,965,290 B1 | 6/2011 | Kouznetsov | |
| 7,973,786 B2 | 7/2011 | Gyorfi et al. | |
| 2001/0049695 A1 | 12/2001 | Chi | |
| 2002/0010571 A1 | 1/2002 | Daniel, Jr. | |
| 2002/0070953 A1 | 6/2002 | Barg | |
| 2002/0073058 A1 | 6/2002 | Kremer et al. | |
| 2002/0078086 A1 | 6/2002 | Alden | |
| 2002/0140740 A1 | 10/2002 | Chen et al. | |
| 2002/0145623 A1 | 10/2002 | Decombe | |
| 2002/0169658 A1 | 11/2002 | Adler | |
| 2002/0183995 A1 | 12/2002 | Veitch | |
| 2003/0103089 A1 | 6/2003 | Ramani | |
| 2003/0144868 A1 | 7/2003 | MacIntyre | |
| 2003/0146939 A1 | 8/2003 | Petropoulos et al. | |
| 2004/0015783 A1 | 1/2004 | Lennon | |
| 2004/0017402 A1 | 1/2004 | Bardon et al. | |
| 2004/0075677 A1 | 4/2004 | Loyall | |
| 2004/0075697 A1 | 4/2004 | Maudlin | |
| 2004/0080536 A1 | 4/2004 | Yakhini | |
| 2004/0114258 A1 | 6/2004 | Harris | |
| 2004/0154000 A1 | 8/2004 | Kasravi | |
| 2004/0189702 A1 | 9/2004 | Hlavac | |
| 2004/0196287 A1 | 10/2004 | Wong | |
| 2004/0221855 A1 | 11/2004 | Ashton | |
| 2004/0239494 A1 | 12/2004 | Kennedy | |
| 2004/0246252 A1 | 12/2004 | Morrow | |
| 2005/0012743 A1 | 1/2005 | Kapler | |
| 2005/0035883 A1 | 2/2005 | Kameda | |
| 2005/0057560 A1 | 3/2005 | Bibr | |
| 2005/0081161 A1 | 4/2005 | Macinnes et al. | |
| 2005/0091584 A1 | 4/2005 | Bogdan | |
| 2005/0094207 A1 | 5/2005 | Lo | |
| 2005/0108256 A1 | 5/2005 | Wakefield | |
| 2005/0120021 A1 | 6/2005 | Tang | |
| 2005/0131657 A1 | 6/2005 | Mei | |
| 2005/0131659 A1 | 6/2005 | Mei et al. | |
| 2005/0137921 A1 | 6/2005 | Shahriari | |
| 2005/0140678 A1 | 6/2005 | Gielis et al. | |

(56) References Cited

U.S. PATENT DOCUMENTS

| | | |
|---|---|---|
| 2005/0210054 A1 | 9/2005 | Harris |
| 2005/0275622 A1 | 12/2005 | Patel et al. |
| 2006/0010100 A1 | 1/2006 | McAvoy et al. |
| 2006/0020523 A1 | 1/2006 | Song |
| 2006/0055696 A1 | 3/2006 | Loberg |
| 2006/0066632 A1 | 3/2006 | Wong et al. |
| 2006/0080594 A1 | 4/2006 | Chavoustie |
| 2006/0082571 A1 | 4/2006 | McDaniel et al. |
| 2006/0106793 A1 | 5/2006 | Liang |
| 2006/0107234 A1 | 5/2006 | Tudor et al. |
| 2006/0112123 A1 | 5/2006 | Clark |
| 2006/0117067 A1 | 6/2006 | Wright |
| 2006/0117303 A1 | 6/2006 | Gizinski |
| 2006/0221077 A1 | 10/2006 | Wright |
| 2006/0253245 A1 | 11/2006 | Cera |
| 2006/0271581 A1 | 11/2006 | Sanjar |
| 2006/0288023 A1 | 12/2006 | Szabo |
| 2007/0005534 A1 | 1/2007 | Sabato |
| 2007/0010901 A1 | 1/2007 | Fukui |
| 2007/0011134 A1 | 1/2007 | Langseth et al. |
| 2007/0016873 A1 | 1/2007 | Lindsay |
| 2007/0033443 A1 | 2/2007 | Tillmann |
| 2007/0043694 A1 | 2/2007 | Sawafta |
| 2007/0136406 A1 | 6/2007 | Softky |
| 2007/0141541 A1 | 6/2007 | Chan et al. |
| 2007/0156677 A1 | 7/2007 | Szabo |
| 2007/0162866 A1 | 7/2007 | Matthews |
| 2007/0168454 A1 | 7/2007 | Ben-Yehuda |
| 2007/0188494 A1 | 8/2007 | Agutter |
| 2007/0226189 A1 | 9/2007 | Piekos et al. |
| 2007/0242082 A1 | 10/2007 | Lathrop et al. |
| 2007/0244910 A1 | 10/2007 | Mital |
| 2007/0271207 A1 | 11/2007 | Copty |
| 2007/0271508 A1 | 11/2007 | Aubet |
| 2007/0272423 A1 | 11/2007 | Cutler et al. |
| 2007/0277111 A1 | 11/2007 | Bennett |
| 2007/0279416 A1 | 12/2007 | Cobb |
| 2007/0282809 A1 | 12/2007 | Hoeber et al. |
| 2007/0294196 A1 | 12/2007 | Musuvathi |
| 2008/0010041 A1 | 1/2008 | McDaniel |
| 2008/0015823 A1 | 1/2008 | Arnold |
| 2008/0059889 A1 | 3/2008 | Parker |
| 2008/0062167 A1 | 3/2008 | Boggs |
| 2008/0104118 A1 | 5/2008 | Pulfer |
| 2008/0115049 A1 | 5/2008 | Tolle |
| 2008/0115082 A1 | 5/2008 | Simmons |
| 2008/0133505 A1 | 6/2008 | Bayley et al. |
| 2008/0192056 A1 | 8/2008 | Robertson |
| 2008/0218531 A1 | 9/2008 | Chou |
| 2008/0221487 A1 | 9/2008 | Zohar |
| 2008/0263468 A1 | 10/2008 | Cappione |
| 2008/0320413 A1 | 12/2008 | Oshiro et al. |
| 2009/0006318 A1 | 1/2009 | Lehtipalo |
| 2009/0007012 A1 | 1/2009 | Mandic et al. |
| 2009/0013270 A1 | 1/2009 | Helfman |
| 2009/0089227 A1 | 4/2009 | Sturrock et al. |
| 2009/0094557 A1 | 4/2009 | Howard |
| 2009/0219284 A1 | 9/2009 | Maillot et al. |
| 2009/0228828 A1 | 9/2009 | Beatty et al. |
| 2009/0322739 A1 | 12/2009 | Rubin |
| 2009/0322743 A1 | 12/2009 | Rubin |
| 2009/0326872 A1 | 12/2009 | Rubin |
| 2009/0326885 A1 | 12/2009 | Rubin |
| 2009/0326919 A1 | 12/2009 | Bean |
| 2009/0327183 A1 | 12/2009 | Rubin |
| 2010/0011309 A1 | 1/2010 | Mitra et al. |
| 2010/0100405 A1 | 4/2010 | Lepore |
| 2010/0118026 A1 | 5/2010 | Demchak |
| 2010/0131248 A1 | 5/2010 | Green |
| 2010/0131254 A1 | 5/2010 | Rubin |
| 2010/0131255 A1 | 5/2010 | Beckman |
| 2010/0131546 A1 | 5/2010 | Mital |
| 2010/0156900 A1 | 6/2010 | Beckman |
| 2010/0321391 A1 | 12/2010 | Rubin |
| 2010/0321407 A1 | 12/2010 | Mital |
| 2010/0324867 A1 | 12/2010 | Mital |
| 2010/0324870 A1 | 12/2010 | Beckman |
| 2010/0325166 A1 | 12/2010 | Rubin |
| 2010/0325196 A1 | 12/2010 | Beckman |
| 2010/0325564 A1 | 12/2010 | Mital |
| 2010/0325578 A1 | 12/2010 | Mital |
| 2011/0060704 A1 | 3/2011 | Rubin |
| 2011/0138319 A1 | 6/2011 | Sidman |
| 2012/0156662 A1 | 6/2012 | Mital et al. |

OTHER PUBLICATIONS

Multi-Dimensional Data Visualization Published: 2002 http://www.cs.albany.edu/~erbacher/publications/BSC303.pdf (7 pages).

Anthropomorphic Visualization: A New Approach for Depicting Participants in Online Spaces (4 pages) http://smg.media.mit.edu/papers/Perry/lb270-perry.PDF (Apr. 24-29, 2004).

Browsing Large Online Data Tables using Generalized Query Previews (24 pages) hcil.cs.umd.edu/trs/2001-13/2001-13.ps (Feb. 5, 2002).

SHriMP Views: An Interactive Environment for Information Visualization and Navigation (2 pages) http:sigchi.org/chi2003/docs/shrimp.pdf (Apr. 20-25, 2002).

SDM: Selective Dynamic Manipulation of Visualizations Published: 1995 (10 pages) http://www.ri.cmu.edu/pub_files/pub1/chuah_mei_1995_1.pdf.

Tube Map: Evaluation of a Visual Metaphor for Interfunctional Communication of Complex Projects (8 pages) http://know-center.tugraz.at/previous/i-know04/papers/burkhard.pdf (Graz, Austria, Jun. 30-Jul. 2, 2004).

Visual Metaphors for Database Exploration1, Published: 1995 (13 pages) http://citeseer.ist.psu.edu/cache/papers/cs/5732/http:zSzzSzwww.darmstadt.gmd.dezSzoasyszSzprojectszSzvirgiliozSzvirgilio.pdf/levialdi95visual.pdf.

Visualizing Software Changes (17 pages) http://ieeexplore.ieee.org/iel5/32/21473/00995435.pdf?isnumber=21473&prod=STD&arnumber=995435&arnumber=995435&arSt=396&ared=412&arAuthor=Eick%2C+S.G.%3B+Graves%2C+T.L.%3B+Karr%2C+A.F.%3B+Mockus%2C+A.%3B+Schuster%2C+P. (IEEE Transactions on Software Engineering, vol. 28, No. 4 Apr. 2002).

System Structure Analysis: Clustering with Data Bindings (9 pages) http://ieeexplore.ieee.org/iel5/32/35878/01702084.pdf (IEEE Transactions on Software Engineering, vol. SE-11, No. 8, Aug. 1985).

Solver Platform SDK—Solver Engines (4 pages) http://www.solver.com/skdengines.htm (Available at least as early as Apr. 11, 2008).

Plug-in Architecture of Constraint Hierarchy Solvers, Published: 1997 (4 pages) http://citeseer.ist.psu.edu/cache/papers/cs/12565/http:zSzzSzkti.ms.mff.cuni.czzSz~bartakzSzhtmlzSz..zSzdownloadszSzPlugIn.pdf/bartak97plug.pdf.

ExSched: Solving Constraint Satisfaction Problems with the Spreadsheet Paradigm, Jan. 2007, (11 pages) http://arxiv.org/ftp/cs/papers/0701/0701109.pdf.

Visual Representations and Interaction Technologies, IEEE 2005 http://nvac.pnl.gov/docs/RD_Agenda_NVAC_chapter3.pdf (36 pages).

Introduction to Visual Analytics, Published 2007, http://www.donauuni.ac.at/imperia/md/content/department/ike/ike_publications/2007/refereeconferenceandworkshoparticles/va-tutorial.pdf (4 pages).

Brook, Russell, "Solid Edge Design Sensors (On the Edge Solid Edge Tutorial)", Apr. 1, 2008, 4 pages.

Brook, Russell, "Supply Chain Collaboration (On the Edge Solid Edge Tutorial)", Jan. 1, 2007, 7 pages.

Unigraphics Solutions, "Solid Edge User's Guide Version 8", Chapters 8-10, Glossary, 2000, 82 pages.

Unigraphics Solutions, "Solid Edge User's Guide", Version 8, Copyright 2000.

"About SAGA GIS," SAGA, www.saga-gis.uni-goettingen.de/html/index.php (Aug. 1, 2008).

"GIS Modeling," Clark Labs, www.clarklabs.org/products/GIS-Modeling.cfm (2006).

(56) References Cited

OTHER PUBLICATIONS

"3D Landscape Design & Visualization Software," 3D Nature, http://3dnature.com/ (2008).
"ChemSite 3D Molecular Visualization Software," Chemistry Software, www.chemistry-software.com/modelling/10190.htm (Aug. 1, 2008).
Heer, Jeffrey, "Design Consideration for Collaborative Visual Analytics," Feb. 21, 2008.
Chi, Ed H., "A Taxonomy of Visualization Techniques using the Data State Reference Model," Xerox Palo Alto Research Center, 2000.
Tory, Melanie, "A Model-Based Visualization Taxonomy," School of Computing Science, Simon Fraser University, 2002.
Chen, Hong, "Towards Design Patterns for Dynamic Analytical Data Visualization," Analytical Solutions Division, SAS Institute Inc., 2004.
Rodrigues, Jose F., "Reviewing Data Visualization: an Analytical Taxonomical Study," University of Sao Paulo at Sao Carlos, Brazil, 2006, pp. 1-8.
Koehler, Jana, "The Role of Visual Modeling and Model Transformations in Business-driven Development," IBM Zurich Research Laboratory, Switzerland, 2006, pp. 1-12.
Bunus, Peter, "A Simulation and Decision Framework for Selection of Numerical Solvers in Scientific Computing," Linkoping University, Sweden, Aug. 2006.
"Maplesoft Enhances Math Software," Maplesoft, www.automation.com/content/maplesoft-enhances-math-software, Aug. 26, 2008.
"Matlab," Research Services, Information Technology Services, www.bc.edu/offices/researchservices/software/Matlab.html, Mar. 2007.
"SchematicSolver," Mathematica Application, www.SchematicSolver.com, (accessed Aug. 26, 2008).
"TIBCO Spotfire DecisionSite Enterprise Analytics Product Suite," TIBCO Software Inc., http://spotfire.tibco.com/products/decisionsite.cfm, Aug. 26, 2008.
"Math Package Gives you Extensive Range of Symbolic and Numerical Capabilities," CNET Networks Inc., http://findarticles.com/p/articles/mi_hb4804/is_198907/ai_n17443817, Aug. 26, 2008.
Whiting, Mark A., "WebTheme: Understanding Web Information through Visual Analytics," Pacific Northwest National Laboratory, *Lecture Notes in Computer Science*, vol. 2342/2002, The Semantic Web—ISWC 2002, Jan. 1, 2002, pp. 460-468.
Sheth, Amit, "From Semantic Search & Integration to Analytics," Semagix Inc. and LSDIS lab, University of Georgia, Sep. 19-24, 2004, pp. 1-10.
Ricarte, Ivan L. M., "A Reference Software Model for Intelligent Information Search," School of Electrical and Computer Engineering, State University of Campinas, Sao Paulo, Brazil, 2004, pp. 1-20.
Yang, Di, "Analysis Guided Visual Exploration of Multivariate Data," Worcester Polytechnic Institute, Oct. 2007.
Yahoo Answers, "How can I change the size of the object in AutoCAD", Feb. 14, 2008, 1 page.
Hanna, M. "2007 Flying Stars Analysis", 2007, 21 pages.
Brook, Russell, "Solid Edge's Goal Seek: The Next Best Thing to Hindsight (On the Edge Solid Edge Tutorial)", Oct. 1, 2007, 3 pages, accessed at http://www.cadalyst.com/manufacturing/solid-edge039s-goal-seek-the-next-best-thing-hindsight-on-edge-solid-edge-tutorial-111.
Shahar, Yuval et al., "Intelligent Visualization and Exploration of Time-Oriented Clinical Data"; 1999, IEEE, Proceedings of the 32nd Hawaii International Conference on System Sciences: pp. 1-12.
Multi-Domain Physical System Modeling and Control Based on Meta-Modeling and Graph Rewriting Sagar Sen and Hans Venghuluwe Proceeding of the 2006 IEEE Conference on Computer Aided Control Systems Desighn (Munich, Germany, Oct. 4-6, 2006).
Author Unknown, Broader Perspective, Feb. 10, 2008 (5 pages).
Sara Dgago et al. From Graphs to Euclidean Virtual Worlds: Visualization of 3D Electronic Institutions, Published 2007 (9 pages).
Konrad Polthier, Geometry Processing—Discrete Geometry for Virtual Worlds, May 7, 2007 (2 pages).
Andy Yeh, VRMath: Knowledge Construction of 3D Geometry in Virtual Reality Microworlds, Published 2004, (2 pages).
Ed Huai-Hsin Chi et al., Principles for Information Visualization Spreadsheets, Jul./Aug. 1998, pp. 30-38.
Hidekazu Shiozawa et al., 3D Interactive Visualization for Inter-Cell Dependencies of Spreadsheet, Published 1999, IEEE (4 pages).
Sharma, Gaurav et al., Virtual Reality and Haptics in Nano- and Bionanotechnology Turning Data into Decisions, Copyright 2005, (33 pages).
Author Unknown, Turning Data into Decisions, Copyright 2004, (2 pages).
Author Unknown, "What Is SpeedTreeMax?", Published 2005, (2 pages).
Dust 1.5: Interactive Data Visualization Apr. 2000 (1 page).
Interactive Storyboard for Overall Time-Varying Data Visualization, Mar. 5-7, 2008, IEEE Pacific Visualization Symposium (8 pages).
Making Data Be Understood—and Easily Produced, May 16, 2008 (21 pages).
Visual I/O—Visibly Better Business Intelligence, available at least as early as Jan. 24, 2009 (4 pages).
Author Unknown, Implicit Equations in MML, Mar. 3, 2008 (7 pages).
Physics-based Mathematical Conditioning of the MOSFET Surface Potential Equation, Jul. 2004, IEEE Transactions on Electron Devices, vol. 51, No. 7 (5 pages).
Neil Mitchell, Equational Reasoning in Haskell, Jul. 9, 2007 (3 pages).
Author Unknown, Solving Systems of Equations, Oct. 16, 2002 (9 pages).
Claude Kirchner, Constrained Equational Reasoning, 1989 ACM, (8 pages).
David A. Plaisted, Equational Reasoning and Term Rewriting Systems, Published: 1993,(83 pages).
Avin Mittal, Equational Reasoning, Dec. 1, 2005 (4 pages).
Jehee Lee and Kang Hoon Lee, Precomputing Avatar Behavior from Human Motion Data Eurographics/ACM SIGGRAPH Symposium on Computer Animation (2004) (9 pages).
Victor B. Zordan and Jessica K. Hodgins, Motion Capture-Driven Simulations that Hit and React, Mar. 10, 2005 Domin Lee, http://accad.osu.edu/~dlee/ACCAD/files/MocapSimHitReact_p.ppt (29 pages).
Luis Valente, Aura Conci, Guff: A Game Development Tool, http://guff.tigris.org/docs/Sibgrapi05-en.pdf (2005) (10 pages).
Web Creator Pro—3, Apr. 15, 2005 (2 pages).
Saeyor et al., Visual Authoring Tool for Presentation Agent Based on Multimodal Presentation Markup Languages, 2001 (5 pages).
Bederson et al., Toolkit Design for Interactive Structured Graphics Aug. 2004 (12 pages).
Fritzson et al., Modelica—A Unified Object-Oriented Language for System Modeling and Simulation, Dec. 12, 1999 (24 pages).
Repenning, Alexander, AgentSheets: an Interactive Simulation Environment with End-User Programmable Agents, Published: 2000 (8 pages).
Fox et al., WebFlow based Visual Authoring Tools for HLA Applications, 1998 (8 pages).
McFarlan, Building Information Modeling for MEP, 2007, Kansas State University, pp. 1-52.
Shah et al., Phylo-Vista: An Interactive Visualization Tool for Multiple DNA Sequence Alignments, Published: 2003, (2 pages).
Sawant et al., PerfViz: A Visualization Tool for Analyzing, Exploring, and Comparing Storage Controller Performance Data, Published: 2007 (11 pages).
Ebert et al., Procedural Shape Generation for Multi-dimensional Data Visualization, Published: 1999, (10 pages).
Andrew Vande Moere, Time-Varying Data Visualization Using Information Flocking Boids, IEEE Symposium, Austin, Texas Oct. 10-12, 2004, (8 pages).
Ansoft, "HFSS: User's Guide Version 10", Jun. 21, 2005, Ansoft Corporation.
Paul Bourke, "POV-Ray: A Tool for Creating Engaging Visualisation of Geometry", Jan. 2004. (13 pages).

(56) References Cited

OTHER PUBLICATIONS

John Hart, "The Object Instancing Paradigm for Linear Fractal Modeling", Proceedings of Graphics Interface '92 (May 11-15, 1992) (24 pages).
John S. Letcher Jr., D. Michael Shhok and Simon G. Shepherd, "Relational Geometric Synthesis: Part 1—Framework", Computer-Aided Design, vol. 27, No. 11, pp. 821-832, Nov. 11, 1995.
Evgueni N. Loukipoudis, Extending a Constructive Solver with Constraints Inferred by Variable Topology Parameterisation, Published: 1997, pp. 311-320.
Christophe Jermann et al., "A Constraint Programming Approach for Solving Rigid Geometric Systems", Published: 2000, pp. 233-248.
Jeffrey Heer and Maneesh Agrawala. 2006. Software Design Patterns for Information Visualization. IEEE Transactions on Visualization and Computer Graphics 12, 5 (Sep. 2006), pp. 853-860.
Glenn E. Krasner and Stephen T. Pope. 1988. A Cookbook for Using the Model-view Controller User Interface Paradigm in Smalltalk-80. J. Object Oriented Program. 1, 3 (Aug. 1988), pp. 26-49.
Roberts, J.C.: "State of the Art: Coordinated & Multiple Views in Exploratory Visualization," Coordinated and Multiple Views in Exploratory Visualization, 2007, CMV '07. Fifth International Converence on , vol., No., pp. 61-71, Jul. 2-2, 2007.
Xu, K., Stewart, A.J., and Fiume, E. 2002 Constraint-based Automatic Placement for Scene Composition. In Proc. Graphics Interface.
Weaver, Chris. "Building highly-coordinated visualizations in improvise". Information Visualization, 2004. INFOVIS 2004. IEEE Symposium on. IEEE, Oct. 2004.
"Chapter Seven: Correlation and Regression" http://www.csub.edu/ssricrem/spss/SPSS11-7/11-7.htm. Archived on Apr. 5, 2008. Retrieved on May 13, 2013 from <http://web.archive.org/web/20080405202636/http://www.csub.edu/ssricrem/spss/SPSS11-7/11-7.htm>.
Kniss et al., "Interactive Volume Rendering using Multi-Dimensional Transfer Functions and Direct Manipulation Widgets.", VIS 2001, Proceedings of the Conference on Visualization 2001, Oct. 2001, pp. 255-262.
Vieges et al., "Many Eyes: A Site for Visualization at Internet Scale", IEEE Transactions on Visualization and Computer Graphics, vol. 13 No. 5, Nov./Dec. 2007.
Roth et al., "Toward an Information Visualization Workspace: Combining Multiple Means of Expression", Human Interaction vol. 12 No. 1 & 2, 1997, pp. 131-185.
Yi et al., "Dust & Magnet: Multivariate Information Visualization Using a Magnet Metaphor", Information Visualization, Oct. 2005, pp. 1-18.
English translation of Japanese Office Action dated Nov. 26, 2013 citing "Sugiyama, Hiroshi, 'Mastering table calculation: MS-EXCEL, A step-up lesson', Hello! PC, Japan, SoftBank Corporation, Oct. 8, 1998, vol. 5, Issue 17, pp. 226-231" in Japanese Office Action dated Nov. 26, 2013.
Knight, Claire, "Virtual Reality for Visualization", Computer Science Technical Report 13/98, University of Dunham, UK, Oct. 1998.
U.S. Appl. No. 12/163,863, Nov. 10, 2010, Office Action.
U.S. Appl. No. 12/163,872, Nov. 12, 2010, Office Action.
U.S. Appl. No. 12/163,863, Feb. 1, 2011, Office Action.
U.S. Appl. No. 12/163,872, Mar. 1, 2011, Office Action.
U.S. Appl. No. 12/163,867, May 3, 2011, Office Action.
U.S. Appl. No. 12/324,469, Feb. 22, 2011, Office Action.
U.S. Appl. No. 12/324,462, Jun. 9, 2011, Office Action.
U.S. Appl. No. 12/163,957, Jul. 5, 2011, Office Action.
U.S. Appl. No. 12/324,469, Jul. 21, 2011, Office Action.
U.S. Appl. No. 12/163,863, Jul. 22, 2011, Office Action.
U.S. Appl. No. 12/163,872, Aug. 3, 2011, Office Action.
U.S. Appl. No. 12/324,451, Aug. 29, 2011, Notice of Allowance.
U.S. Appl. No. 12/324,462, Aug. 31, 2011, Notice of Allowance.
U.S. Appl. No. 12/324,480, Sep. 7, 2011, Office Action.
U.S. Appl. No. 12/163,867, Sep. 28, 2011, Office Action.
U.S. Appl. No. 12/163,949, Oct. 6, 2011, Notice of Allowance.
U.S. Appl. No. 12/163,957, Nov. 9, 2011, Office Action.
U.S. Appl. No. 12/324,469, Nov. 25, 2011, Notice of Allowance.
U.S. Appl. No. 12/324,480, Nov. 29, 2011, Notice of Allowance.
U.S. Appl. No. 12/324,462, Dec. 21, 2011, Notice of Allowance.
U.S. Appl. No. 12/163,863, Jan. 17, 2012, Notice of Allowance.
U.S. Appl. No. 12/488,219, Jan. 26, 2012, Office Action.
U.S. Appl. No. 12/488,314, Jan. 5, 2012, Office Action.
U.S. Appl. No. 12/163,872, Jan. 13, 2012, Office Action.
U.S. Appl. No. 12/163,867, Mar. 26, 2012, Office Action.
U.S. Appl. No. 12/488,213, Feb. 1, 2012, Office Action.
U.S. Appl. No. 12/344,215, Aug. 16, 2011, Office Action.
U.S. Appl. No. 12/344,215, Oct. 31, 2011, Office Action.
U.S. Appl. No. 12/344,215, Mar. 2, 2012, Office Action.
U.S. Appl. No. 12/488,219, May 9, 2012, Notice of Allowance.
U.S. Appl. No. 12/557,297, May 11, 2012, Notice of Allowance.
U.S. Appl. No. 12/488,292, May 17, 2012, Office Action.
U.S. Appl. No. 12/488,201, May 1, 2012, Office Action.
U.S. Appl. No. 12/488,213, Jun. 7, 2012, Office Action.
U.S. Appl. No. 12/163,957, Jun. 15, 2012, Office Action.
U.S. Appl. No. 12/488,314, Jun. 13, 2012, Office Action.
U.S. Appl. No. 12/557,297, Jun. 4, 2012, Notice of Allowance.
U.S. Appl. No. 12/344,215, Jul. 20, 2012, Notice of Allowance.
U.S. Appl. No. 12/488,247, Jul. 25, 2012, Office Action.
U.S. Appl. No. 12/163,867, Nov. 9, 2012, Notice of Allowance.
U.S. Appl. No. 12/163,957, Nov. 19, 2012, Office Action.
U.S. Appl. No. 12/488,201, Nov. 29, 2012, Office Action.
U.S. Appl. No. 12/488,295, Dec. 7, 2012, Office Action.
U.S. Appl. No. 12/488,247, Dec. 28, 2012, Office Action.
U.S. Appl. No. 12/488,295, Apr. 3, 2013, Notice of Allowance.
U.S. Appl. No. 12/488,247, May 9, 2013, Notice of Allowance.
U.S. Appl. No. 12/163,957, May 20, 2013, Office Action.
U.S. Appl. No. 12/163,872, Jul. 25, 2013, Notice of Allowance.
U.S. Appl. No. 12/488,201, Aug. 13, 2013, Office Action.
U.S. Appl. No. 12/488,314, Sep. 18, 2013, Office Action.
U.S. Appl. No. 12/488,213, Sep. 19, 2013, Office Action.
U.S. Appl. No. 12/163,957, Oct. 1, 2013, Office Action.
U.S. Appl. No. 12/488,201, Nov. 25, 2013, Notice of Allowance.
U.S. Appl. No. 12/488,292, Nov. 29, 2013, Office Action.
U.S. Appl. No. 12/488,314, Jan. 28, 2014, Office Action.
U.S. Appl. No. 12/488,213, Mar. 14, 2014, Office Action.
U.S. Appl. No. 12/488,292, Mar. 27, 2014, Notice of Allowance.
U.S. Appl. No. 12/488,300, Aug. 1, 2012, Office Action.
U.S. Appl. No. 12/488,300, Jan. 16, 2013, Office Action.
U.S. Appl. No. 12/488,300, May 30, 2014, Notice of Allowance.
U.S. Appl. No. 12/488,213, Oct. 22, 2014, Office Action.
Office Action dated Feb. 26, 2015 cited in U.S. Appl. No. 12/488,213.
Kim, et al., "Visual Analytics on Mobile Devices for Emergency Response", IEEE Symposium on Visual Analytics Science and Technology, Oct.-Nov. 2007, 8 pages. Available at <<http://geoanalytics.net/and/papers/ijgis07.pdf>>.
Andrienko, et al., "Geovisual Analytics for Spatial Decision Support: Setting the Research Agenda", International Journal of Geographical Information Science, vol. 21, Iss. 8, Jan. 2007, 19 pages. Available at <<http://geoanalytics.net/and/papers/ijgis07.pdf>>.
Green, et al., "Building and Applying a Human Cognition Model for Visual Analytics", Available at least as early as Sep. 2010, 37 pages. Available at <<http://viscenter.uncc.edu/technicalReports/CVC-UNCC-09-11pdf>>.
Ganapathy, "Tele-Collaboration in parallel Worlds", Copyright 2003, 3 pages. Available at <<http://dl.acm.org/ft_gateway.cfm?id=982496>>.
U.S. Appl. No. 12/970,902, Oct. 26, 2012, Office Action.
U.S. Appl. No. 12/970,902, May 24, 2013, Office Action.
U.S. Appl. No. 12/970,902, Oct. 4, 2013, Office Action.
U.S. Appl. No. 12/970,902, Mar. 11, 2014, Office Action.
U.S. Appl. No. 12/970,902, Jan. 22, 2015, Office Action.
U.S. Appl. No. 12/970,902, Jun. 19, 2015, Office Action.
Notice of Allowance dated Jan. 4, 2016 in U.S. Appl. No. 12/488,213.

COMPOSING SHAPES AND DATA SERIES IN GEOMETRIES

CROSS-REFERENCE TO RELATED APPLICATIONS

This application is a continuation of U.S. patent application Ser. No. 12/488,300, filed Jun. 19, 2009, and entitled "COMPOSING SHAPES AND DATA SERIES IN GEOMETRIES." The entire content of the foregoing application is incorporated by reference herein in its entirety.

BACKGROUND

Often, the most effective way to convey information to a human being is visually. Accordingly, millions of people work with a wide range of visual items in order to convey or receive information, and in order to collaborate. Such visual items might include, for example, concept sketches, engineering drawings, explosions of bills of materials, three-dimensional models depicting various structures such as buildings or molecular structures, training materials, illustrated installation instructions, planning diagrams, and so on.

More recently, these visual items are constructed electronically using, for example, Computer Aided Design (CAD) and solid modeling applications. Often these applications allow authors to attach data and constraints to the geometry. For instance, the application for constructing a bill of materials might allow for attributes such as part number and supplier to be associated with each part, the maximum angle between two components, or the like. An application that constructs an electronic version of an arena might have a tool for specifying a minimum clearance between seats, and so on.

Such applications have contributed enormously to the advancement of design and technology. However, any given application does have limits on the type of information that can be visually conveyed, how that information is visually conveyed, or the scope of data and behavior that can be attributed to the various visual representations. If the application is to be modified to go beyond these limits, a new application would typically be authored by a computer programmer which expands the capabilities of the application, or provides an entirely new application. Also, there are limits to how much a user (other than the actual author of the model) can manipulate the model to test various scenarios.

BRIEF SUMMARY

Embodiments described herein relate to formulating a visual scene. Formulating the visual scene includes accessing a plurality of shapes, each shape corresponding to a different object that is to be visually represented within the visual scene. Each shape includes one or both of a dimensional attribute or a visual attribute. Formulating the visual scene also includes accessing a data series. The data series includes a plurality of data points that are each configured to be applied to the dimensional attribute or the visual attribute of at least one of the plurality of shapes.

Formulating the visual scene also includes accessing a geometry. The geometry includes a container within which the data series is visualized by visually rendering each of the plurality of shapes within the container. The container defines at least a coordinate system of the container and one or more dimensions of the container. The geometry also includes one or more binding definitions that define how to apply each data point of the plurality of data points to the dimensional attribute or the visual attribute of a corresponding shape of the plurality of shapes. The geometry also includes one or more arrangement definitions that define how to map an axis set to the coordinate system of the container, and how to lay out the plurality of shapes within the one or more dimensions of the container.

Formulating the visual scene also includes populating the geometry with a visual representation of the data series using the plurality of shapes, including visually rendering each shape within the container according to the one or more binding definitions and the one or more arrangement definitions.

This Summary is not intended to identify key features or essential features of the claimed subject matter, nor is it intended to be used as an aid in determining the scope of the claimed subject matter.

BRIEF DESCRIPTION OF THE DRAWINGS

In order to describe the manner in which the above-recited and other advantages and features can be obtained, a more particular description of various embodiments will be rendered by reference to the appended drawings. Understanding that these drawings depict only sample embodiments and are not therefore to be considered to be limiting of the scope of the invention, the embodiments will be described and explained with additional specificity and detail through the use of the accompanying drawings in which:

FIG. 29 illustrates a visualization of a shelf layout and represents just one of countless applications that the principles described herein may apply to;

FIG. 30 illustrates a visualization of an urban plan that the principles described herein may also apply to;

DETAILED DESCRIPTION

Figure 1:
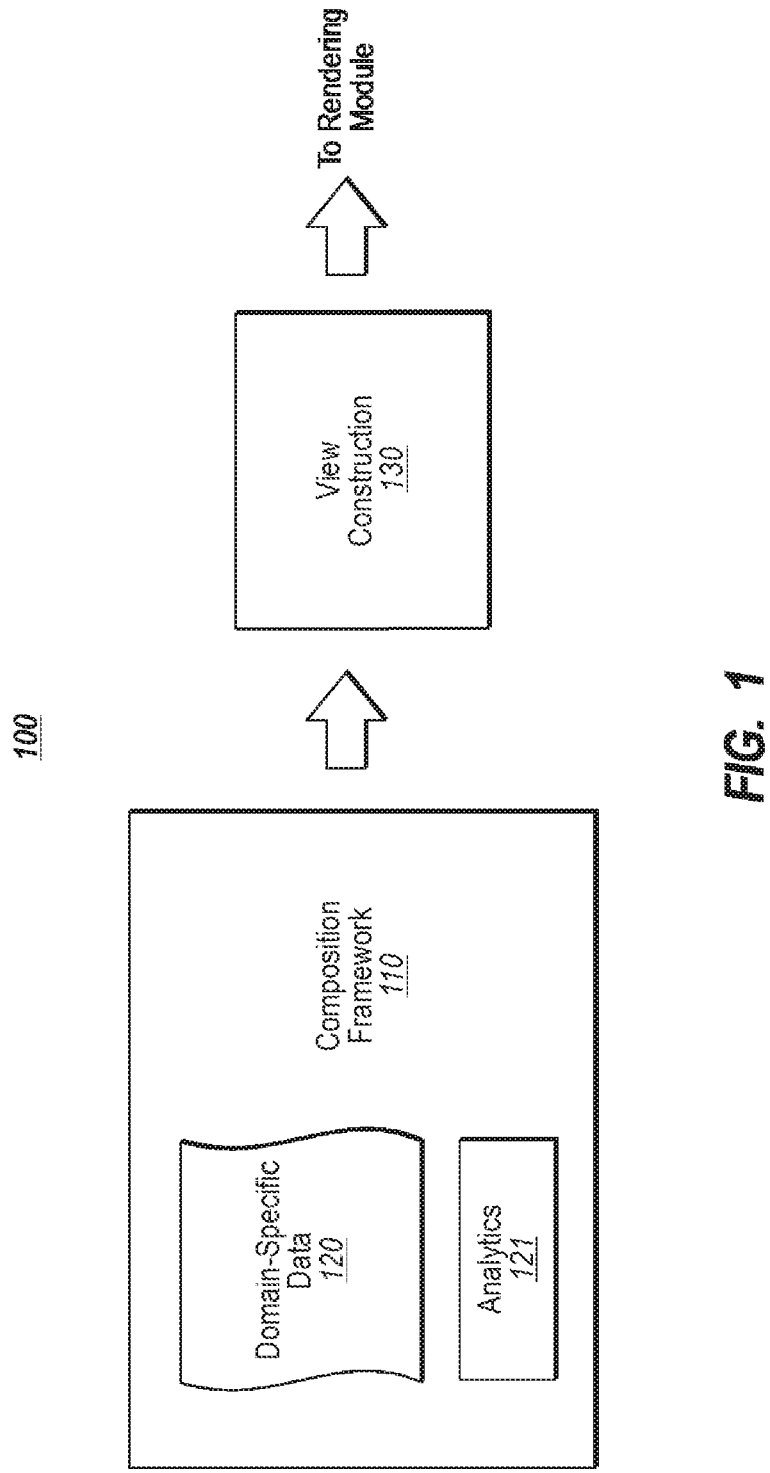
FIG. 1 illustrates an environment in which the principles of the present invention may be employed including a data-driven composition framework that constructs a view composition that depends on input data.

FIG. 1 illustrates a visual composition environment 100 that uses data-driven analytics and visualization of the analytical results. The environment 100 (also called hereinafter a "pipeline") includes a composition framework 110 that performs logic that is performed independent of the problem-domain of the view construction 130. For instance, the same composition framework 110 may be used to compose interactive view compositions for city plans, molecular models, grocery shelf layouts, machine performance or assembly analysis, or other domain-specific renderings. As will be described, the analytics may be used to search and explore in various scenarios. First, however, the basic composition framework 110 will be described in detail.

The composition framework 110 performs analytics 121 using domain-specific data 120 that is taxonomically organized in a domain-specific way to construct the actual view construction 130 (also called herein a "view composition") that is specific to the domain. Accordingly, the same composition framework 110 may be used to construct view compositions for any number of different domains by changing the domain-specific data 120, rather than having to recode the composition framework 110 itself. Thus, the composition framework 110 of the pipeline 100 may apply to a potentially unlimited number of problem domains, or at least to a wide variety of problem domains, by altering data, rather than recoding and recompiling. The view construction 130 may then be supplied as instructions to an appropriate 2-D or 3-D rendering module. The architecture described herein also allows for convenient incorporation of pre-existing view compositions as building blocks to new view compositions. In one embodiment, multiple view compositions may be included in an integrated view composition to allow for easy comparison between two possible solutions to a model.

Figure 2:
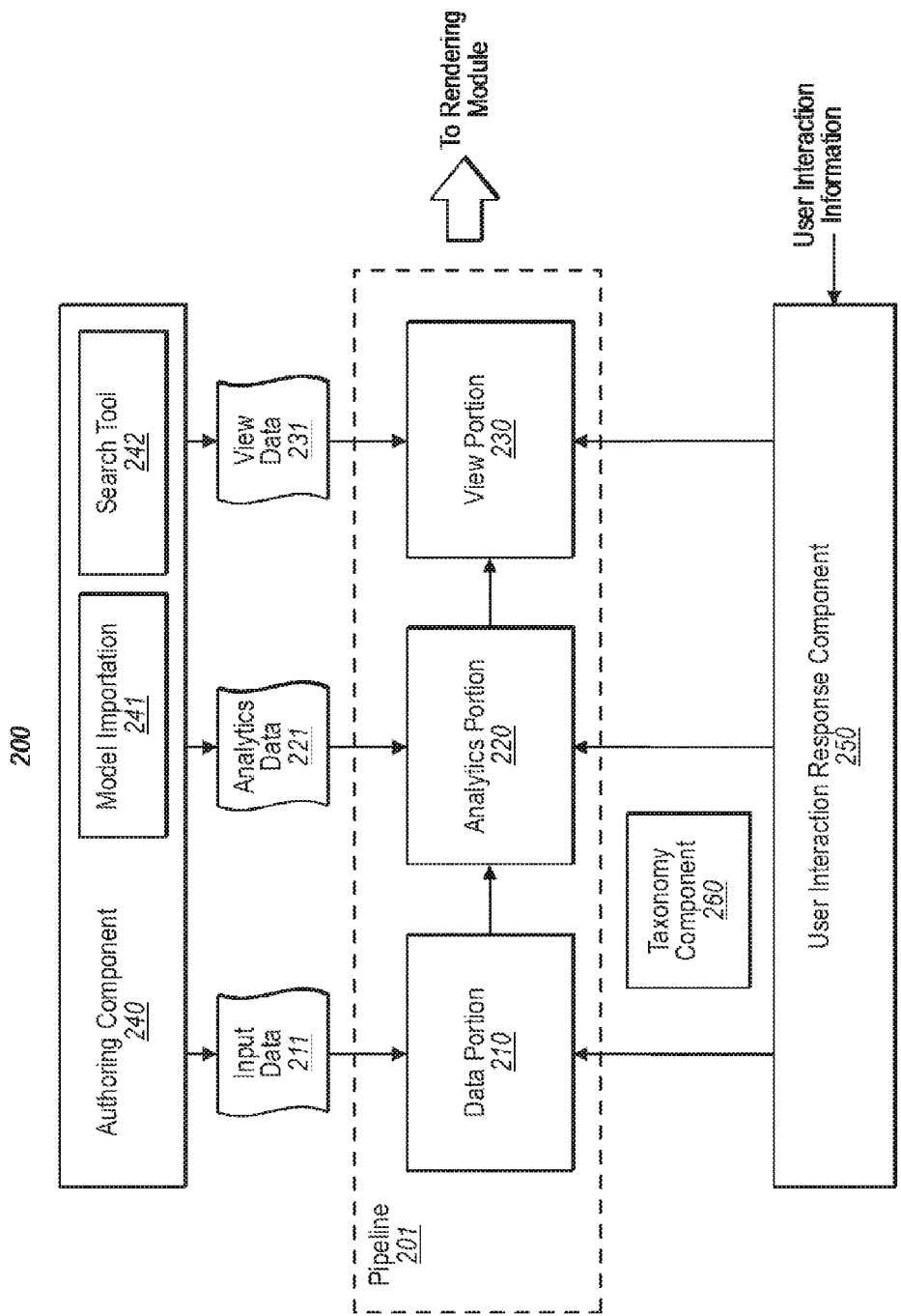
FIG. 2 illustrates a pipeline environment that represents one example of the environment of FIG. 1.

FIG. 2 illustrates an example architecture of the composition framework 110 in the form of a pipeline environment 200. The pipeline environment 200 includes, amongst other things, the pipeline 201 itself. The pipeline 201 includes a data portion 210, an analytics portion 220, and a view portion 230, which will each be described in detail with respect to subsequent FIGS. 3 through 5, respectively, and the accompanying description. For now, at a general level, the data portion 210 of the pipeline 201 may accept a variety of different types of data and presents that data in a canonical form to the analytics portion 220 of the pipeline 201. The analytics portion 220 binds the data to various model parameters, and solves for the unknowns in the model parameters using model analytics. The various parameter values are then provided to the view portion 230, which constructs the composite view using those values of the model parameters.

The pipeline environment 200 also includes an authoring component 240 that allows an author or other user of the pipeline 201 to formulate and/or select data to provide to the pipeline 201. For instance, the authoring component 240 may be used to supply data to each of data portion 210 (represented by input data 211), analytics portion 220 (represented by analytics data 221), and view portion 230 (represented by view data 231). The various data 211, 221 and 231 represent an example of the domain-specific data 120 of FIG. 1, and will be described in much further detail hereinafter. The authoring component 240 supports the providing of a wide variety of data including for example, data schemas, actual data to be used by the model, the location or range of possible locations of data that is to be brought in from external sources, visual (graphical or animation) objects, user interface interactions that can be performed on a visual, modeling statements (e.g., views, equations, constraints), bindings, and so forth.

In one embodiment, the authoring component is but one portion of the functionality provided by an overall manager component (not shown in FIG. 2, but represented by the composition framework 110 of FIG. 1). The manager is an overall director that controls and sequences the operation of all the other components (such as data connectors, solvers, viewers, and so forth) in response to events (such as user interaction events, external data events, and events from any of the other components such as the solvers, the operating system, and so forth).

The authoring component 240 also includes a search tool 242 that allows for searches to be performed. The search tool 242 is able to draw on the data-driven analytical capabilities of the pipeline 201 in order to perform complex search operations. For instance, in some cases, one or more parameters of the search might first need to be solved for in order to complete the search.

As an example, suppose that the data driven analytics is a city map, and some of the analytics are capable of solving for the typical noise level at particular coordinates in the city. In that case, a person searching for residential real estate may perform a search not just on the typical search parameters of square footage, price range, number of rooms, and so forth, but may also search on analytically intensive parameters. For instance, while there are unlimited ways that the principles may be applied, a selected few diverse examples of how a flexible search for real estate might be accomplished will now be provided.

As part of specifying search parameters, the user might indicate a desire for any one or more of the following or other search items:

1) only those homes that experience average noise levels below a certain upper limit;
2) only those homes that have a cumulative 300 minute commute time or less to the user's work and gym on each of Monday through Thursday,
3) only those homes that experience less than a certain threshold of traffic on any road within one fifth of a mile and which are predicted over the next 10 years to remain below that level of traffic,
4) only those homes that are not in the shadow of a mountain after 9:15 am at any point in the year,
5) only those homes that have sufficient existing trees on the property such that in 10 years time, the trees would shade at least 50% of the area of the roof,
6) and so forth.

Such real estate searches are not readily achievable using conventional technology. In each of these examples, the requested home search data may not exist, but the principles described herein may allow the search data for a variety of customized parameters to be generated on the fly as the search is being performed. Also, the search may take advantage of any search data that has been previously solved for. This enables a wide variety of search and exploration capabilities for the user, and opens up a whole new way of exploring a problem to be solved. More regarding the underlying data-driven analytics mechanisms that support these types of searches will now be described.

Traditionally, the lifecycle of an interactive view composition application involves two key times: authoring time, and use time. At authoring time, the functionality of the interactive view composition application is coded by a programmer to provide an interactive view composition that is specific to the desired domain. For instance, the author of an interior design application (e.g., typically, a computer programmer) might code an application that permits a user to perform a finite set of actions specific to interior designing.

At use time, a user (e.g., perhaps a home owner or a professional interior designer) might then use the application to perform any one or more of the set of finite actions that are hard coded into the application. In the interior design application example, the user might specify the dimensions of a virtual room being displayed, add furniture and other interior design components to the room, perhaps rotate the view to get various angles on the room, set the color of each item, and so forth. However, unless the user is a programmer that does not mind reverse-engineering and modifying the interior design application, the user is limited to the finite set of actions that were enabled by the application author. For example, unless offered by the application, the user would not be able to use the application to automatically figure out which window placement would minimize ambient noise, how the room layout performs according to Feng Shui rules, or minimize solar heat contribution.

However, in the pipeline environment 200 of FIG. 2, the authoring component 240 is used to provide data to an existing pipeline 201, where it is the data that drives the entire process from defining the input data, to defining the analytical model, to defining how the results of the analytics are visualized in the view composition. Accordingly, one need not perform any coding in order to adapt the pipeline 201 to any one of a wide variety of domains and problems. Only the data provided to the pipeline 201 is what is to change in order to apply the pipeline 201 to visualize a different view composition either from a different problem domain altogether, or to perhaps adjust the problem solving for an existing domain. The pipeline environment 200 may also include a taxonomy component 260 that organizes, categorizes, and relates data that is provided to the pipeline 201. The taxonomy component 260 may be sensitive to the domain. Thus, an interior design domain, a road design domain, an architecture domain, a Feng Shui domain may each have a different taxonomy that may be used to navigate through the data. This can be helpful since, as will be described below, there may be considerable data available to sift through due to composition activity in which the data set that is made available to the pipeline environment 200 may be ever increasing.

Further, since the data can be changed at use time (i.e., run time), as well as at author time, the model can be modified and/or extended at runtime. Thus, there is less, if any, distinction between authoring a model and running the model. Because all authoring involves editing data items and because the software runs all of its behavior from data, every change to data immediately affects behavior without the need for recoding and recompilation.

The pipeline environment 200 also includes a user interaction response module 250 that detects when a user has interacted with the displayed view composition, and then determines what to do in response. For example, some types of interactions might require no change in the data provided to the pipeline 201 and thus require no change to the view composition. Other types of interactions may change one or more of the data 211, 221, or 231. In that case, this new or modified data may cause new input data to be provided to the data portion 210, might require a reanalysis of the input data by the analytics portion 220, and/or might require a re-visualization of the view composition by the view portion 230.

Accordingly, the pipeline 201 may be used to extend data-driven analytical visualizations to perhaps an unlimited number of problem domains, or at least to a wide variety of problem domains. Furthermore, one need not be a programmer to alter the view composition to address a wide variety of problems. Each of the data portion 210, the analytics portion 220 and the view portion 230 of the pipeline 201 will now be described with respect to the data portion 300 of FIG. 3, the analytics portion 400 of FIG. 4, and the view portion 500 of FIG. 5, in that order. In addition, the taxonomy of the data is specific to the domain, thus allowing the organization of the data to be more intuitive to those operating in the domain. As will be apparent from FIGS. 3 through 5, the pipeline 201 may be constructed as a series of transformation components where they each 1) receive some appropriate input data, 2) perform some action in response to that input data (such as performing a transformation on the input data), and 3) output data which then serves as input data to the next transformation component.

The pipeline 201 may be implemented on the client, on the server, or may even be distributed amongst the client and the server without restriction. For instance, the pipeline 201 might be implemented on the server and provide rendering instructions as output. A browser at the client-side may then just render according to the rendering instructions received from the server. At the other end of the spectrum, the pipeline 201 may be contained on the client with authoring and/or use performed at the client. Even if the pipeline 201 was entirely at the client, the pipeline 201 might still search data sources external to the client for appropriate information (e.g., models, connectors, canonicalizers, schemas, and others). There are also embodiments that provide a hybrid of these two approaches. For example, in one such hybrid approach, the model is hosted on a server but web browser modules are dynamically loaded on the client so that some of the model's interaction and viewing logic is made to run on the client (thus allowing richer and faster interactions and views).

Figure 3:
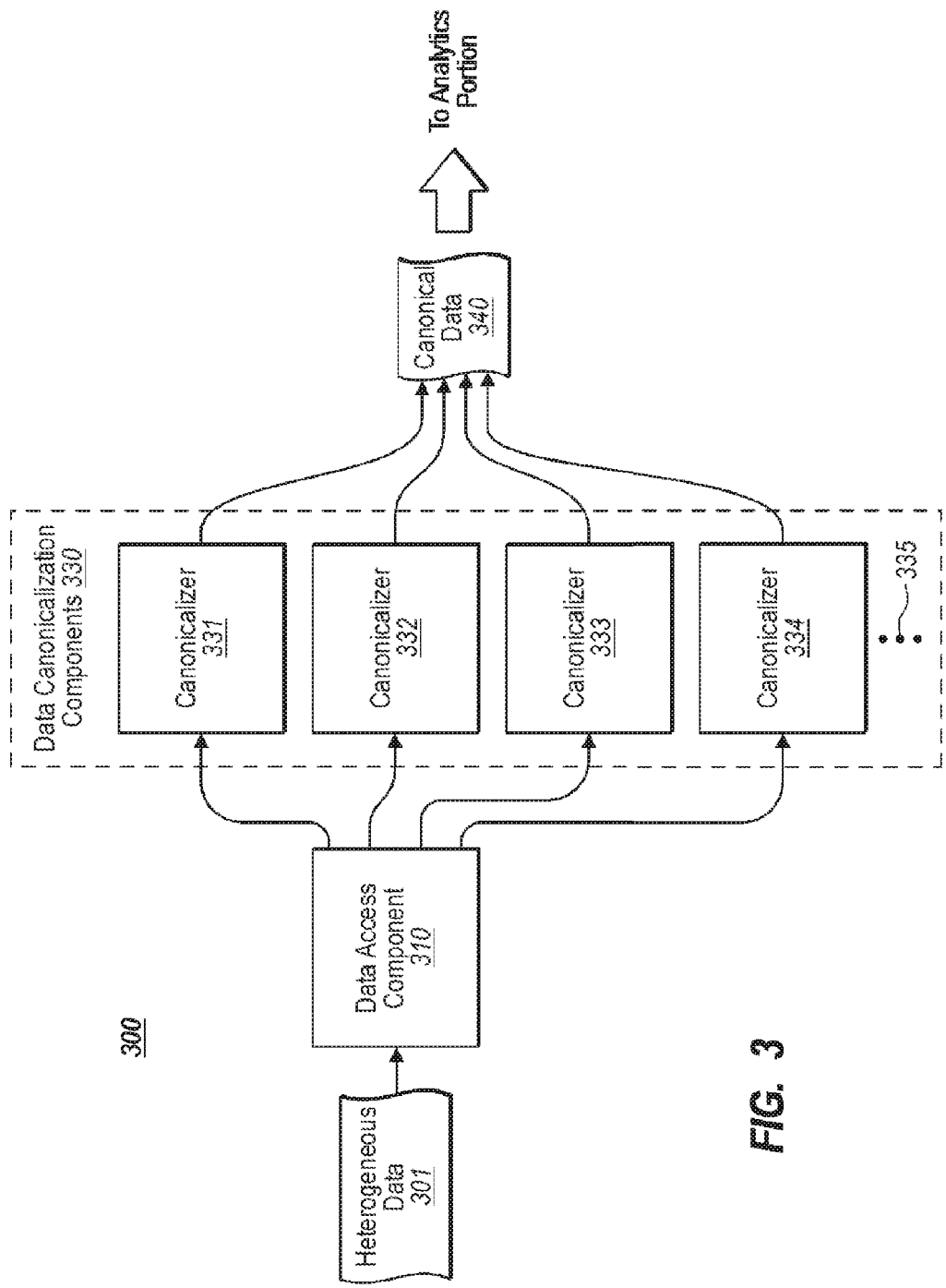
FIG. 3 schematically illustrates an embodiment of the data portion of the pipeline of FIG. 2.

FIG. 3 illustrates just one of many possible embodiments of a data portion 300 of the pipeline 201 of FIG. 2. One of the functions of the data portion 300 is to provide data in a canonical format that is consistent with schemas understood by the analytics portion 400 of the pipeline discussed with respect to FIG. 4. The data portion includes a data access component 310 that accesses the heterogeneous data 301. The input data 301 may be "heterogeneous" in the sense that the data may (but need not) be presented to the data access component 310 in a canonical form. In fact, the data portion 300 is structured such that the heterogeneous data could be of a wide variety of formats. Examples of different kinds of domain data that can be accessed and operated on by models include text and XML documents, tables, lists, hierarchies (trees), SQL database query results, BI (business intelligence) cube query results, graphical information such as 2D drawings and 3D visual models in various formats, and combinations thereof (i.e., a composite). Further, the kind of data that can be accessed can be extended declaratively, by providing a definition (e.g., a schema) for the data to be accessed. Accordingly, the data portion 300 permits a wide variety of heterogeneous input into the model, and also supports runtime, declarative extension of accessible data types.

In one embodiment, the data access portion 300 includes a number of connectors for obtaining data from a number of different data sources. Since one of the primary functions of the connector is to place corresponding data into canonical form, such connectors will often be referred to hereinafter and in the drawings as "canonicalizers". Each canonicalizer might have an understanding of the specific Application Program Interfaces (API's) of its corresponding data source. The canonicalizer might also include the corresponding logic for interfacing with that corresponding API to read and/or write data from and to the data source. Thus, canonicalizers bridge between external data sources and the memory image of the data.

The data access component 310 evaluates the input data 301. If the input data is already canonical and thus processable by the analytics portion 400, then the input data may be directly provided as canonical data 340 to be input to the analytics portion 400.

However, if the input data 301 is not canonical, then the appropriate data canonicalization component 330 is able to convert the input data 301 into the canonical format. The data canonicalization components 330 are actually a collection of data canonicalization components 330, each capable of converting input data having particular characteristics into canonical form. The collection of canonicalization components 330 is illustrated as including four canonicalization components 331, 332, 333 and 334. However, the ellipsis 335 represents that there may be other numbers of canonicalization components as well, perhaps even fewer than the four illustrated.

The input data 301 may even include a canonicalizer itself as well as an identification of correlated data characteristic(s). The data portion 300 may then register the correlated data characteristics, and provide the canonicalization component to the data canonicalization component collection 330, where it may be added to the available canonicalization components. If input data is later received that has those correlated characteristics, the data portion 310 may then assign the input data to the correlated canonicalization component. Canonicalization components can also be found dynamically from external sources, such as from defined component libraries on the web. For example, if the schema for a given data source is known but the needed canonicalizer is not present, the canonicalizer can be located from an external component library, provided such a library can be found and contains the needed components. The pipeline might also parse data for which no schema is yet known and compare parse results versus schema information in known component libraries to attempt a dynamic determination of the type of the data, and thus to locate the needed canonicalizer components.

Alternatively, instead of the input data including all of the canonicalization components, the input data may instead provide a transformation definition defining canonicalization transformations. The collection 330 may then be configured to convert that transformations definition into a corresponding canonicalization component that enforces the transformations along with zero or more standard default canonicalization transformation. This represents an example of a case in which the data portion 300 consumes the input data and does not provide corresponding canonicalized data further down the pipeline. In perhaps most cases, however, the input data 301 results in corresponding canonicalized data 340 being generated.

In one embodiment, the data access component 310 may be configured to assign input data to the data canonicalization component on the basis of a file type and/or format type of the input data. Other characteristics might include, for example, the source of the input data. A default canonicalization component may be assigned to input data that does not have a designated corresponding canonicalization component. The default canonicalization component may apply a set of rules to attempt to canonicalize the input data. If the default canonicalization component is not able to canonicalize the data, the default canonicalization component might trigger the authoring component 240 of FIG. 2 to prompt the user to provide a schema definition for the input data. If a schema definition does not already exist, the authoring component 240 might present a schema definition assistant to help the author generate a corresponding schema definition that may be used to transform the input data into canonical form. Once the data is in canonical form, the schema that accompanies the data provides sufficient description of the data that the rest of the pipeline 201 does not need new code to interpret the data. Instead, the pipeline 201 includes code that is able to interpret data in light of any schema that is expressible an accessible schema declaration language.

Figure 6:
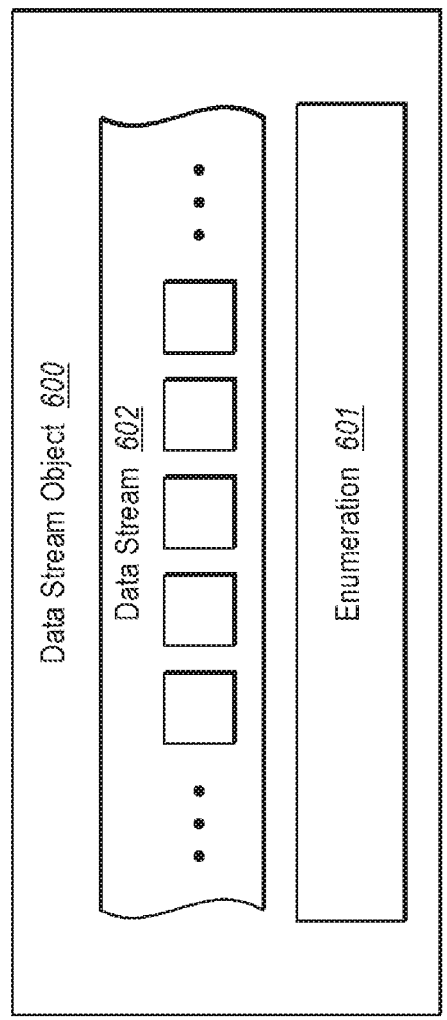
FIG. 6 schematically illustrates a data stream object that is capable of enumerating all or a subset of the elements of the data stream.

One type of data is a data stream object, such as the data stream object 600 illustrated and described with respect to FIG. 6. The data stream object 600 includes an enumeration module 601 that is capable of enumerating a certain range within a data stream 602 that is associated with the data stream object. That range may in fact include the entire range of the data stream 602. On the other hand, the data stream 602 may be a "pseudo-infinite" or a "partially pseudo-infinite" data stream. In this description and in the claims, a "pseudo-infinite" data steam is a data stream that is too large to fit entirely with the volatile memory of the computing system that is handling the data stream object 600. A "partially pseudo-infinite" data stream is defined as a data stream that would occupy at least half of the volatile memory of the computing system that is handling the data stream object. The enumeration module 601 might enumerate only a portion of the data stream in response to a request from an external module, such as, for example, the data portion 210, the analytics portion 220, or the view portion 230 of FIG. 2. The enumeration module 601 might require enumeration beginning at the first elements of the data stream. On the other hand, the enumeration module 601 may allow enumeration beginning at any other portion of the data stream (i.e., may allow enumeration mid-stream) without first enumerating from the beginning of the data stream.

The data stream object 600 may be capable of identifying the requested portion(s) of the data stream based on properties associated with the requested member elements of the data stream. In that case, the data stream object might include logic that processes the request and identifies all member elements of the data stream that have the requested properties. For instance, the request might be for all elements of a city that are visible from an elevation of 1000 feet, looking downward at a particular longitudinal and latitudinal coordinate. On the other hand, the data stream object may also be capable of responding to express requests for member elements.

As an example, the pseudo-infinite data stream could be a description of a real or imaginary city including a description of all items within that city, including a description of every conceivable level of detail of every one of these items. That information might simply be too much to represent in memory all at once. The data stream object 600 may thus offer up only the relevant information needed to render the current view. For instance, if the city is being viewed at an elevation of 100 miles, perhaps only the boundary information of the city is relevant. If a portion of the city is being viewed at an elevation of ten miles, perhaps only the information about the larger objects (such as airports, parks, reservoirs, and the like might be offered up, and only if within the view). If a portion of the city is being viewed at an elevation of one mile, perhaps the information necessary to render streets and buildings that are within the view are offered up by the data stream object. If a portion of the city is being viewed at an elevation of one thousand feet, perhaps information necessary to render more detail of the streets (i.e., the number of lanes, the names of the street, arrows, etc.), and more detail on the buildings (texture and windows position, etc.) might be offered up. Naturally, as this zoom in operation occurs, the information pertains to a smaller and smaller geographical area. At a one hundred foot view, the data stream might offer up information regarding shrubbery, manholes, gutters, steps, vending machines, cross-walks and the like. That amount of data might be difficult for a conventional computer to keep in memory for an entire city.

As another example, the pseudo-infinite data stream might literally be infinite, as in the case of a fractal. A fractal is mathematically defined such that no matter how much one zooms in on a portion of the fractal, a repeating shape always comes into view. One can always zoom in further, and further, infinitum. The same thing applies for zooming out. It would take an infinite amount of information to literally represent the geometry of such a fractal. However, the data stream object might have a concept for how the fractal is mathematically defined. If the data stream object is asked to produce a fractal at a particular level of detail, the data stream object may then calculate the data that applies to that particular level of detail, and offer that data up.

Thus, the pseudo-infinite data object is able to generate requested ranges of data either by evaluating an expression that defines the detail and/or by accessing data external to the data stream object. Such ranges are examples of the hierarchical data that is provided to the analytics portion 400 of the pipeline 201. In one embodiment, the protocol for communicating with the data stream object may be the same regardless of how large the data stream itself is. Thus, an author might thus test a model on a data stream object that is associated with a smaller data stream object. Then, once the other is confident of the model, the author may then just switch the data stream object for one that is associated with an infinite data stream, a pseudo-infinite data stream, or a partially pseudo-infinite data stream, without have to change the model itself.

Regardless of the form of the canonical data 340, the canonical data 340 is provided as output data from the data portion 300 and as input data to the analytics portion 400. The canonical data might include fields that include a variety of data types. For instance, the fields might include data types such as integers, floating point numbers, strings, vectors, arrays, collections, hierarchical structures, text, XML documents, tables, lists, SQL database query results, BI (business intelligence) cube query results, graphical information such as 2D drawings and 3D visual models in various formats, or even complex combinations of these various data types. As another advantage, the canonicalization process is able to canonicalize a wide variety of input data. Furthermore, the variety of input data that the data portion 300 is able to accept is expandable. This is helpful in the case where multiple models are combined as will be discussed later in this description.

Figure 4:
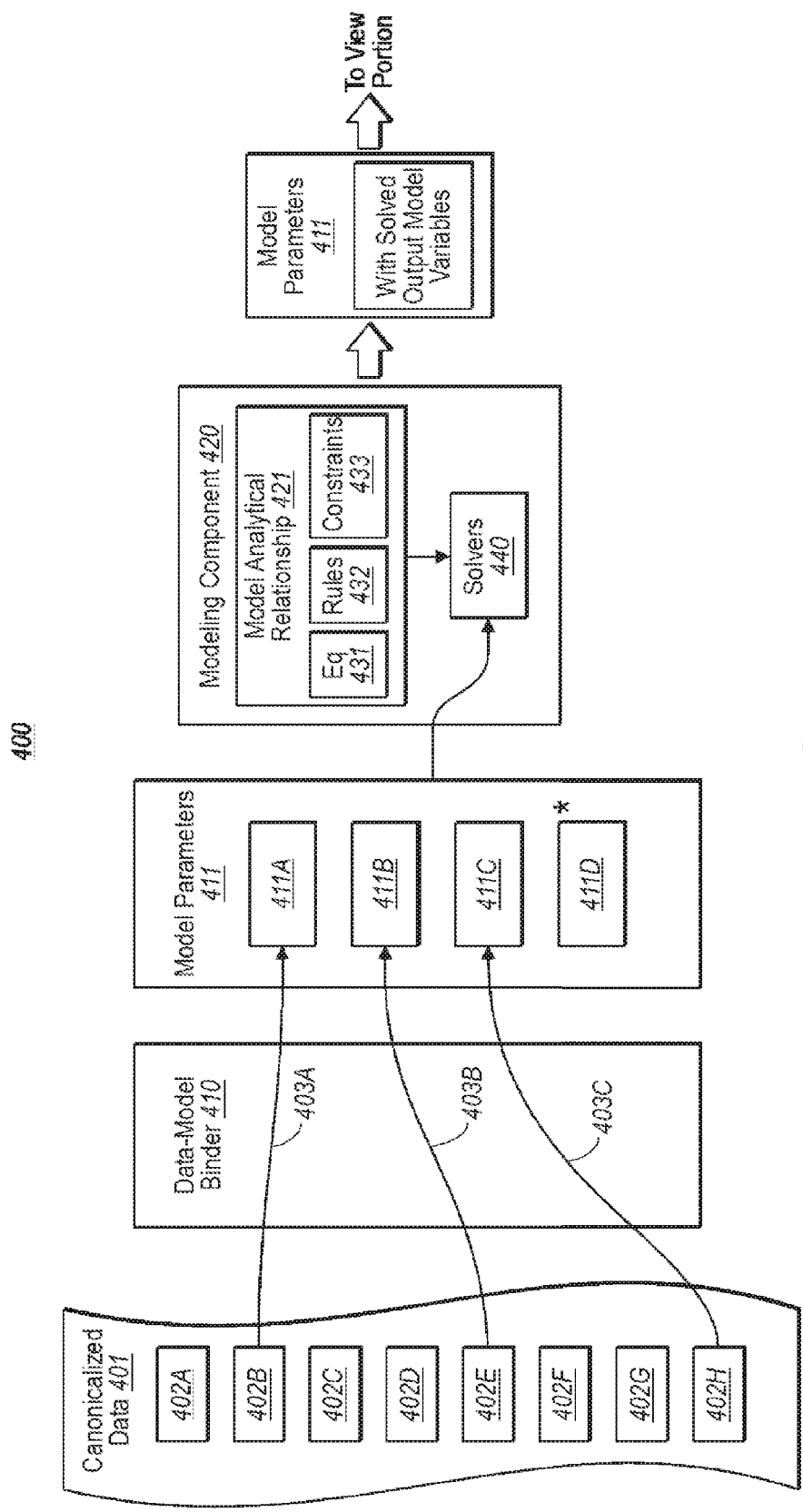
FIG. 4 schematically illustrates an embodiment of the analytics portion of the pipeline of FIG. 2.

FIG. 4 illustrates analytics portion 400 which represents an example of the analytics portion 220 of the pipeline 201 of FIG. 2. The data portion 300 provided the canonicalized data 401 to the data-model binding component 410. The canonicalized data 401 might have any canonicalized form, and any number of parameters, where the form and number of parameters might even differ from one piece of input data to another. For purposes of discussion, however, the canonical data 401 has fields 402A through 402H, which may collectively be referred to herein as "fields 402".

On the other hand, the analytics portion 400 includes a number of model parameters 411. The type and number of model parameters may differ according to the model. However, for purposes of discussion of a particular example, the model parameters 411 will be discussed as including model parameters 411A, 411B, 411C and 411D. In one embodiment, the identity of the model parameters, and the analytical relationships between the model parameters may be declaratively defined without using imperative coding.

A data-model binding component 410 intercedes between the canonicalized data fields 402 and the model parameters 411 to thereby provide bindings between the fields and parameters. In this case, the data field 402B is bound to model parameter 411A as represented by arrow 403A. In other words, the value from data field 402B is used to populate the model parameter 411A. Also, in this example, the data field 402E is bound to model parameter 411B (as represented by arrow 403B), and data field 402H is bound to model parameter 411C (as represented by arrow 403C).

The data fields 402A, 402C, 402D, 402F and 402G are not shown bound to any of the model parameters. This is to emphasize that not all of the data fields from input data are always required to be used as model parameters. In one embodiment, one or more of these data fields may be used to provide instructions to the data-model binding component 410 on which fields from the canonicalized data (for this canonicalized data or perhaps any future similar canonicalized data) are to be bound to which model parameter. This represents an example of the kind of analytics data 221 that may be provided to the analytics portion 220 of FIG. 2. The definition of which data fields from the canonicalized data are bound to which model parameters may be formulated in a number of ways. For instance, the bindings may be 1) explicitly set by the author at authoring time, 2) explicitly set by the user at use time (subject to any restrictions imposed by the author), 3) automatic binding by the authoring component 240 based on algorithmic heuristics, and/or 4) prompting by the authoring component of the author and/or user to specify a binding when it is determined that a binding cannot be made algorithmically. Thus bindings may also be resolved as part of the model logic itself.

The ability of an author to define which data fields are mapped to which model parameters gives the author great flexibility in being able to use symbols that the author is comfortable with to define model parameters. For instance, if one of the model parameters represents pressure, the author can name that model parameter "Pressure" or "P" or any other symbol that makes sense to the author. The author can even rename the model parameter which, in one embodiment, might cause the data model binding component 410 to automatically update to allow bindings that were previously to the model parameter of the old name to instead be bound to the model parameter of the new name, thereby preserving the desired bindings. This mechanism for binding also allows binding to be changed declaratively at runtime.

The model parameter 411D is illustrated with an asterisk to emphasize that in this example, the model parameter 411D was not assigned a value by the data-model binding component 410. Accordingly, the model parameter 411D remains an unknown. In other words, the model parameter 411D is not assigned a value.

The modeling component 420 performs a number of functions. First, the modeling component 420 defines analytical relationships 421 between the model parameters 411. The analytical relationships 421 are categorized into three general categories including equations 431, rules 432 and constraints 433. However, the list of solvers is extensible. In one embodiment, for example, one or more simulations may be incorporated as part of the analytical relationships provided a corresponding simulation engine is provided and registered as a solver.

The term "equation" as used herein aligns with the term as it is used in the field of mathematics.

The term "rules" as used herein means a conditional statement where if one or more conditions are satisfied (the conditional or "if" portion of the conditional statement), then one or more actions are to be taken (the consequence or "then" portion of the conditional statement). A rule is applied to the model parameters if one or more model parameters are expressed in the conditional statement, or one or more model parameters are expressed in the consequence statement.

The term "constraint" as used herein means that a restriction is applied to one or more model parameters. For instance, in a city planning model, a particular house element may be restricted to placement on a map location that has a subset of the total possible zoning designations. A bridge element may be restricted to below a certain maximum length, or a certain number of lanes.

An author that is familiar with the model may provide expressions of these equations, rules and constraint that apply to that model. In the case of simulations, the author might provide an appropriate simulation engine that provides the appropriate simulation relationships between model parameters. The modeling component 420 may provide a mechanism for the author to provide a natural symbolic expression for equations, rules and constraints. For example, an author of a thermodynamics-related model may simply copy and paste equations from a thermodynamics textbook. The ability to bind model parameters to data fields allows the author to use whatever symbols the author is familiar with (such as the exact symbols used in the author's relied-upon textbooks) or the exact symbols that the author would like to use.

Prior to solving, the modeling component 420 also identifies which of the model parameters are to be solved for (i.e., hereinafter, the "output model variable" if singular, or "output model variables" if plural, or "output model variable(s)" if there could be a single or plural output model variables). The output model variable(s) may be unknown parameters, or they might be known model parameters, where the value of the known model parameter is subject to change in the solve operation. In the example of FIG. 4, after the data-model binding operation, model parameters 411A, 411B and 411C are known, and model parameter 411D is unknown. Accordingly, unknown model parameter 411D might be one of the output model variables. Alternatively or in addition, one or more of the known model parameters 411A, 411B and 411C might also be output model variables. The solvers 440 then solve for the output model variable(s), if possible. In one embodiment described hereinafter, the solvers 440 are able to solve for a variety of output model variables, even within a single model so long as sufficient input model variables are provided to allow the solve operation to be performed. Input model variables might be, for example, known model parameters whose values are not subject to change during the solve operation. For instance, in FIG. 4, if the model parameters 411A and 411D were input model variables, the solver might instead solve for output model variables 411B and 411C instead. In one embodiment, the solver might output any one of a number of different data types for a single model parameter. For instance, some equation operations (such as addition, subtraction, and the like) apply regardless of the whether the operands are integers, floating point, vectors of the same, or matrices of the same.

Although not a preferred embodiment by any means, there is one embodiment in which the solvers 440 is implemented by way of a spreadsheet program in which there are multiple spreadsheets, whether those multiple spreadsheets be in a single spreadsheet file in multiple tabs and/or whether those multiple spreadsheets be in different spreadsheet files. In a typical spreadsheet, there are multiple cells. Each cell may have a literal value or an associated expression that may be resolved into a literal value. If an expression, the expression may rely upon values from other cells, would values could potentially also have been resolved via a corresponding expression associated with the other cells.

Spreadsheets are effective when solving in one direction where the input model parameters and the output model parameters are known. However, one of the advantages attributed to the solvers 440 is that different solve directions are enabled depending on which model parameter(s) are identified as an input parameter(s), and which model parameter(s) are identified as an output model parameter(s), with the solve direction perhaps changing from one solve to the next as the identity of the input model parameter(s) and/or the output model parameter(s) changes. This may be addressed in the spreadsheet program by assigning a different spreadsheet for each possible solve direction. For instance, if there are twenty possible solve directions, there may be 20 total spreadsheets, one for each solve direction.

Each spreadsheet has the appropriately linked cells with the appropriate expressions for solving in that direction. In this embodiment, a macro or other executable either internal to the spreadsheet program, or external to the spreadsheet program might perform the function described for the modeling component 420 in determining which parameters are input parameters and which are to be solved for, select the appropriate spreadsheet given that solve direction, and populate the appropriate spreadsheet fields for the selected solve direction. Once the appropriate input parameter fields are populated, the spreadsheet will solve for the output model parameter(s) and populate the values into the appropriate output model parameter field(s) using the linked expressions in the spreadsheet. Recall, however, that the spreadsheet implementation is not the preferred embodiment of practicing the principles described herein. For instance, if there were hundreds of possible solve directions, there might be hundreds of spreadsheets in the embodiment where one spreadsheet is dedicated to each solve direction. Thus, if the analytics were to change in this spreadsheet embodiment, this spreadsheet embodiment would involve manually sifting through each of the spreadsheets to see how the linked analytical expressions should be changed. This description will now focus more away from the specific spreadsheet embodiment, and move once again more into a general discussion of the solver 400 functionality.

In one embodiment, even when the solvers 440 cannot solve for a particular output model variable, the solver 400 might still present a partial solution for that output model variable, even if a full solve to the actual numerical result (or whatever the solved-for data type) is not possible. This allows the pipeline to facilitate incremental development by prompting the author as to what information is needed to arrive at a full solve. This also helps to eliminate the distinction between author time and use time, since at least a partial solve is available throughout the various authoring stages. For an abstract example, suppose that the analytics model includes an equation a=b+c+d. Now suppose that a, c and d are output model variables, and b is an input model variable having a known value of 5 (an integer in this case). In the solving process, the solvers 440 are only able to solve for one of the output model variables "d", and assign a value of 6 (an integer) to the model parameter called "d", but the solvers 440 are not able to solve for "c". Since "a" depends from "c", the model parameter called "a" also remains an unknown and unsolved for. In this case, instead of assigning an integer value to "a", the solver might do a partial solve and output the string value of "c+11" to the model parameter "a". As previously mentioned, this might be especially helpful when a domain expert is authoring an analytics model, and will essentially serve to provide partial information regarding the content of model parameter "a" and will also serve to cue the author that some further model analytics needs to be provided that allow for the "c" model parameter to be solved for. This partial solve result may be perhaps output in some fashion in the view composition to allow the domain expert to see the partial result.

The solvers 440 are shown in simplified form in FIG. 4. However, the solvers 440 may direct the operation of multiple constituent solvers as will be described with respect to FIGS. 10 through 16. In FIG. 4, the modeling component 420 then makes the model parameters 411 (including the now known and solved-for output model variables) available as output to be provided to the view portion 500 of FIG. 5.

Figure 5:
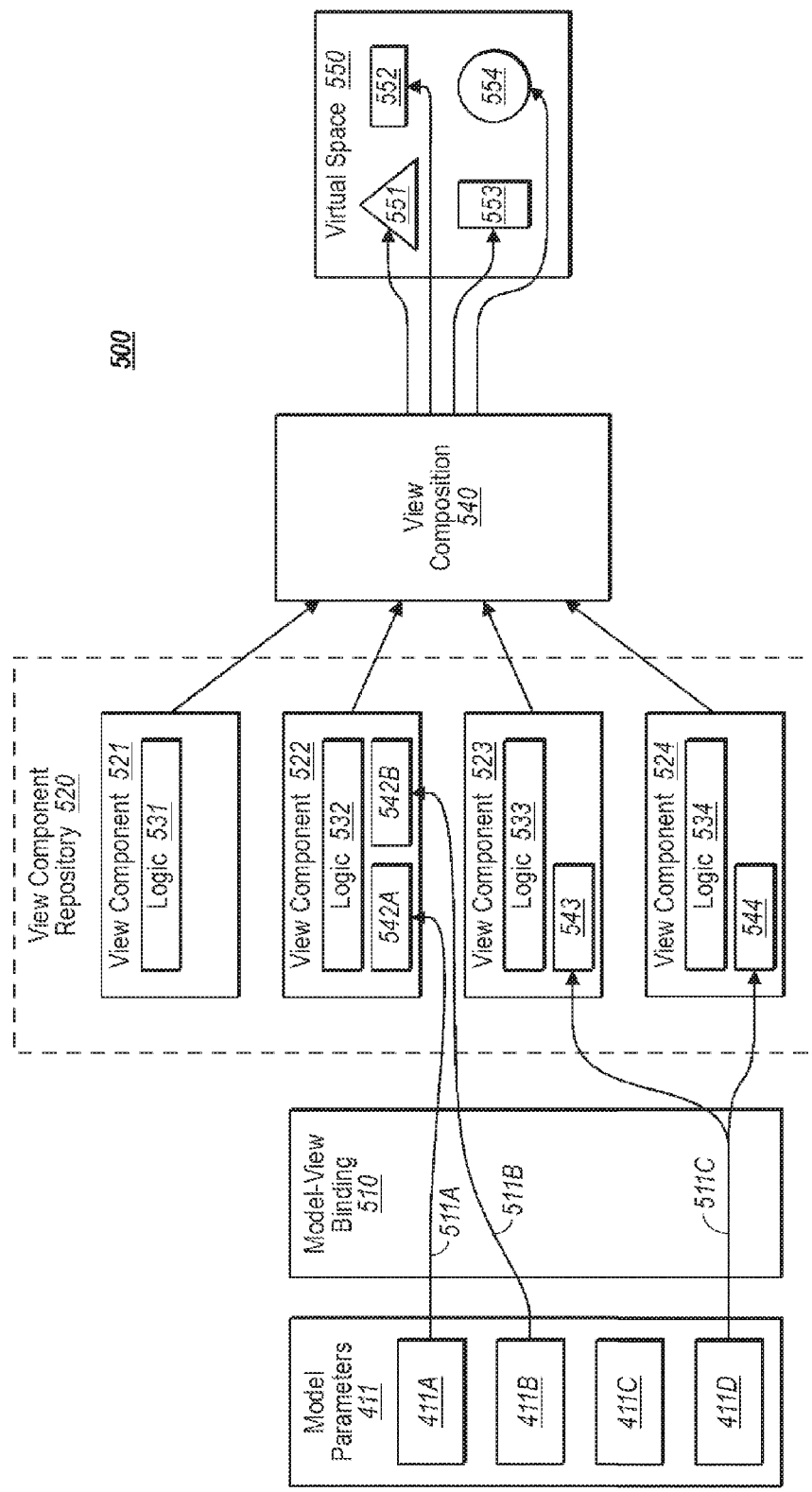
FIG. 5 schematically illustrates an embodiment of the view portion of the pipeline of FIG. 2.

FIG. 5 illustrates a view portion 500 which represents an example of the view portion 230 of FIG. 2. The view portion 500 receives the model parameters 411 from the analytics portion 400 of FIG. 4. The view portion also includes a view components repository 520 that contains a collection of view components. For example, the view components repository 520 in this example is illustrated as including view components 521 through 524, although the view components repository 520 may contain any number of view components. The view components each may include zero or more input parameters. For example, view component 521 does not include any input parameters. However, view component 522 includes two input parameters 542A and 542B. View component 523 includes one input parameter 543, and view component 524 includes one input parameter 544. That said, this is just an example. The input parameters may, but need not necessarily, affect how the visual item is rendered. The fact that the view component 521 does not include any input parameters emphasizes that there can be views that are generated without reference to any model parameters. Consider a view that comprises just fixed (built-in) data that does not change. Such a view might for example constitute reference information for the user. Alternatively, consider a view that just provides a way to browse a catalog, so that items can be selected from it for import into a model.

Each view component 521 through 524 includes or is associated with corresponding logic that, when executed by the view composition component 540 using the corresponding view component input parameter(s), if any, causes a corresponding view item to be placed in virtual space 550. That virtual item may be a static image or object, or may be a dynamic animated virtual item or object For instance, each of view components 521 through 524 are associated with corresponding logic 531 through 534 that, when executed causes the corresponding virtual item 551 through 554, respectively, to be rendered in virtual space 550. The virtual items are illustrated as simple shapes. However, the virtual items may be quite complex in form perhaps even including animation. In this description, when a view item is rendered in virtual space, that means that the view composition component has authored sufficient instructions that, when provided to the rendering engine, the rendering engine is capable of displaying the view item on the display in the designated location and in the designated manner.

The view components 521 through 524 may be provided perhaps even as view data to the view portion 500 using, for example, the authoring component 240 of FIG. 2. The view data may even be a range of a pseudo-infinite or partially-pseudo infinite data stream provided by a data stream object as described above with respect to FIG. 6. For instance, the authoring component 240 might provide a selector that enables the author to select from several geometric forms, or perhaps to compose other geometric forms. The author might also specify the types of input parameters for each view component, whereas some of the input parameters may be default input parameters imposed by the view portion 500. The logic that is associated with each view component 521 through 524 may be provided with view data, and/or may also include some default functionality provided by the view portion 500 itself.

The view portion 500 includes a model-view binding component 510 that is configured to bind at least some of the model parameters to corresponding input parameters of the view components 521 through 524. For instance, model parameter 411A is bound to the input parameter 542A of view component 522 as represented by arrow 511A. Model parameter 411B is bound to the input parameter 542B of view component 522 as represented by arrow 511B. Also, model parameter 411D is bound to the input parameters 543 and 544 of view components 523 and 524, respectively, as represented by arrow 511C. The model parameter 411C is not shown bound to any corresponding view component parameter, emphasizing that not all model parameters need be used by the view portion of the pipeline, even if those model parameters were essential in the analytics portion. Also, the model parameter 411D is shown bound to two different input parameters of view components representing that the model parameters may be bound to multiple view component parameters. In one embodiment, the definition of the bindings between the model parameters and the view component parameters may be formulated by 1) being explicitly set by the author at authoring time, 2) explicitly set by the user at use time (subject to any restrictions imposed by the author), 3) automatic binding by the authoring component 240 based on algorithmic heuristics, and/or 4) prompting by the authoring component of the author and/or user to specify a binding when it is determined that a binding cannot be made algorithmically.

Once again, while not preferred, some or all of the view portion 500 may be implemented by way of a spreadsheet. For instance, a single spreadsheet might serve as a foundation for one or more view components, with the respective input parameter(s) of the view components represented in corresponding spreadsheet cells. The associated view construction logic of the view components may be represented at least in part using linked expressions within the spreadsheet program. The rendering capabilities of the spreadsheet program, a macro, or some other executable program may then be used to complete the rendering of the corresponding visual item. As previously mentioned, however, this spreadsheet-based implementation is not the preferred embodiment, and thus this description will now turn back to the more general embodiments of the view portion 500.

As previously mentioned, the view item may include an animation. To take a simple example, consider for example a bar chart that plots a company's historical and projected revenues, advertising expenses, and profits by sales region at a given point in time (such as a given calendar quarter). A bar chart could be drawn for each calendar quarter in a desired time span. Now, imagine that you draw one of these charts, say the one for the earliest time in the time span, and then every half second replace it with the chart for the next time span (e.g., the next quarter). The result will be to see the bars representing profit, sales, and advertising expense for each region change in height as the animation proceeds. In this example, the chart for each time period is a "cell" in the animation, where the cell shows an instant between movements, where the collection of cells shown in sequence simulates movement. Conventional animation models allow for animation over time using built-in hard-coded chart types.

However, using the pipeline 201, by contrast, any kind of visual can be animated, and the animation can be driven by varying any one or any combination of the parameters of the visual component. To return to the bar chart example above, imagine that instead of animating by time, we animate by advertising expense. Each "cell" in this animation is a bar chart showing sales and profits over time for a given value of advertising expense. Thus, as the advertising expense is varied, the bars grow and shrink in response to the change in advertising expense.

The power of animated data displays is that they make very apparent to the eye what parameters are most sensitive to change in other parameters, because you immediately see how quickly and how far each parameter's values change in response to the varying of the animation parameter.

The pipeline 201 is also distinguished in its ability to animate due to the following characteristics:

First, the sequences of steps for the animation variable can be computed by the analytics of the model, versus being just a fixed sequence of steps over a predefined range. For example, in the example of varying the advertising expense as the animation variable, imagine that what is specified is to "animate by advertising expense where advertising expense is increased by 5% for each step" or "where advertising expense is 10% of total expenses for that step". A much more sophisticated example is "animate by advertising expense where advertising expense is optimized to maximize the rate of change of sales over time". In other words, the solver will determine a set of steps for advertising spend over time (i.e., for each successive time period such as quarter) such that the rate of growth of sales is maximized. Here the user presumably wants to see not only how fast sales can be made to grow by varying advertising expense, but also wants to learn the quarterly amounts for the advertising expenses that achieve this growth (the sequence of values could be plotted as part of the composite visual).

Second, any kind of visual can be animated, not just traditional data charts. For example, consider a Computer-Aided Design (CAD) model of a jet engine that is a) to be animated by the air speed parameter and 2) where the rotational speed of the turbine is a function of the air speed and 3) where the temperature of the turbine bearings is a function of the air speed. Jet engines have limits on how fast turbines can be rotated before either the turbine blades lose integrity or the bearing overheats. Thus, in this animation we desire that as air speed is varied the color of the turbine blades and bearing should be varied from blue (safe) to red (critical). The values for "safe" and "critical" turbine RPM and bearing temperature may well be calculated by the model based on physical characteristics of those parts. Now, as the animation varies the air speed over a defined range, we see the turbine blades and bearing each change color. What is now interesting is to notice which reaches critical first, and if either undergoes a sudden (runaway) run to critical. These kinds of effects are hard to discern by looking at a chart or at a sequence of drawings, but become immediately apparent in an animation. This is but one example of animating an arbitrary visual (CAD model) by an arbitrary parameter (air speed), with the animation affecting yet other arbitrary parameters (turbine RPM and bearing temp). Any parameter(s) of any visual(s)

can be animated according to any desired parameter(s) that are to serve as the animation variables.

Third, the pipeline 201 can be stopped mid stream so that the data and parameters may be modified by the user, and the animation then restarted or resumed. Thus, for example, in the jet engine example, if runaway heating is seen to start at a given air speed, the user may stop the animation at the point the runaway beings, modify some engine design criterion, such as the kind of bearing or bearing surface material, and then continue the animation to see the effect of the change.

As with other of the capabilities discussed herein, animations can be defined by the author, and/or left open for the user to manipulate to test various scenarios. For example, the model may be authored to permit some visuals to be animated by the user according to parameters the user himself selects, and/or over data ranges for the animation variable that the user selects (including the ability to specify computed ranges should that be desired). Such animations can also be displayed side by side as in the other what-if comparison displays. For example, a user could compare an animation of sales and profits over time, animated by time, in two scenarios with differing prevailing interest rates in the future, or different advertising expenses ramps. In the jet engine example, the user could compare the animations of the engine for both the before and after cases of changing the bearing design.

At this point, a specific example of how the composition framework may be used to actually construct a view composition will be described with respect to FIG. 7, which illustrated 3-D renderings 700 of a view composition that includes a room layout 701 with furniture laid out within the room, and also includes a Feng Shui meter 702. This example is provided merely to show how the principles described herein can apply to any arbitrary view composition, regardless of the domain. Accordingly, the example of FIG. 7, and any other example view composition described herein, should be viewed strictly as only an example that allows the abstract concept to be more fully understood by reference to non-limiting concrete examples, and not defining the broader scope of the invention. The principles described herein may apply to construct a countless variety of view compositions. Nevertheless, reference to a concrete example can clarify the broader abstract principles.

Figure 7:
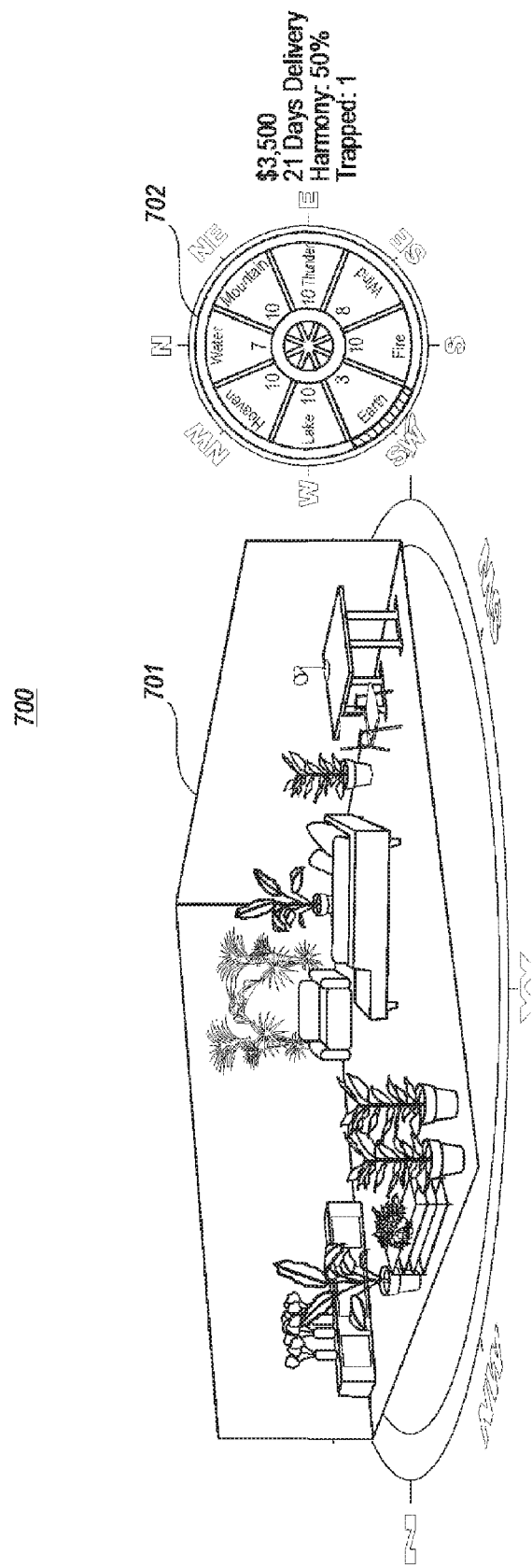
FIG. 7 illustrates a rendering of a view composition that may be constructed by the pipeline of FIG. 2.
Figure 8:
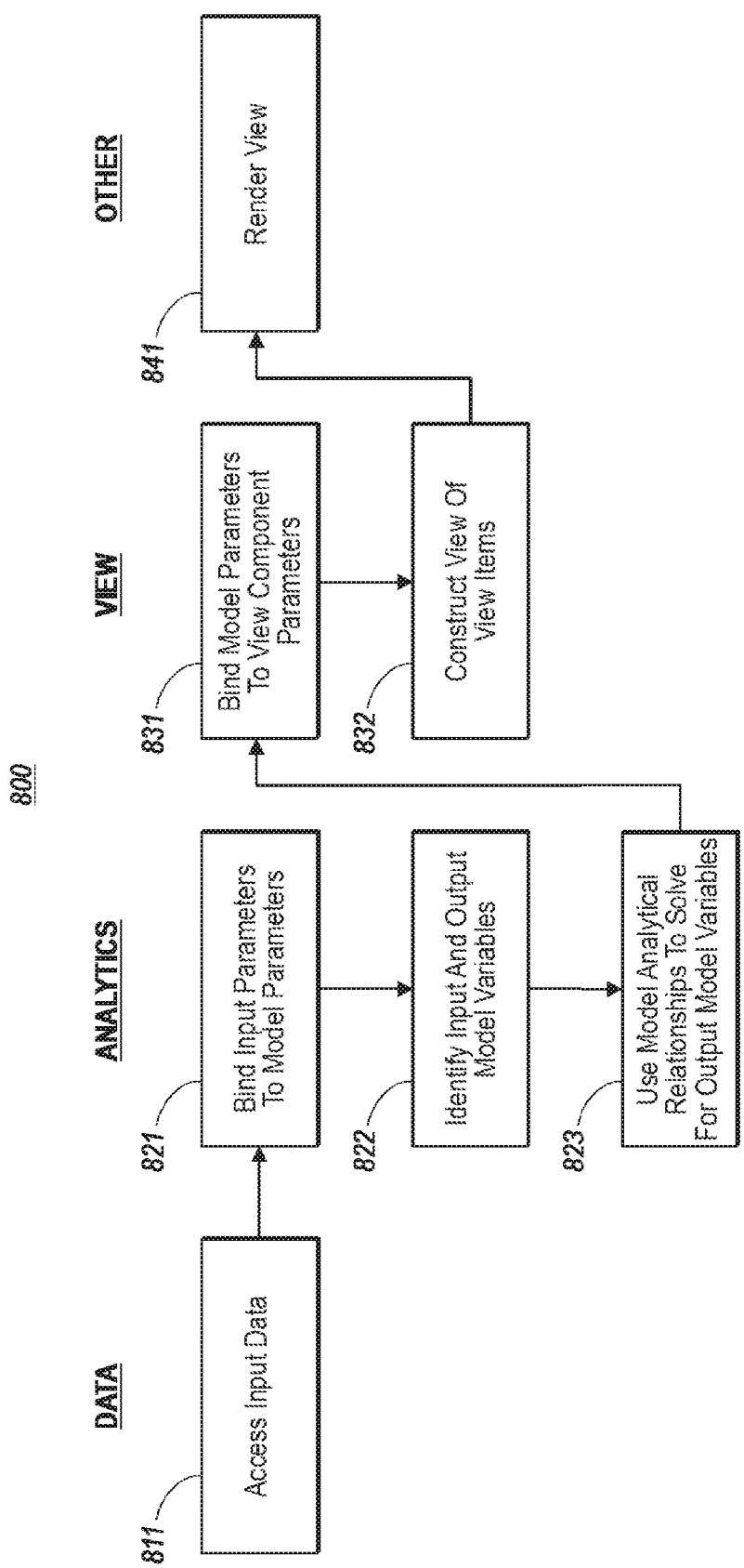
FIG. 8 illustrates a flowchart of a method for generating a view composition using the pipeline environment of FIG. 2.

FIG. 8 illustrates a flowchart of a method 800 for generating a view construction. The method 800 may be performed by the pipeline environment 200 of FIG. 2, and thus will be described with frequent reference to the pipeline environment 200 of FIG. 2, as well as with reference to FIGS. 3 through 5, which each show specific portions of the pipeline of FIG. 2. While the method 800 may be performed to construct any view composition, the method 800 will be described with respect to the view composition 700 of FIG. 7. Some of the acts of the method 800 may be performed by the data portion 210 of FIG. 2 and are listed in the left column of FIG. 8 under the header "Data". Other of the acts of the method 800 may be performed by the analytics portion 220 of FIG. 2, and are listed in the second from the left column of FIG. 8 under the header "Analytics". Other of the acts of the method may be performed by the view portion 230 of FIG. 2, and are listed in the second from the right column of FIG. 8 under the header "View". One of the acts may be performed by a rendering module and is listed in the right column of FIG. 8 under the header other.

Referring to FIG. 8, the data portion accesses input data that at least collectively affects what visual items are displayed or how a given one or more of the visual items are displayed (act 811). For instance, referring to FIG. 7, the input data might include view components for each of the items of furniture. For instance, each of the couch, the chair, the plants, the table, the flowers, and even the room itself may be represented by a corresponding view component. The view component might have input parameters that are suitable for the view component. If animation were employed, for example, some of the input parameters might affect the flow of the animation. Some of the parameters might affect the display of the visual item, and some parameters might not.

For instance, the room itself might be a view component. Some of the input parameters might include the dimensions of the room, the orientation of the room, the wall color, the wall texture, the floor color, the floor type, the floor texture, the position and power of the light sources in the room, and so forth. There might also be room parameters that do not necessarily get reflected in this view composition, but might get reflected in other views and uses of the room component. For instance, the room parameter might have a location of the room expressed in degrees, minutes, and seconds longitude and latitude. The room parameter might also include an identification of the author of the room component, and the average rental costs of the room.

The various components within the room may also be represented by a corresponding parameterized view component. For instance, each plant may be configured with an input parameter specifying a pot style, a pot color, pot dimensions, plant color, plant resiliency, plant dependencies on sunlight, plant daily water intake, plant daily oxygen production, plant position and the like. Once again, some of these parameters may affect how the display is rendered and others might not, depending on the nature of what is being displayed.

The Feng Shui meter 702 may also be a view component. The meter might include input parameters such as a diameter, a number of wedges to be contained in the diameter of the meter, a text color and the like. The various wedges of the Feng Shui meter may also be view components. In that case, the input parameters to the view components might be a title (e.g., water, mountain, thunder, wind, fire, earth, lake, heaven), perhaps a graphic to appear in the wedge, a color hue, or the like.

The analytics portion binds the input data to the model parameters (act 821), determines the output model variables (act 822), and uses the model-specific analytical relationships between the model parameters to solve for the output model variables (act 823). The binding operation of act 821 has been discussed above, and essentially allows flexibility in allowing the author to define the model analytics equations, rules and constraints using symbols that the model author is comfortable with. The more complex solver described with respect to FIGS. 10 through 16 may serve to solve for the output model variables (act 823).

The identification of the output model variables may differ from one solving operation to the next. Even though the model parameters may stay the same, the identification of which model parameters are output model variables will depend on the availability of data to bind to particular model parameters. This has remarkable implications in terms of allowing a user to perform what-if scenarios in a given view composition.

For instance, in the Feng Shui room example of FIG. 7, suppose the user has bought a new chair to place in their living room. The user might provide the design of the room as data into the pipeline. This might be facilitated by the authoring component prompting the user to enter the room dimensions, and perhaps provide a selection tool that allows the user to select virtual furniture to drag and drop into the virtual room at appropriate locations that the actual furniture is placed in the actual room. The user might then select a piece of furniture that may be edited to have the characteristics of the new chair purchased by the user. The user might then drag and drop that chair into the room. The Feng Shui meter 702 would update automatically. In this case, the position and other attributes of the chair would be input model variables, and the Feng Shui scores would be output model variables. As the user drags the virtual chair to various positions, the Feng Shui scores of the Feng Shui meter would update, and the user could thus test the Feng Shui consequences of placing the virtual chair in various locations. To avoid the user from having to drag the chair to every possible location to see which gives the best Feng Shui, the user can get local visual clues (such as, for example, gradient lines or arrows) that tell the user whether moving the chair in a particular direction from its current location makes things better or worse, and how much better or worse.

However, the user could also do something else that is unheard of in conventional view composition. The user could actually change the output model variables. For instance, the user might indicate the desired Feng Shui score in the Feng Shui meter, and leave the position of the virtual chair as the output model variable. The solver would then solve for the output model variable and provide a suggested position or positions of the chair that would achieve at least the designated Feng Shui score. The user may choose to make multiple parameters output model variables, and the system may provide multiple solutions to the output model variables. This is facilitated by a complex solver that is described in further detail with respect to FIGS. 10 through 16.

Returning to FIG. 8, once the output model variables are solved for, the model parameters are bound to the input parameters of the parameterized view components (act 831). For instance, in the Feng Shui example, after the unknown Feng Shui scores are solved for, the scores are bound as input parameters to Feng Shui meter view component, or perhaps to the appropriate wedge contained in the meter. Alternatively, if the Feng Shui scores were input model variables, the position of the virtual chair may be solved for and provided as an input parameter to the chair view component.

A simplified example will now be presented that illustrates the principles of how the solver can rearrange equations and change the designation of input and output model variables all driven off of one analytical model. The user herself does not have to rearrange the equations. The simplified example may not accurately represent Feng Shui rules, but illustrates the principle nevertheless. Suppose the total Feng Shui (FS) of the room (FSroom) equals the FS of a chair (FSchair) and the FS of a plant (FSplant). Suppose FSchair is equal to a constant A times the distance d of the chair from the wall. Suppose FSplant is a constant, B. The total FS of the room is then: FSroom=A*d+B. If d is an input model variable, then FSroom is an output model variable and its value, displayed on the meter, changes as the user repositions the chair. Now suppose the user clicks on the meter making it an input model variable and shifting d into unknown output model variable status. In this case, the solver effectively and internally rewrites the equation above as d=(FSroom−B)/A. In that case, the view component can move the chair around, changing d, its distance from the wall, as the user changes the desired value, FSroom, on the meter.

The view portion then constructs a view of the visual items (act 832) by executing the construction logic associated with the view component using the input parameter(s), if any, to perhaps drive the construction of the view item in the view composition. The view construction may then be provided to a rendering module, which then uses the view construction as rendering instructions (act 841).

In one embodiment, the process of constructing a view is treated as a data transformation that is performed by the solver. That is, for a given kind of view (e.g., consider a bar chart), there is a model consisting of rules, equations, and constraints that generates the view by transforming the input data into a displayable output data structure (called a scene graph) which encodes all the low level geometry and associated attributes needed by the rendering software to drive the graphics hardware. In the bar chart example, the input data would be for example the data series that is to be plotted, along with attributes for things like the chart title, axis labels, and so on. The model that generates the bar would have rules, equations, and constraints that would do things like 1) count how many entries the data series consists of in order to determine how many bars to draw, 2) calculate the range (min, max) that the data series spans in order to calculate things like the scale and starting/ending values for each axis, 3) calculate the height of the bar for each data point in the data series based on the previously calculated scale factor, 4) count how many characters are in the chart title in order to calculate a starting position and size for the title so that the title will be properly located and centered with respect to the chart, and so forth. In sum, the model is designed to calculate a set of geometric shapes based on the input data, with those geometric shapes arranged within a hierarchical data structure of type "scene graph". In other words, the scene graph is an output variable that the model solves for based on the input data. Thus, an author can design entirely new kinds of views, customize existing views, and compose preexisting views into composites, using the same framework that the author uses to author, customize, and compose any kind of model. Thus, authors who are not programmers can create new views without drafting new code.

Figure 9:
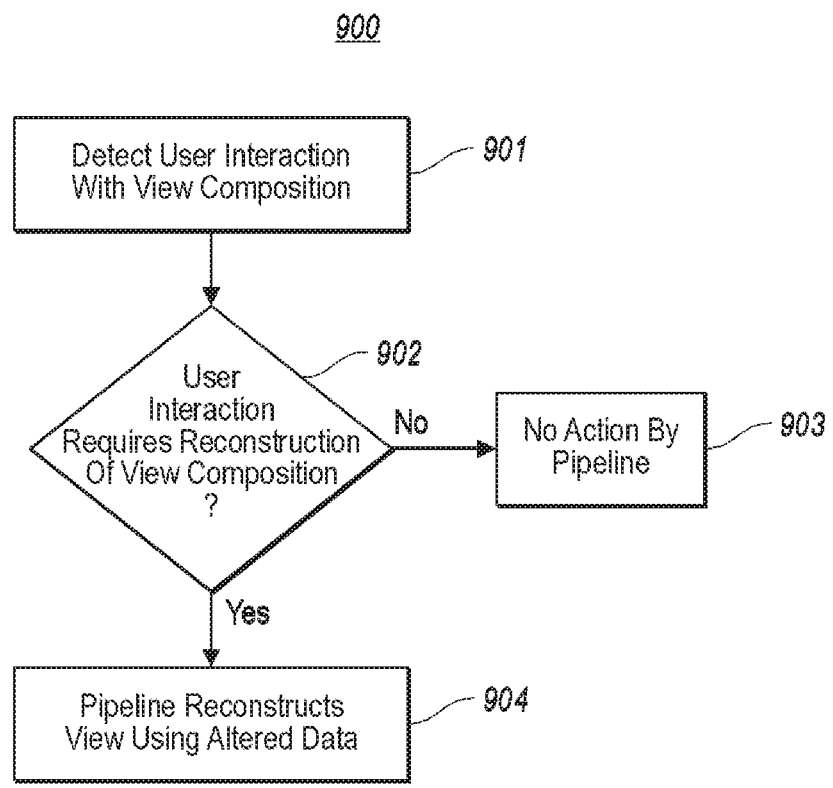
FIG. 9 illustrates a flowchart of a method for regenerating a view composition in response to user interaction with the view composition using the pipeline environment of FIG. 2.

Returning to FIG. 2, recall that the user interaction response module 250 detects when the user interacts with the view composition, and causes the pipeline to respond appropriately. FIG. 9 illustrates a flowchart of a method 900 for responding to user interaction with the view composition. In particular, the user interaction response module determines which the components of the pipeline should perform further work in order to regenerate the view, and also provides data represented the user interaction, or that is at least dependent on the user interaction, to the pipeline components. In one embodiment, this is done via a transformation pipeline that runs in the reverse (upstream) view/analytics/data direction and is parallel to the (downstream) data/analytics/view pipeline.

Interactions are posted as events into the upstream pipeline. Each transformer in the data/analytics/view pipeline provides an upstream transformer that handles incoming interaction data. These transformers can either be null (passthroughs, which get optimized out of the path) or they can perform a transformation operation on the interaction data to be fed further upstream. This provides positive performance and responsiveness of the pipeline in that 1) interaction behaviors that would have no effect on upstream transformations, such as a view manipulation that has no effect on source data, can be handled at the most appropriate (least upstream) point in the pipeline and 2) intermediate transformers can optimize view update performance by sending heuristically-determined updates back downstream, ahead of the final updates that will eventually come from further upstream transformers. For example, upon receipt of a data edit interaction, a view-level transformer could make an immediate view update directly into the scene graph for the view (for edits it knows how to interpret), with the final complete update coming later from the upstream data transformer where the source data is actually edited.

When the semantics of a given view interaction have a nontrivial mapping to the needed underlying data edits, intermediate transformers can provide the needed upstream mapping. For example, dragging a point on a graph of a computed result could require a backwards solve that would calculate new values for multiple source data items that feed the computed value on the graph. The solver-level upstream transformer would be able to invoke the needed solve and to propagate upstream the needed data edits.

FIG. 9 illustrates a flowchart of a method 900 for responding to user interaction with the view construction. Upon detecting that the user has interacted with the rendering of a view composition on the display (act 901), it is first determined whether or not the user interaction requires regeneration of the view (decision block 902). This may be performed by the rendering engine raising an event that is interpreted by the user interaction response component 250 of FIG. 2. If the user interaction does not require regeneration of the view (No in decision block 902), then the pipeline does not perform any further action to reconstruct the view (act 903), although the rendering engine itself may perform some transformation on the view. An example of such a user interaction might be if the user were to increase the contrast of the rendering of the view construction, or rotate the view construction. Since those actions might be undertaken by the rendering engine itself, the pipeline need perform no work to reconstruct the view in response to the user interaction.

If, on the other hand, it is determined that the type of user interaction does require regeneration of the view construction (Yes in decision block 902), the view is reconstructed by the pipeline (act 904). This may involve some altering of the data provided to the pipeline. For instance, in the Feng Shui example, suppose the user was to move the position of the virtual chair within the virtual room, the position parameter of the virtual chair component would thus change. An event would be fired informing the analytics portion that the corresponding model parameter representing the position of the virtual chair should be altered as well. The analytics component would then resolve for the Feng Shui scores, repopulate the corresponding input parameters of the Feng Shui meter or wedges, causing the Feng Shui meter to update with current Feng Shui scores suitable for the new position of the chair.

The user interaction might require that model parameters that were previously known are now unknown, and that previously unknown parameters are now known. That is one of several possible examples that might require a change in designation of input and output model variables such that previously designated input model variables might become output model variables, and vice versa. In that case, the analytics portion would solve for the new output model variable(s) thereby driving the reconstruction of the view composition.

This type of reconstruction is helpful in constructing alternative views of a view composition that is driven by different data. However, this is also helpful in storytelling, by causing transitions in a view to occur from one view composition to the next. Traditionally, this story telling has been done by taking snapshots of multiple different configurations of data within visualizations (which means the visualizations are also different), and then turning these snapshots into slides with simple transitions between the slides.

However, this approach does not work well more sophisticated visuals, such as perhaps the visualization of a room in the Feng Shui example, or perhaps a visualization of a complex piece of machinery such as a tractor. Unlike the simple visualizations used in charts, in real world or other sophisticated visualizations, there are a lot of permutations of what can be changed. Moreover, there is a continuum within possible changes to the visuals (e.g. a tractor arm can move to multiple positions continuously, and that arm move could lead to repositioning (possibly continuously) of many other elements. Or perhaps, any number of furniture or other room elements may be moved around and changed out.

Another approach that is taken is scripting of visualizations into a storyboard. The trouble here is that it is hard to make the script data driven, and it is hard for the script to presage and allow for the very many changes of data and visuals that a user could do, and the consequent propagated changes to the visuals in a way that respects constraints and other relationships within the data and visuals.

When constructed using the pipeline 201 described herein, on the other hand, very complex view compositions may be constructed. Each view composition might be a scene in a storyboard of complex scenes. The storyboard may transition from one scene to another by altering the view composition in one of a variety of possible ways. For instance, a transition might involve one some or all of the following transitions:

1) A visuals transformation: In this transformation, the data driving the view composition may stay the same, but the set of view components used to construct the view composition may change. In other words, the view on the data changes. For instance, a set of data might include environmental data including temperature, wind speed, and other data representing a sequence of environmental activities, such as a lightning strike. One scene might manifest that data in the context of an aircraft flying through that environment. The next scene in the storyboard might tell of another aircraft that is subjected to the entirely same environmental conditions.

2) Data transformation: Here, the view components stay the same. In other words, the view is kept the same, but the data that affects visual properties changes, thereby changing how the view is rendered. For instance, the data may change, and/or the binding of the data to model parameters changes.

3) Coordinate system transformation. Here, the data and set of view components may stay the same, but the coordinated system is changed from one coordinate system to another.

4) Target world transformation. Here, everything may stay the same, but the target virtual world changes. For example, one geometry may become superimposed upon another. An example of geometries, and superimposed geometries will be provided hereinafter.

Solver Framework

Figure 10:
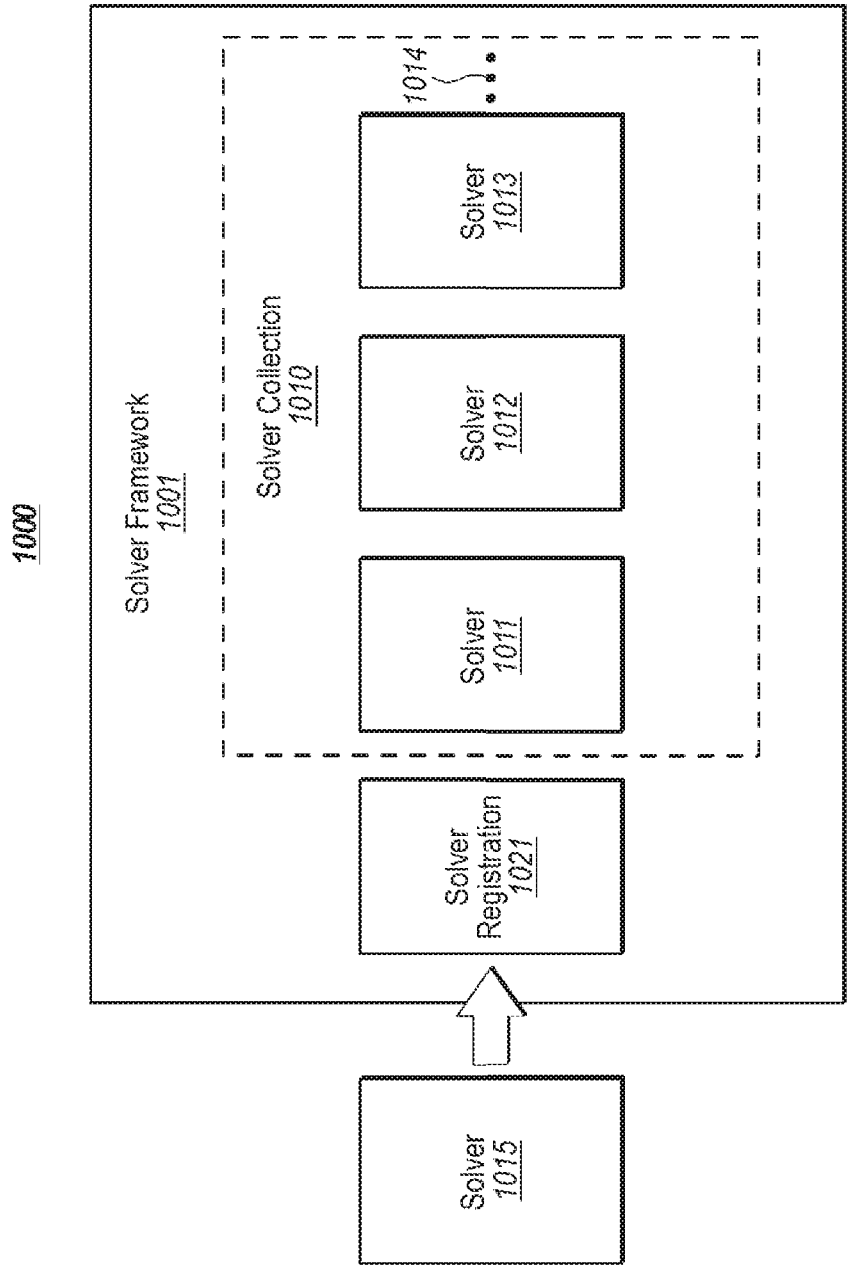
FIG. 10 schematically illustrates the solver of the analytics portion of FIG. 4 in further detail including a collection of specialized solvers.

FIG. 10 illustrates a solver environment 1000 that may represent an example of the solvers 440 of FIG. 4. The solver environment 1000 may be implemented in software, hardware, or a combination. The solver environment 1000 includes a solver framework 1001 that manages and coordinates the operations of a collection 1010 of specialized solvers. The collection 1010 is illustrated as including three specialized solvers 1011, 1012 and 1013, but the ellipsis 1014 represents that there could be other numbers (i.e., more than three or less than three) of specialized solvers as well. Furthermore, the ellipsis 1014 also represents that the collection 1010 of specialized solvers is extensible. As new specialized solvers are discovered and/or developed that can help with the model analytics, those new specialized solvers may be incorporated into the collection 1010 to supplement the existing specialized solvers, or perhaps to replace one or more of the existing solvers. For example, FIG. 10 illustrates that a new solver 1015 is being registered into the collection 1010 using the solver registration module 1021. As one example, a new solver might be perhaps a simulation solver which accepts one or more known values, and solves for one or more unknown values. Other examples include solvers for systems of linear equations, differential equations, polynomials, integrals, root-finders, factorizers, optimizers, and so forth. Every solver can work in numerical mode or in symbolic mode or in mixed numeric-symbolic mode. The numeric portions of solutions can drive the parameterized rendering downstream. The symbolic portions of the solution can drive partial solution rendering.

The collection of specialized solvers may include any solver that is suitable for solving for the output model variables. If, for example, the model is to determine drag of a bicycle, the solving of complex calculus equations might be warranted. In that case, a specialized complex calculus solver may be incorporated into the collection 1010 to perhaps supplement or replace an existing equations solver. In one embodiment, each solver is designed to solve for one or more output model variables in a particular kind of analytics relationship. For example, there might be one or more equation solvers configured to solve for unknowns in an equation. There might be one or more rules solvers configured to apply rules to solve for unknowns. There might be one or more constraints solvers configured to apply constraints to thereby solve for unknowns. Other types of solves might be, for example, a simulation solver which performs simulations using input data to thereby construct corresponding output data.

The solver framework 1001 is configured to coordinate processing of one or more or all of the specialized solvers in the collection 1010 to thereby cause one or more output model variables to be solved for. The solver framework 1001 is then configured to provide the solved-for values to one or more other external components. For instance, referring to FIG. 2, the solver framework 1001 may provide the model parameter values to the view portion 230 of the pipeline, so that the solving operation thereby affects how the view components execute to render a view item, or thereby affect other data that is associated with the view item. As another potential effect of solving, the model analytics themselves might be altered. For instance, as just one of many examples in which this might be implemented, the model might be authored with modifiable rules set so that, during a given solve, some rule(s) and/or constraint(s) that are initially inactive become activated, and some that are initially activated become inactivated. Equations can be modified this way as well.

Figure 11:
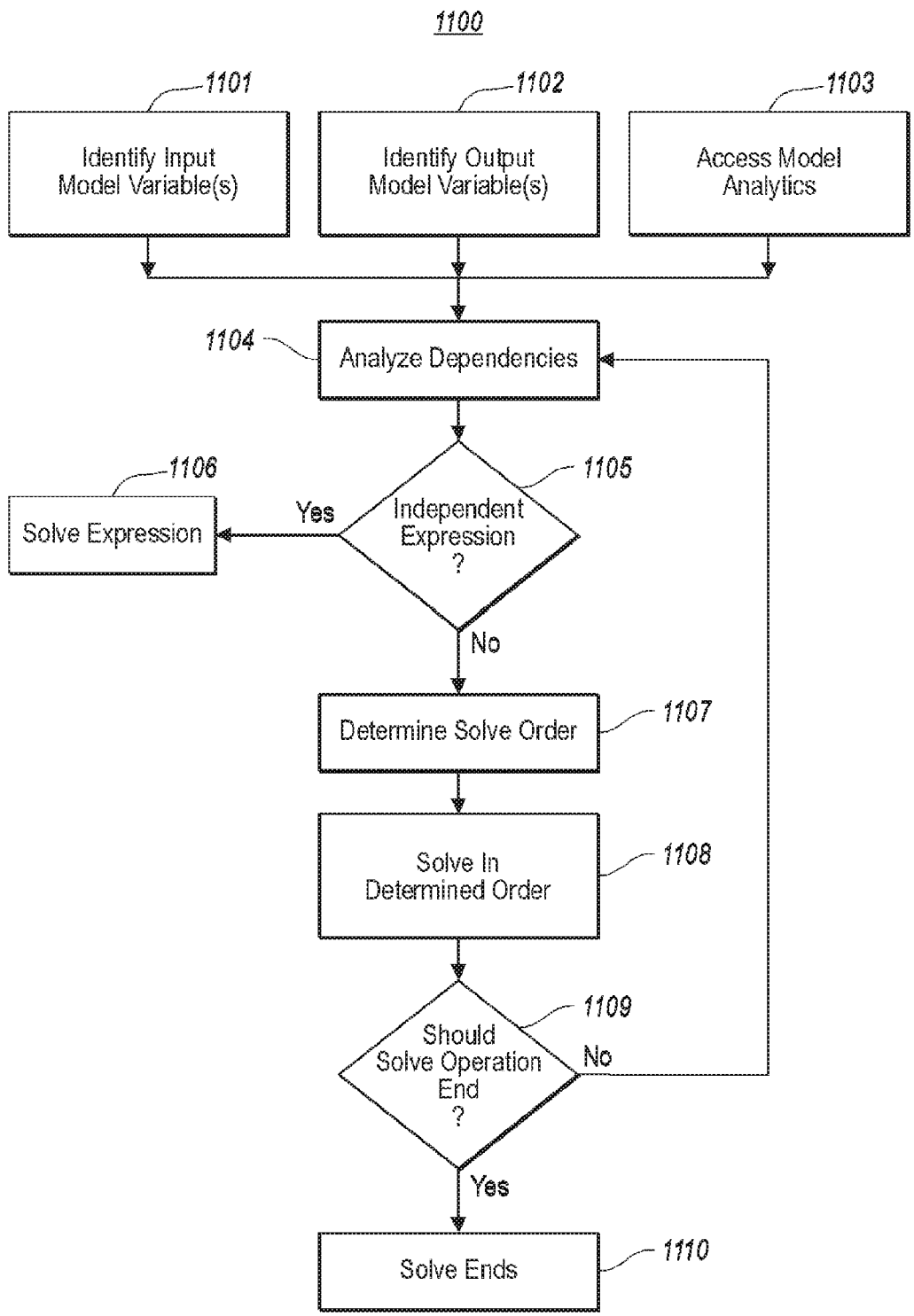
FIG. 11 illustrates a flowchart of the solver of FIG. 10 solving for unknown model parameters by coordinating the actions of a collection of specialized solvers.

FIG. 11 illustrates a flowchart of a method 1100 for the solver framework 1001 to coordinate processing amongst the specialized solvers in the collection 1010. The method 1100 of FIG. 11 will now be described with frequent reference to the solver environment 1000 of FIG. 10.

The solver framework begins a solve operation by identifying which of the model parameters are input model variables (act 1101), and which of the model parameters are output model variables (act 1102), and by identifying the model analytics that define the relationship between the model parameters (act 1103). Given this information, the solver framework analyzes dependencies in the model parameters (act 1104). Even given a fixed set of model parameters, and given a fixed set of model analytics, the dependencies may change depending on which of the model parameters are input model variables and which are output model variables. Accordingly, the system can infer a dependency graph each time a solve operation is performed using the identity of which model parameters are input, and based on the model analytics. The user need not specify the dependency graph for each solve. By evaluating dependencies for every solve operation, the solver framework has the flexibility to solve for one set of one or more model variables during one solve operation, and solve for another set of one or more model variables for the next solve operation. In the context of FIGS. 2 through 5, that means greater flexibility for a user to specify what is input and what is output by interfacing with the view composition.

In some solve operations, the model may not have any output model variables at all. In that case, the solve will verify that all of the known model parameter values, taken together, satisfy all the relationships expressed by the analytics for that model. In other words, if you were to erase any one data value, turning it into an unknown, and then solve, the value that was erased would be recomputed by the model and would be the same as it was before. Thus, a model that is loaded can already exist in solved form, and of course a model that has unknowns and gets solves now also exists in solved form. What is significant is that a user interacting with a view of a solved model is nevertheless able to edit the view, which may have the effect of changing a data value or values, and thus cause a re-solve that will attempt to recompute data values for output model variables so that the new set of data values is consistent with the analytics. Which data values a user can edit (whether or not a model starts with output model variables) is controlled by the author; in fact, this is controlled by the author defining which variables represented permitted unknowns.

If there are expressions that have one or more unknowns that may be independently solved without first solving for other unknowns in other expressions (Yes in decision block 1105), then those expressions may be solved at any time (act 1106), even perhaps in parallel with other solving steps. On the other hand, if there are expressions that have unknowns that cannot be solved without first solving for an unknown in another expression, then a solve dependency has been found. In that case, the expression becomes part of a relational structure (such as a dependency tree) that defines a specific order of operation with respect to another expression.

In the case of expressions that have interconnected solve dependencies from other expressions, an order of execution of the specialized solvers is determined based on the analyzed dependencies (act 1107). The solvers are then executed in the determined order (act 1108). In one example, in the case where the model analytics are expressed as equations, constraints, and rules, the order of execution may be as follows 1) equations with dependencies or that are not fully solvable as an independent expression are rewritten as constraints 2) the constraints are solved, 3) the equations are solved, and 4) the rules are solved. The rules solving may cause the data to be updated.

Once the solvers are executed in the designated order, it is then determined whether or not solving should stop (decision block 1109). The solving process should stop if, for example, all of the output model variables are solved for, or if it is determined that even though not all of the output model variables are solved for, the specialized solvers can do nothing further to solve for any more of the output model variables. If the solving process should not end (No in decision block 1109), the process returns back to the analyzing of dependencies (act 1104). This time, however, the identity of the input and output model variables may have changed due to one or more output model variables being solved for. On the other hand, if the solving process should end (Yes in decision block 1109) the solve ends (act 1110). However, if a model cannot be fully solved because there are too many output model variables, the model nevertheless may succeed in generating a partial solution where the output model variables have been assigned symbolic values reflective of how far the solve was able to proceed. For example, if a model has an equation A=B+C, and B is known to be "2" and is an input model variable but C is an output model variable and A is also an output model variable and needs to be solved for, the model solver cannot product a numerical value for A since while B is known C is unknown; so instead of a full solve, the solver returns "2+C" as the value for A. It is thus clear to the author what additional variable needs to become known, either by supplying it a value or by adding further rules/equations/ constraints or simulations that can successfully produce the needed value from other input data.

This method 1100 may repeat each time the solver framework detects that there has been a change in the value of any of the known model parameters, and/or each time the solver framework determines that the identity of the known and unknown model parameters has changed. Solving can proceed in at least two ways. First, if a model can be fully solved symbolically (that is, if all equations, rules, and constraints can be algorithmically rewritten so that a computable expression exists for each unknown) then that is done, and then the model is computed. In other words, data values are generated for each unknown, and/or data values that are permitted to be adjusted are adjusted. As a second possible way, if a model cannot be fully solved symbolically, it is partially solved symbolically, and then it is determined if one or more numerical methods can be used to effect the needed solution. Further, an optimization step occurs such that even in the first case, it is determined whether use of numerical methods may be the faster way to compute the needed values versus performing the symbolic solve method. Although the symbolic method can be faster, there are cases where a symbolic solve may perform so many term rewrites and/or so many rewriting rules searches that it would be faster to abandon this and solve using numeric methods.

Figure 12:
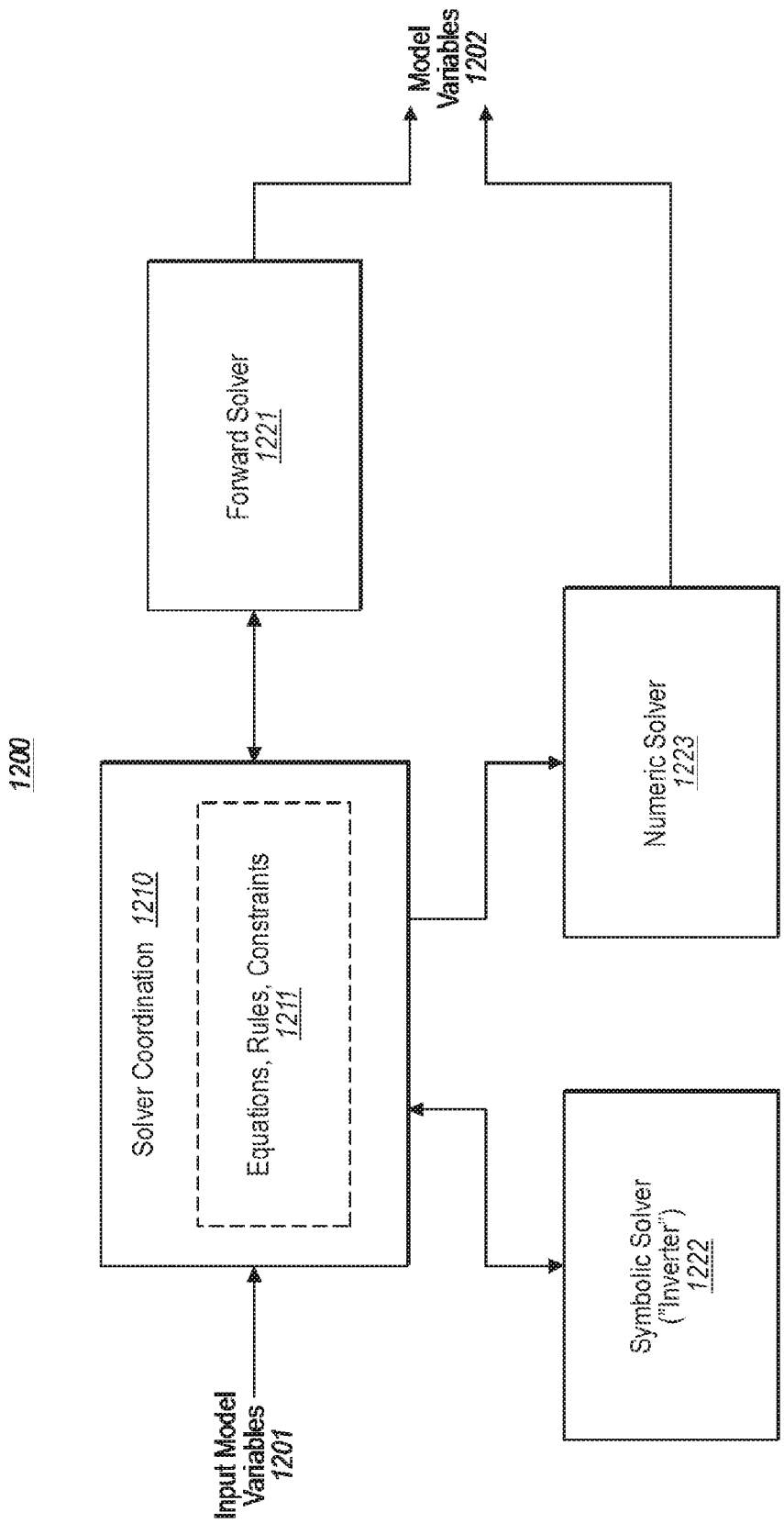
FIG. 12 schematically illustrates a solver environment that represents an example of the solver of FIG. 10.

FIG. 12 illustrates a solver environment 1200 that represents an example of the solver environment 1000 of FIG. 10. In this case, the solver coordination module 1210 acts to receive the input model variables 1201 and coordinate the actions of the forward solver 1221, the symbolic solver 1222 (or the "inverter"), and the numeric solver 1223 such that the model variables 1202 (including the output model variables) are generated. The forward solver 1221, the symbolic solver 1222 and the numeric solver 1223 are examples of the solvers that might be in the solver collection 1010 of FIG. 10.

The solver coordination module 1210 maintains a dependency graph of the model analytics that have corresponding model variables. For each solve operation, the solver coordination module 1210 may determine which of the model variables are input model variables, and which of the model variables are output model variables and thus are to be solved for.

The forward solver 1221 solves model analytics that are properly presented so as to be forward solvable. For instance, if there is but one equation in the model analytics A=B+C, and if B and C are input model variables, then A can be solved for using a forward solve by plugging in the values for B and C into the equation, and determining the resulting value for A.

The symbolic solver 1222 rewrites model analytics so as to be forward solvable. For instance, suppose in the equation A=B+C, it is variables A and C that are input variables, and variable B that is an output variable to be solved for. In this situation, the model analytics cannot be forward solved without first inverting the model analytics (in this case inverting the equation). Accordingly, the symbolic solver 1222 rewrites the equation A=B+C as B=A−C. Now, the inverted equation can be subjected to a forward solve by the forward solver 1221 such that the input variables A and C are plugged into the equation B=A−C to obtain the value of variable B.

Some equations are not mathematically invertible, or at least it has not yet been discovered how to invert some types of equations. Furthermore, even if the equation is invertible, or it is known how to invert the equation, the symbolic solver 1222 might simply not be able to invert the equation. Or perhaps it is simply inefficient for the symbolic solver 1222 to invert the equation as compared to resorting to other solving methods, such as numeric solving. Accordingly, the numeric solver 1223 is provided to solve model analytics using model analytics in the case where the model analytics are not properly invertible (either because inversion was not possible, not known, or not enabled by the symbolic solver).

Figure 13:
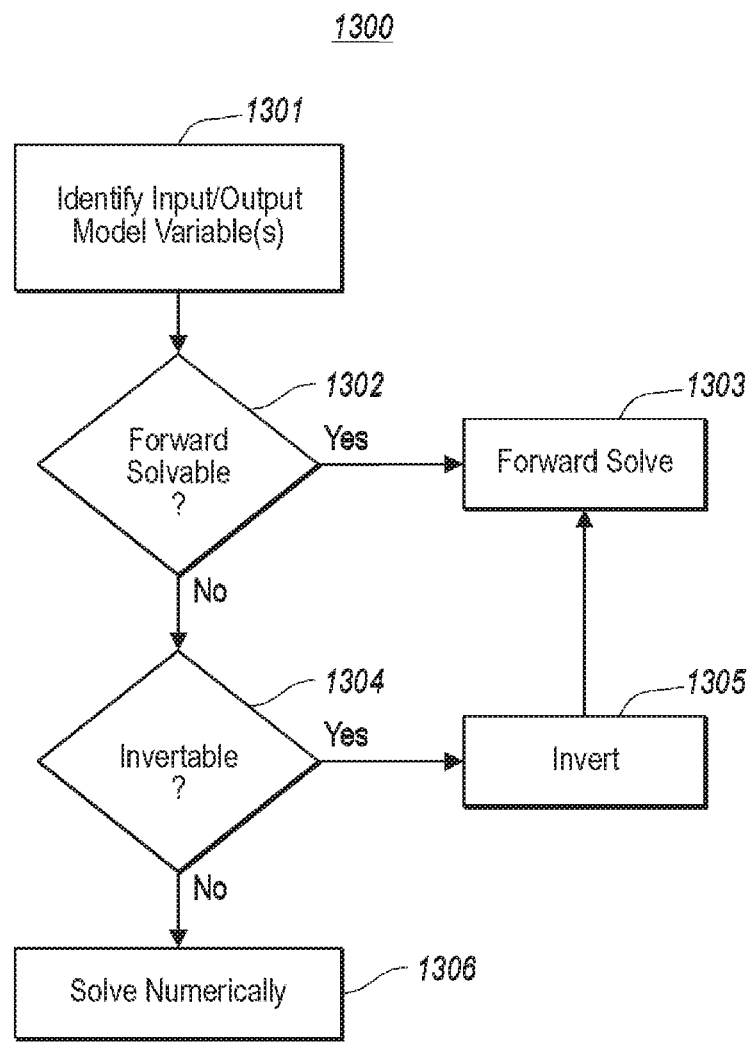
FIG. 13 illustrates a flowchart of a method for using the solver environment of FIG. 12 to solve for model analytics.

The solver coordination module 1210 is configured to manage each solve operation. For instance, FIG. 13 illustrates a flowchart of a method 1300 for managing the solve operation such that model analytics may be solved for. The method 1300 may be managed by the solver environment 1200 under the direction of the solver coordination module 1210.

The solver coordination module 1210 identifies which of the model variables of the model analytics are input variable (s) for a particular solve, and which of the model variables are output model variable(s) for a particular solve (act 1301). If, for example, the input and output model variables are defined in FIG. 4 by the data-model binder component 410, even given a constant set of model variables, the identity of the input model variables and the output model variables may change from one solve operation to the next. Accordingly, the coordination of the solve operation may change from one solve operation to the next. For example, even given a constant set of model analytics, depending on the input model variables, a forward solve may be sufficient for one solve operation, an inversion and a forward solve of the inverted analytics may be sufficient for another solve operation, and perhaps a numeric solve may be sufficient for yet another solve operation.

However, if implemented in the context of the analytics portion 220 of the pipeline 201, even the model analytics may change as the model analytics are formulated or perhaps combined with other model analytics as previously described. The solver environment 1200 may account for these changes by identifying the input and output model variables whenever there is a change, by accounting for any changed model analytics, and solving appropriately.

For each solve, once the input and output model variables are identified (act 1301), the solver coordination module 1210 determines whether or not a forward solve of the output parameter(s) is to be performed given the input model variables (s) without first inverting the model analytics (decision block 1302). If a forward solve is to be performed (Yes in decision block 1302), the forward solver 1221 is made to forward solve the model analytics (act 1303). This forward solve may be of the entire model analytics, or of only a portion of the model analytics. In the latter case, the method 1300 may be executed once again, only this time with a more complete set of input model variables that include the model variables solved for in the forward solve.

If it is determined that the forward solve of the output parameter(s) is not to be performed for the particular solve at least not without first inverting the model analytics (No in decision block 1302), it is then determined whether or not the model analytics is to be inverted for the particular solve such that a forward solve may solve for the output parameter(s) (decision block 1304). If the model analytics (or at least a portion of the model analytics) is to be inverted (Yes in decision block 1304), the model analytics is inverted by the symbolic solver (act 1305). Thereafter, the inverted model analytics may be solved for using a forward solve (act 1303). Once again, if only a portion of the model analytics was solved for in this way, the method 1300 may be executed again, but with an expanded set of input model variables.

If it is determined that the model analytics are not to be inverted for the particular solve (No in decision block 1304), then the numeric solver may solve for the output variable(s) using numeric methods (act 1306). Once again, if only a portion of the model analytics was solved for in this way, the method 1300 may be executed again, but with an expanded set of input model variables.

Accordingly, a flexible solver environment 1300 has been described in which a wide variety of model analytics may be solved for regardless of which model variables are input and which model variables are output from one solve operation to the next.

Figure 14:
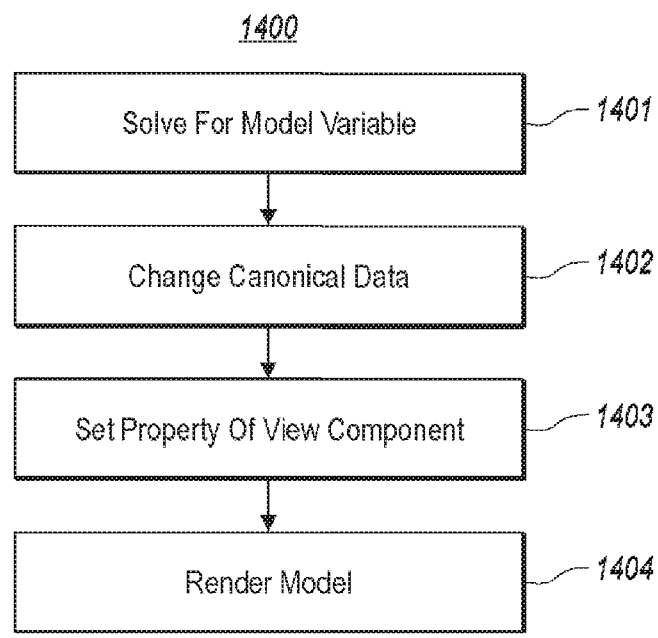
FIG. 14 illustrates a flowchart of a method for using the solver environment of FIG. 10 to solve for a model variable.

FIG. 14 illustrates a flowchart of another method 1400 that may be performed by the solver framework 1001 shown in FIG. 10. In particular, a solver solves for a model variable (act 1401), which may define a property of a view component of a view composition. For example, the solver may use a known model variable to solve for an unknown model variable. In some instances, the known model variable may be an output provided by another solver, such as when the solvers form part of a relational structure, such as a dependency tree, mentioned above with respect to FIGS. 10 and 11.

The solve operation causes an actual change in the canonical data (act 1402). After the solver solves for the model variable, a property of a view component of the view composition is then set to the value of the solved model variable (act 1403). For example, the solved model variable may be provided as part of the model parameters 411 shown in FIG. 5, which may be bound to an input parameter 542 of a first view component 520. In some instances, a known model variable that was used to solve for the solved model variable may define another property of the first view component 520. In such instances, the known model variable and solved model variable may be bound to various input parameters 542 of the first view component 520. In other instances, the known model variable may define a property of a second view component 520, such as when the first view component is a child or a parent of the second view component. In these other instances, the solved model variable may be bound to an input parameter 542 of the first view component 520, while the known model variable may be bound to an input parameter 542 of the second view component 520.

After the property of the view component is set to the value of the solved model variable, the view composition including the view component is then rendered (act 1404).

Figure 15:
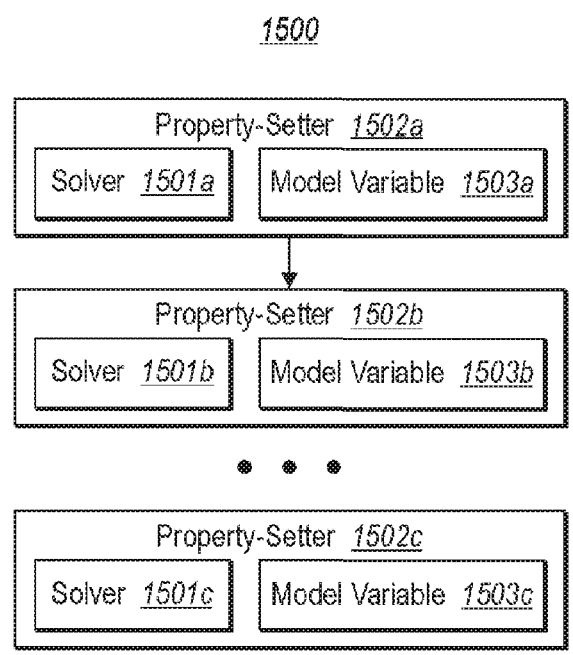
FIG. 15 schematically illustrates an embodiment of a solver environment.

If desired, a variety of environments may be used in connection with the method 1400. For example, FIG. 15 illustrates an environment 1500 that may be used in connection with the method 1400 and may be implemented in software, hardware, or a combination. In particular, the environment 1500 may include one or more solvers 1501*a*, 1501*b*, 1501*c*, which may form part of and/or be invoked by a property-setter 1502*a*, 1502*b*, 1502*c*. The solvers 1501 may be configured to solve for an unknown model variable (act 1401 of FIG. 14), for instance, by using a known model variable to solve for the unknown model variable. In addition, the property-setters 1502 may set a property of a view component to the value of the solved model variable (act 1403 of FIG. 14). The property-setters 1502, however, need not include a solver 1501 and may simply receive a known model variable and then set the property of the view component to the value of the received model variable.

Figure 16:
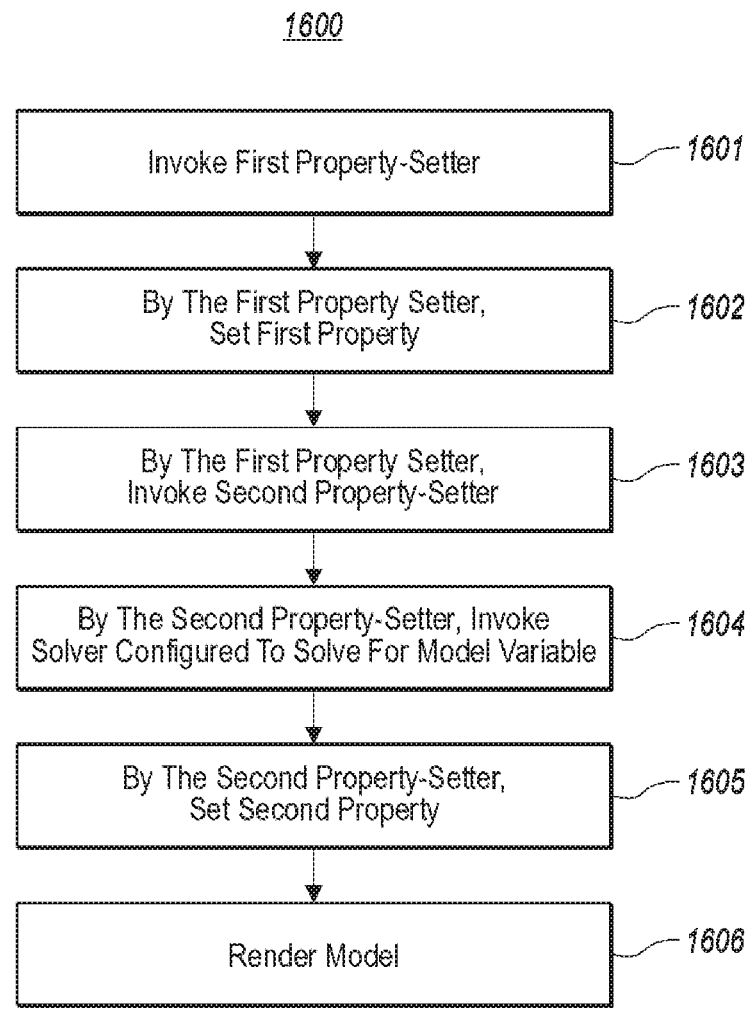
FIG. 16 illustrates a flowchart of a method that may be performed by the solver environment shown in FIG. 15.

FIG. 16 illustrates a flowchart of another method 1600 that may be performed by the environment 1500 shown in FIG. 15. In further detail, a first property-setter 1502*a* of the environment 1500 is invoked (act 1601). The first property-setter 1502*a* and the other property-setters 1502 may be invoked by and/or form part of the model-view binding component 510 shown in FIG. 5, if desired.

After being invoked, the first property-setter 1502*a* sets a first property of a view component of a view composition (act 1602). For example, the first property-setter 1502*a* may set the first property to the value of the model variable 1503*a*. In some instances, the first property-setter 1502*a* may simply receive a known model variable 1503*a* and then set the first property to the value of the received model variable. In other instances, the first property-setter 1502*a* may invoke a solver 1501*a*, which may solve for the model variable 1503*a*, and then may set the first property to the value of the solved model variable.

In addition to setting the first property, the first property-setter 1502*a* also invokes a second property-setter 1502*b* (act 1603). The second property-setter 1502*b* then invokes a solver, such as the solver 1501*b*, that may be configured to solve for a model variable (act 1604). In particular, as shown in FIG. 15, the solver 1501*b* may be invoked by and/or form part of the second property-setter 1502*b*, and when invoked, the solver 1501*b* may solve for an unknown model variable 1503*b*. In some instances, the solver 1501*b* may solve for an unknown model variable 1503*b* by using a known model variable, for instance, the model variable 1503*a*. For example, when the first property-setter 1502*a* invokes the second property-setter 1502*b* (act 1603), the first property-setter 1502*a* could pass the model variable 1503*a* to the second property-setter 1502*b*. The solver 1501*b* could then solve for an unknown model variable 1503*b* by using the model variable 1503*a*. Of course, the first property-setter 1502*a* need not pass the model variable 1503*a* to the second property-setter 1502*b*, which could access the model variable 1503*a* in any other suitable fashion.

The second property-setter 1502*b* then sets a second property of a view component of a view composition (act 1605), for instance, to the value of the solved model variable 1503*b*. Of course, in some instances, the second property-setter 1502*b* may simply receive a known model variable 1503*b*, and the second property-setter may then set the second property to the value of the received model variable. Accordingly, the second property-setter 1502*b* need not invoke a solver (act 1604). After the second property-setter 1502*b* sets the second property, the view composition including the view component is then rendered (act 1606).

In some instances, the first property and the second property may be properties of a single view component of the view composition. Accordingly, the property-setters 1502*a*, 1502*b* of the single view component may set the first and second properties (acts 1602, 1605) to the values of the model variables 1503*a*, 1503*b*, thus allowing the model variables 1503*a*, 1503*b* to define the first and second properties.

In other instances, the first property may be a property of a first view component, and the second property may be a property of a second view component. Accordingly, the property-setter 1502*a* of the first view component may set the first property (act 1602) to the value of the model variable 1503*a*, thus allowing the model variable 1503*a* to define the first property. In addition, the property-setter 1502*b* of the second view component may set the second property (act 1605) to the value of the model variable 1503*b*, thus allowing the model variable 1503*b* to define the second property. If desired, the first view component may be a child or a parent of the second view component, and the second view component may be a child or a parent of the first view component.

Thus, as shown above with respect to FIG. 11, a plurality of solvers may be composed an explicit order (act 1107) and then solved according to the order (act 1108). For example, the solvers may be explicitly composed using a relational structure, such as a dependency tree. In addition, as shown with respect to FIGS. 14 through 16, a plurality of solvers may be implicitly composed based on the ability of property-setters 1502 having solvers 1501 to invoke other property-setters 1502 having solvers 1501.

Composite View Composition

Referring to FIG. 2, the pipeline environment 200 also includes a model importation mechanism 241 that is perhaps included as part of the authoring mechanism 240. The model importation mechanism 241 provides a user interface or other assistance to the author to allow the author to import at least a portion of a pre-existing analytics-driven model into the current analytics-driven model that the user is constructing. Accordingly, the author need not always begin from scratch when authoring a new analytics model. The importation may be of an entire analytics-driven model, or perhaps a portion of the model. For instance, the importation may cause one or more or all of the following six potential effects.

As a first potential effect of the importation, additional model input data may be added to the pipeline. For instance, referring to FIG. 2, additional data might be added to the input data 211, the analytics data 221 and/or the view data 231. The additional model input data might also include additional connectors being added to the data access component 310 of FIG. 3, or perhaps different canonicalization components 330.

As a second potential effect of the importation, there may be additional or modified bindings between the model input data and the model parameters. For instance, referring to FIG. 4, the data-model binder 410 may cause additional bindings to occur between the canonicalized data 401 and the model parameters 411. This may cause an increase in the number of known model parameters.

As a third potential effect of the importation, there may be additional model parameters to generate a supplemental set of model parameters. For instance, referring to FIG. 4, the model parameters 411 may be augmented due to the importation of the analytical behaviors of the imported model.

As a fourth potential effect of the importation, there may be additional analytical relationships (such as equations, rules and constraints) added to the model. The additional input data resulting from the first potential effect, the additional bindings resulting for the second potential effect, the additional model parameters resulting from the third potential effect, and the additional analytical relationships resulting from the fourth effect. Any one of more of these additional items may be viewed as additional data that affects the view composition. Furthermore, any one or more of these effects could change the behavior of the solvers 440 of FIG. 4.

As a fifth potential effect of the importation, there may be additional or different bindings between the model parameters and the input parameters of the view. For instance, referring to FIG. 5, the model-view binding component 510 binds a potentially augmented set of model parameters 411 to a potentially augmented set of view components in the view component repository 520.

As a sixth potential effect of the importation, there may be additional parameterized view components added to the view component repository 520 of FIG. 5, resulting in perhaps new view items being added to the view composition.

Accordingly, by importing all or a portion of another model, the data associated with that model is imported. Since the view composition is data-driven, this means that the imported portions of the model are incorporated immediately into the current view composition.

When the portion of the pre-existing analytics-driven analytics model is imported, a change in data supplied to the pipeline 201 occurs, thereby causing the pipeline 201 to immediately, or in response to some other event, cause a regeneration of the view composition. Thus, upon what is essentially a copy and paste operation from an existing model, that resulting composite model might be immediately viewable on the display due to a resolve operation.

As an example of how useful this feature might be, consider the Feng Shui room view composition of FIG. 7. The author of this application may be a Feng Shui expert, and might want to just start from a standard room layout view composition model. Accordingly, by importing a pre-existing room layout model, the Feng Shui expert is now relatively quickly, if not instantly, able to see the room layout 701 show up on the display shown in FIG. 7. Not only that, but now the furniture and room item catalog that normally might come with the standard room layout view composition model, has now become available to the Feng Shui application of FIG. 7.

Now, the Feng Shui expert might want to import a basic pie chart element as a foundation for building the Feng Shui chart element 702. Now, however, the Feng Shui expert might specify specific fixed input parameters for the chart element including perhaps that there are 8 wedges total, and perhaps a background image and a title for each wedge. Now the Feng Shui expert need only specify the analytical relationships specifying how the model parameters are interrelated. Specifically, the color, position, and type of furniture or other room item might have an effect on a particular Feng Shui score. The expert can simply write down those relationships, to thereby analytically interconnect the room layout 601 and the Feng Shui score. This type of collaborative ability to build on the work of others may generate a tremendous wave of creativity in creating applications that solve problems and permit visual analysis. This especially contrasts with systems that might allow a user to visually program a one-way data flow using a fixed dependency graph. Those systems can do one-way solves, the way originally programmed from input to output. The principles described herein allow solves in multiple ways, depending on what is known and what is unknown at any time given the interactive session with the user.

Visual Interaction

The view composition process has been described until this point as being a single view composition being rendered at a time. For instance, FIG. 7 illustrates a single view composition generated from a set of input data. However, the principles described herein can be extended to an example in which there is an integrated view composition that includes multiple constituent view compositions. This might be helpful in a number of different circumstances.

For example, given a single set of input data, when the solver mechanism is solving for output model variables, there might be multiple possible solutions. The constituent view compositions might each represent one of multiple possible solutions, where another constituent view composition might represent another possible solution.

In another example, a user simply might want to retain a previous view composition that was generated using a particular set of input data, and then modify the input data to try a new scenario to thereby generate a new view composition. The user might then want to retain also that second view composition, and try a third possible scenario by altering the input data once again. The user could then view the three scenarios at the same time, perhaps through a side-by-side comparison, to obtain information that might otherwise be difficult to obtain by just looking at one view composition at a time.

Figure 17:
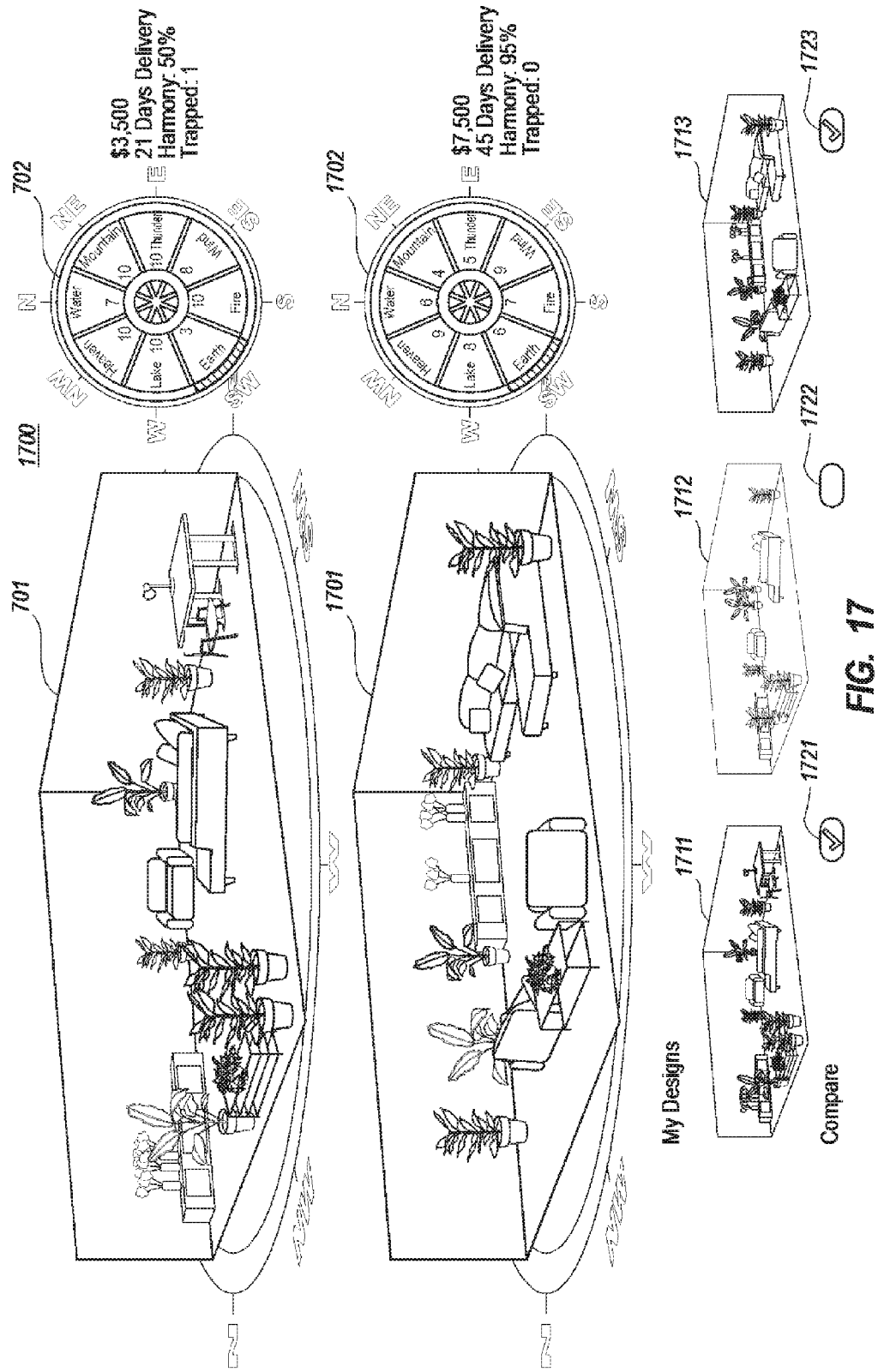
FIG. 17 illustrates a rendering of an integrated view composition that extends the example of FIG. 7.

FIG. 17 illustrates an integrated view composition 1700 that extends from the Feng Shui example of FIG. 7. In the integrated view composition, the first view composition 700 of FIG. 7 is represented once again using elements 701 and 702, exactly as shown in FIG. 7. However, here, there is a second view composition that is emphasized represented. The second view composition is similar to the first view composition in the there are two elements, a room display and a Feng Shui score meter. However, the input data for the second view composition was different than the input data for the first view composition. For instance, in this case, the position data for several of the items of furniture would be different thereby causing their position in the room layout 1701 of the second view composition to be different than that of the room layout 701 of the first view composition. However, the different position of the various furniture items correlates to different Feng Shui scores in the Feng Shui meter 1702 of the second view composition as compared to the Feng Shui meter 702 of the first view composition.

The integrated view composition may also include a comparison element that visually represents a comparison of a value of at least one parameter across some of all of the previously created and presently displayed view compositions. For instance, in FIG. 13, there might be a bar graph showing perhaps the cost and delivery time for each of the displayed view compositions. Such a comparison element might be an additional view component in the view component repository 520. Perhaps that comparison view element might only be rendered if there are multiple view compositions being displayed. In that case, the comparison view composition input parameters may be mapped to the model parameters for different solving iterations of the model. For instance, the comparison view composition input parameters might be mapped to the cost parameter that was generated for both of the generations of the first and second view compositions of FIG. 17, and mapped to the delivery parameter that was generated for both of the generations of the first and second view compositions.

Referring to FIG. 17, there is also a selection mechanism that allows the user to visually emphasize a selected subset of the total available previously constructed view compositions. The selection mechanism 1710 is illustrated as including three possible view constructions 1711, 1712 and 1713, that are illustrated in thumbnail form, or are illustrated in some other deemphasized manner. Each thumbnail view composition 1711 through 1713 includes a corresponding checkbox 1721 through 1723. The user might check the checkbox corresponding to any view composition that is to be visually emphasized. In this case, the checkboxes 1721 and 1723 are checked, thereby causing larger forms of the corresponding view constructions to be displayed.

The integrated view composition, or even any single view composition for that matter, may have a mechanism for a user to interact with the view composition to designate what model parameters should be treated as an unknown thereby triggering another solve by the analytical solver mechanism. For instance, in the room display 1701 of FIG. 17, one might right click on a particular item of furniture, right click on a particular parameter (e.g., position), and a drop down menu might appear allowing the user to designate that the parameter should be treated as unknown. The user might then right click on the harmony percentage (e.g., 95% in the Feng Shui score meter 1702), whereupon a slider might appear (or a text box of other user input mechanism) that allows the user to designate a different harmony percentage. Since this would result in the identity of the known and unknown parameters being changed, a re-solve would result, and the item of furniture whose position was designated as an unknown might appear in a new location.

Interaction Visual Cues

In one embodiment, the integrated view composition might also include a visual prompt or cue associated with a visual item. The visual cue gives some visual indication to the user that 1) the associated visual item may be interacted with, 2) what type of interaction is possible with that visual item, 3) what the result would be if a particular interaction is made with the visual item, and/or 4) whether interaction with one or more other visual items would be necessary in order to achieve the result.

As previously mentioned in reference to FIG. 5, the view portion 500 includes a view repository 520 that includes multiple view components 521, 522, 523, 524. Some of the view components 522, 523 and 524 are driven by the values populated within corresponding input parameters (parameters 542A and 542B for view component 522, parameter 543 for view component 523, and parameter 544 for view component 524). The data provided to the input parameter(s) drive the execution logic of the corresponding view component such that the data controls the construction of the visual item. For instance, the structure of the visual item 552 may depend on the data provided to the input parameter 542A and/or the input parameter 542B.

In one embodiment, one or more of the input parameters for a given view component may be an interactivity parameter. That interactivity parameter might define whether or not the visual item is to be rendered with interactivity. Alternatively, or in addition, the interactivity parameter might cause a particular type of interactivity to be applied to the corresponding visual item that is constructed as a result of executing the execution logic of the corresponding view component. A view component that contains at least one such interactivity parameter will be referred to hereinafter as a "visually cued interactive" view component. In addition to enabling the interactivity, the data provided to the interactivity parameter might also define how the corresponding visual item will be visually cued, when rendered, to visually inform the user 1) that the visual item is interactive and potentially also the type of interactivity. One, some or even all of the rendered visual items may be interactive and visually cued in this manner.

There are a number of different types of interactivity that may be offered by a visual item. One is referred to herein as navigation interactivity. When a user navigationally interacts with a visual item, a subset of the view components that are used to construct visual items for rendering changes.

For instance, one type of navigational interaction is referred to herein as a scoping interactivity. The scoping interactivity changes the subset of visual items that are rendered such that such that at least some of the visual items that were displayed just prior to the navigation interactivity are also displayed just after the navigation interactivity. For instance, referring to FIG. 5, the virtual space 500 is illustrated as including four visual items 551, 552, 553 and 554. If the visual item 552 has scoping interactivity, the user might interact with the visual item 552 such that visual items 551 and 554 are no longer in the virtual space 550 to be rendered. However, visual items 552 and 553 might remain in the virtual space 550. Alternatively or in addition, further visual items might be constructed into the visual space.

Figure 18A:
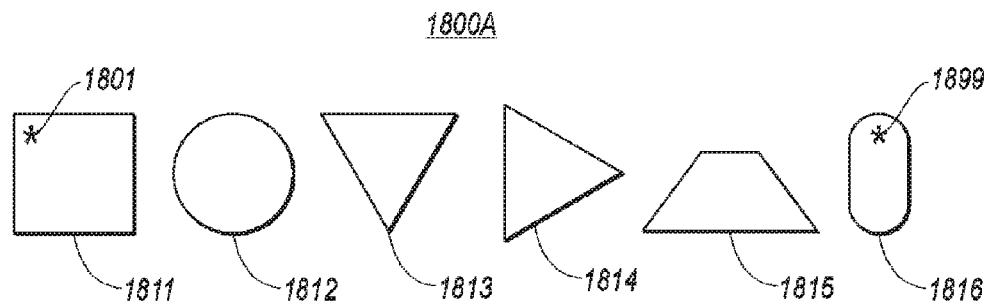
FIG. 18A illustrates a view composition in which several visual items are adorned with visual cues representing that the corresponding visual item may be interacted with the perform scrolling.
Figure 18B:
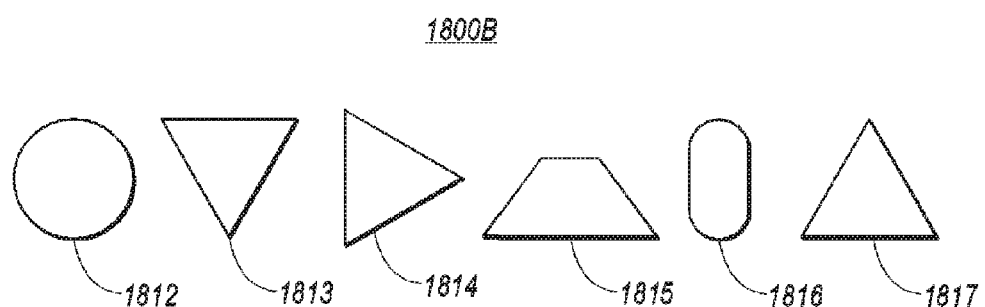
FIG. 18B illustrates the view composition of FIG. 18A after the scrolling interaction.

One type of scoping interactivity is a scrolling interactivity that changes a range of the view components that are used to generate visual items for rendering. FIGS. 18A and 18B represent an example of scrolling interactivity. FIG. 18A represents virtual space 1800A before the scrolling interactivity. Here, the view composition component (see FIG. 5) has constructed six visual items 1811, 1812, 1813, 1814, 1818 and 1816. Visual item 1811 is adorned with a visual cue (represented by the asterisk 1801) that indicates that the visual item has scroll left interactivity enabled. Visual item 1816 is adorned with a visual cue (represented by the asterisk 1899) that indicates that the visual item has scroll right interactivity enabled. FIG. 18B represents the virtual space 1800B after the user interacts with the visual item 1816 to scroll right. Here, the visual item 1811 is removed from the virtual space. In addition, a new visual item 1817 is added to the virtual space. In an example of edit interactivity, the scrolling interactivity in this case also caused the visual item 1812 to be adorned with a visual cue represented leftward scrolling interactivity is enabled. Furthermore, the visual item 1816 loses its visual cue and interactivity, which is provided instead to the visual item 1817. The visual cue and interactivity functionality may be enabled and disabled for a given visual item by simply changing data that is provided to populate input parameter(s) of the corresponding view component.

Another type of scoping interactivity is a "detailing interactivity" that changes a level of detail of the view components that are used to generate visual items for rendering. A "zoom-in" interactivity might cause more specific granularities of visual items to appear, with perhaps some of the previous visual items disappearing from view. A "zoom-out" interactivity might cause courser granularities of visual items to appear, with perhaps some of the prior more specific granularities of items to disappear. For instance, if zooming in on a map of the visible universe, clusters of galaxies may begin to appear. If one is to zoom in on that cluster of galaxies, individual galaxies might begin to take form. If zooming in on one of those individual galaxies, such as the Milky Way galaxy, individual stars may appear. If zooming in one of those stars, such as our sun, the detail of the sun may become more and more apparent, with perhaps planets beginning to appear. If one is to zoom in on one of those planets, such as the Earth, large-scale topographical features, such as the continents, may appear. If one is to zoom in further, country boundaries may appear, later towns may appears, then streets may take form. This may continue until sub-atomic particles take form. The coarseness of granularities in such zooming topographies need not be physically related, as in the model of the universe. One may navigate through other topographies as well with each scoping interactivity causing previous visual items to disappear and causing new visual items to appear. Once again, the use of a pseudo-infinite data series may facilitate this operation.

Figure 19A:
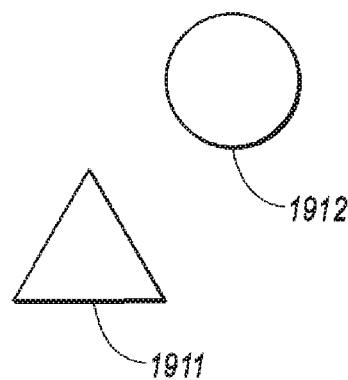
FIG. 19A illustrates a view composition in which zooming interactivity is enabled.
Figure 19B:
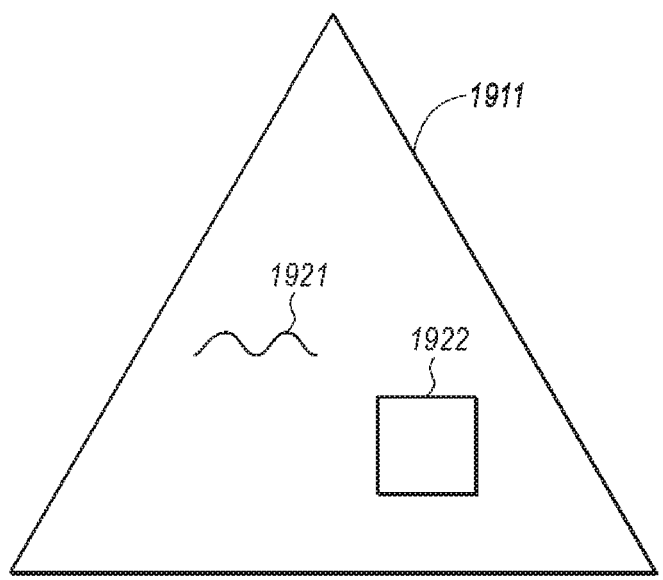
FIG. 19B illustrates the view composition of FIG. 19A after a zoom-in interactivity.

FIG. 19A illustrates an example virtual space 1900A before a particularly detailing interactivity operation. Here, there are only two visual items 1911 and 1912 begin displayed. As seen in the virtual space 1900B of FIG. 19B, the visual item 1911 is enlarged, and now some visual items 1921 and 1922 are rendered inside of the visual item 1911, and the visual item 1912 now falls outside of view. This is an example of a zoom-in interactivity. For an example of a zoom-out interactivity, one might begin with the virtual space 1900B of FIG. 19B, with the virtual space 1900A representing the state after the zoom-out interactivity.

The type of interactivity might also be a linking interactivity that causes at least one rendered frame (and perhaps the entire display) to display completely different visual items that were displayed before. For instance, in the Feng Shui room example above in FIG. 7, clicking on a particular visual item (such as the Feng Shui meter 702) might cause a web page about Feng Shui to be displayed in place of the Feng Shui room view. Alternatively, perhaps there is a visual item that if interacted with might cause a different room entirely to appear.

Yet another type of interactivity might be an external action interactivity that causes some action to be taken that is independent of the visual scene that is rendered. For instance, a visual item might be interacted with that might cause an e-mail to be sent, or set an alert, schedule a data backup, perform a performance check, and so forth.

The type of interactivity might also be an edit interactivity. An edit interactivity changes data in a manner that one or more input parameter values of one or more view components changes. If that input parameter affects how the a visual item is constructed, then the visual item changes as a results. A change in data may also cause a value of an input model parameter to change, or cause the identity of the input model parameters and/or output model parameters to change. Thus, an edit interactivity imposed on a visual item may cause an entire re-computation of the analytics portion 400. Several examples of edit interactivity will now be provided.

Figure 20:
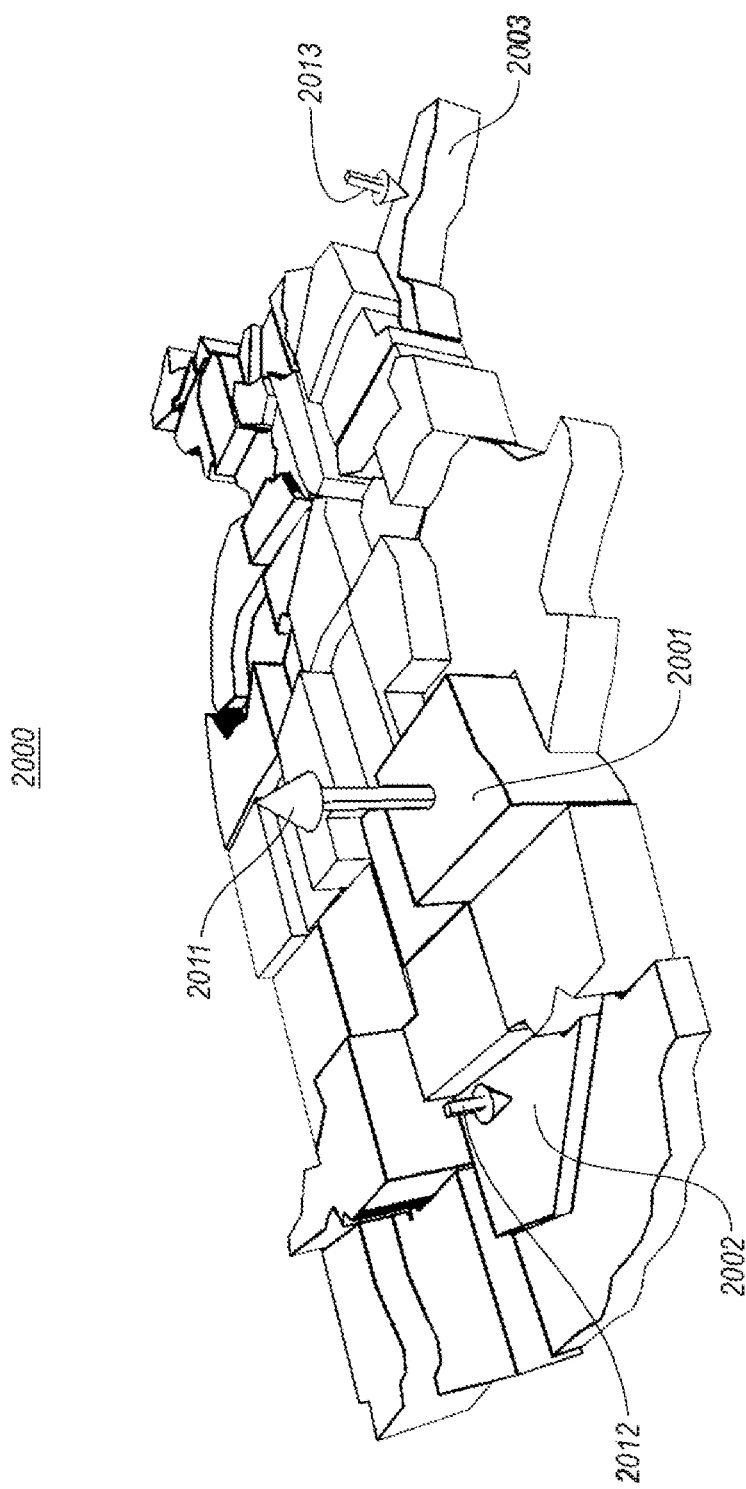
FIG. 20 illustrates a view composition in the form of a United States map with the elevation of each state representing data, and with some of the state visual items including visual cues indicating possibility interactivity with that state visual item.

FIG. 20 illustrates a rendering of the contiguous United States 2000. The United States visual item may be constructed from one view component. However, the constituent states may each be constructed from a corresponding child view component. The elevation of the visual item corresponding to that state represents some parameter of the state (e.g., consumption per capita of a particular product under evaluation). Here, the New Mexico visual item 2001 has a visual cue in the form of an upward facing arrow 2011. This prompts the user that the New Mexico visual item 2001 may be interacted with such that the height of the visual item may be altered. Also, the Nevada visual item 2002 and the Florida visual item 2003 having corresponding downward facing arrows 2012 and 2013 respectively. These arrows might visually cue the user that an upward adjustment in the height of the New Mexico arrow 2011 would, after reanalysis of the model through the analytics portion 400, cause a downward adjustment in the heights of the Nevada visual item 2002 and the Florida visual item 2003. Alternatively or in addition, arrows 2012 and 2013 could indicate that if both of the heights of the Nevada visual item 2002 and the Florida visual item 2003 are adjusted downwards by the user, then the height of the New Mexico visual item 2001 will be adjusted upwards. In order to determine the consequence of a particular user interaction, the pipeline 201 might consider how the user might interact with the rendered visual items, and perform a contingency solve of the analytical model to determine what the consequences would be.

Figure 21:
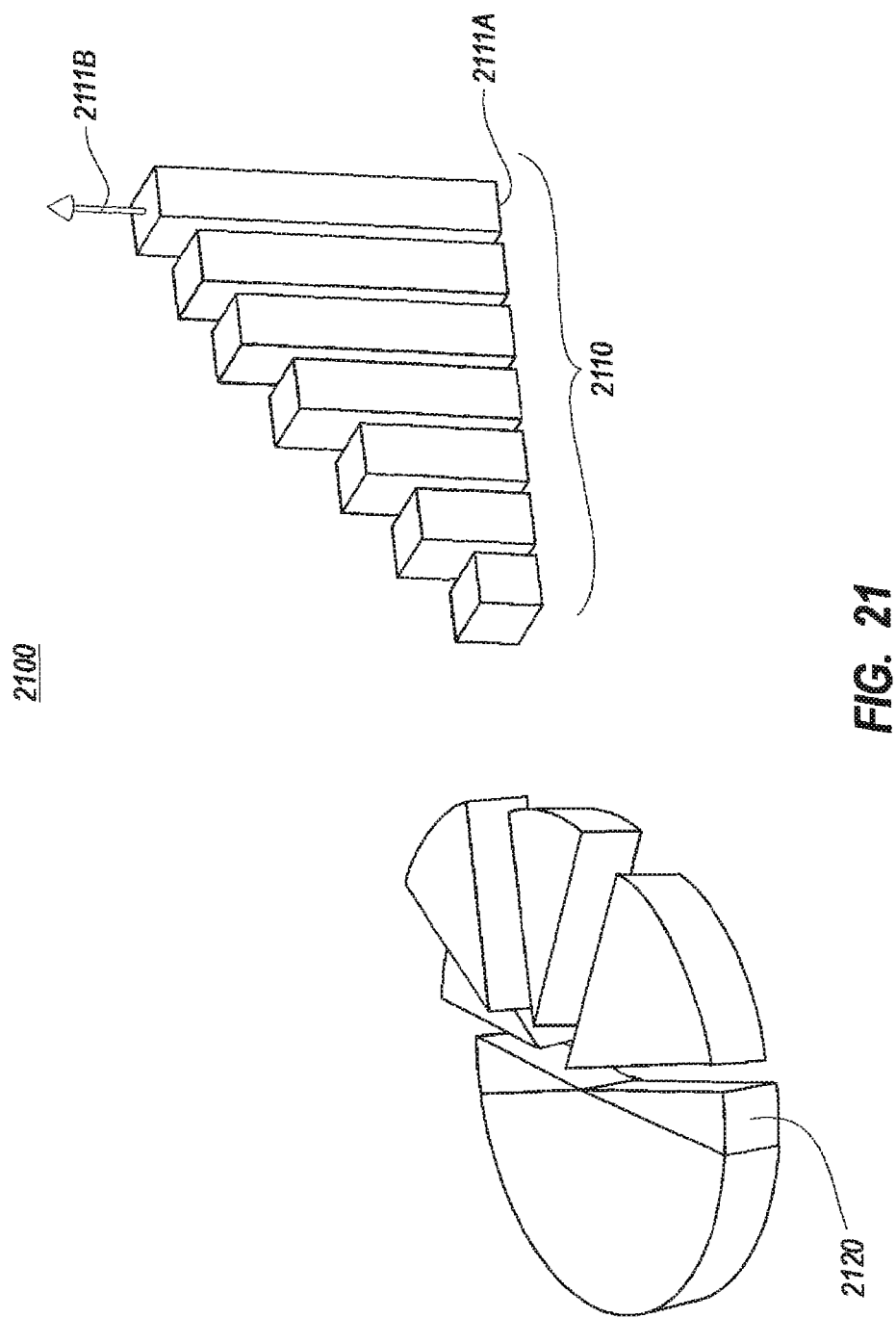
FIG. 21 illustrates a view composition in the form of a combined interrelated pie chart and bar chart that include visual cues showing possible interactivity.

FIG. 21 illustrates a chart 2100 that includes a related bar chart 2110 and pie chart 2120. The bar chart 2110 includes multiple bars. One of the bars 2111A is illustrated with an arrow 2111B to represent that this height may be adjusted vertically. This might cause some adjustment in allocations of the various wedges in the pie chart 2120. The bar chart 2110 and the pie chart 2120 may be visually merged. For instance, the resulting pie chart might include wedges whose thickness depend on the height of the associated bar of the bar chart.

Figure 22:
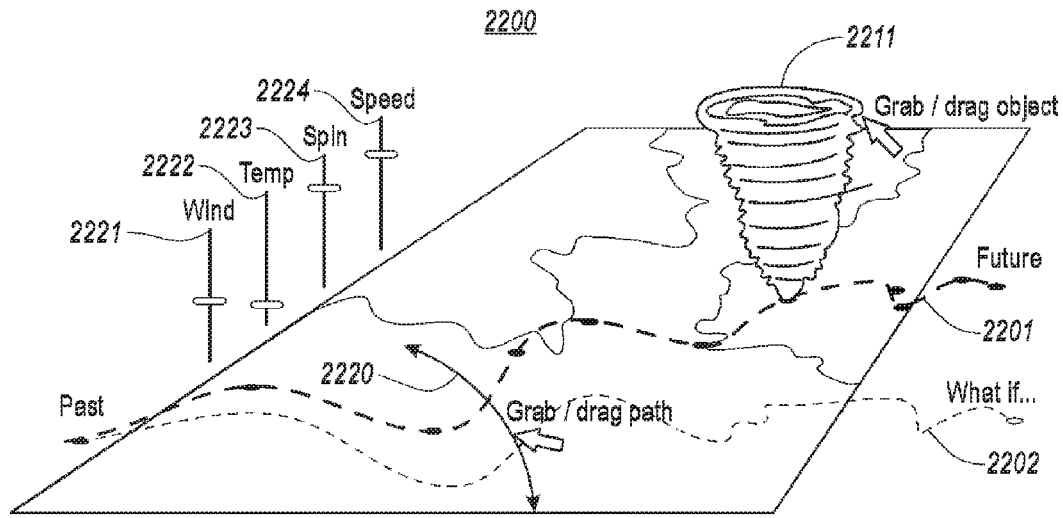
FIG. 22 illustrates a view composition in form of a hurricane path progress diagram in which various visual cues identify interactivity.

FIG. 22 illustrates a hurricane mapping chart 2200 in which several the path 2201 of a hurricane 2211 is being charted. A visual cue 2220 indicates that the user may interactive with the path 2201 so as to change the path 2101 to, for example, path 2202. This allows the user to evaluate possible alternative realities for the path of the hurricane. Controls

2221, 2222, 2223 and 2224 also allow various parameters of the hurricane to be altered such as, for example, wind speed, temperature, spin, and hurricane migration speed.

In the Feng Shui example of FIG. 7, if a particular harmony score is designated as a known input parameter, various positions of the furniture might be suggested for that item of furniture whose position was designated as an unknown. For instance, perhaps several arrows might emanate from the furniture suggesting a direction to move the furniture in order to obtain a higher harmony percentage, a different direction to move to maximize the water score, a different direction to move to maximum the water score, and so forth. The view component might also show shadows where the chair could be moved to increase a particular score. Thus, a user might use those visual prompts in order to improve the design around a particular parameter desired to be optimized. In another example, perhaps the user wants to reduce costs. The user might then designate the cost as an unknown to be minimized resulting in a different set of suggested furniture selections.

Figure 23:
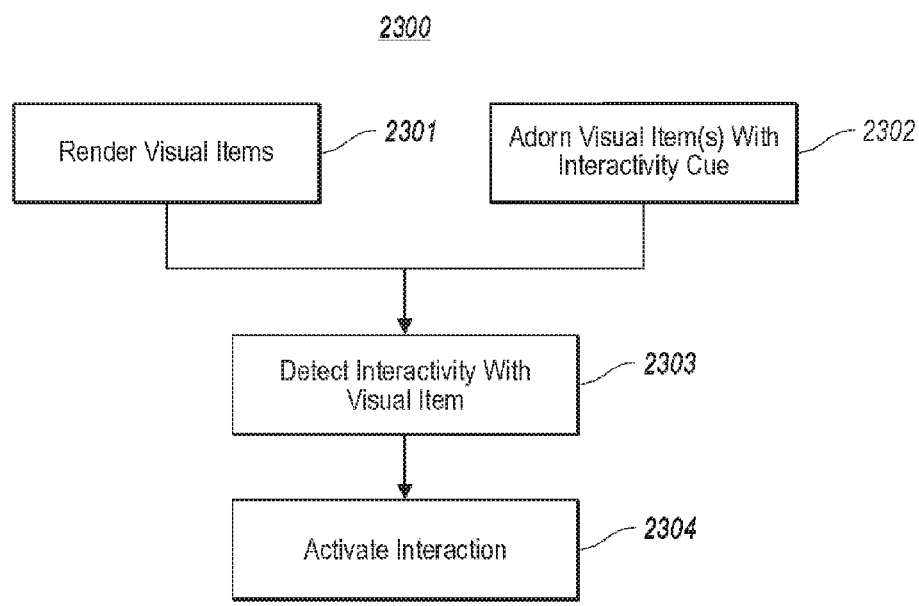
FIG. 23 illustrates a flowchart of a method for providing interactivity in a view composition.

FIG. 23 illustrates a flowchart of a method for interacting with a user interface that displays a plurality of visual items. The computer renders data-driven visual items on a display (act 2301) as previously described. Recall that each of the data-driven visual items are formulated by providing data to parameterized view components. That data, in turn, may have been obtained by the analytical model in response to data being provided to the analytics portion 400 of the pipeline 201, or in response to data being provided to the data portion 300 of the pipeline 201. In addition, one, some, or all of the visual items have a visual cue or other visual emphasis (act 2302) conveying to the user that there the visual item may be interacted with and/or the type of interactivity. In one embodiment, the visual cue initially only represents that the corresponding visual item is interactive, and it is not until the user selects the visual item (by hovering over the visual item with the pointer) that the visual cue is modified or supplemented to convey the type of interactivity.

The computing system then detects that a predetermined physical interaction between a user and the visual item has occurred (act 2303). In response, the interactivity is enabled or activated (act 2304) for that particular visual item. The appropriate response will depend on whether the interactivity is a navigation interactivity, a linking interactivity, or an edit interactivity. In the case of an edit interactivity, the result will also depend on the analytical relationship between the various visual items as defined by the analytics portion 400 of the pipeline.

The interactivity might be a combination of two or more of navigation, linking, and editing interactivities. For instance, in the United States example of FIG. 20, an upward adjustment of the height of the New Mexico visual item 2001 might result in a downward adjustment of the heights of the Nevada visual item 2002 and the Florida visual item 2003 (representing an example of edit interactivity). However, this might also result in the display splitting into four frames, with three frames each zooming in one the three states Nevada, New Mexico and Florida (an example of scoping interactivity). In addition, the fourth frame might contain survey information regarding consumption preferences of the residence of New Mexico (an example of linking interactivity).

Figure 24:
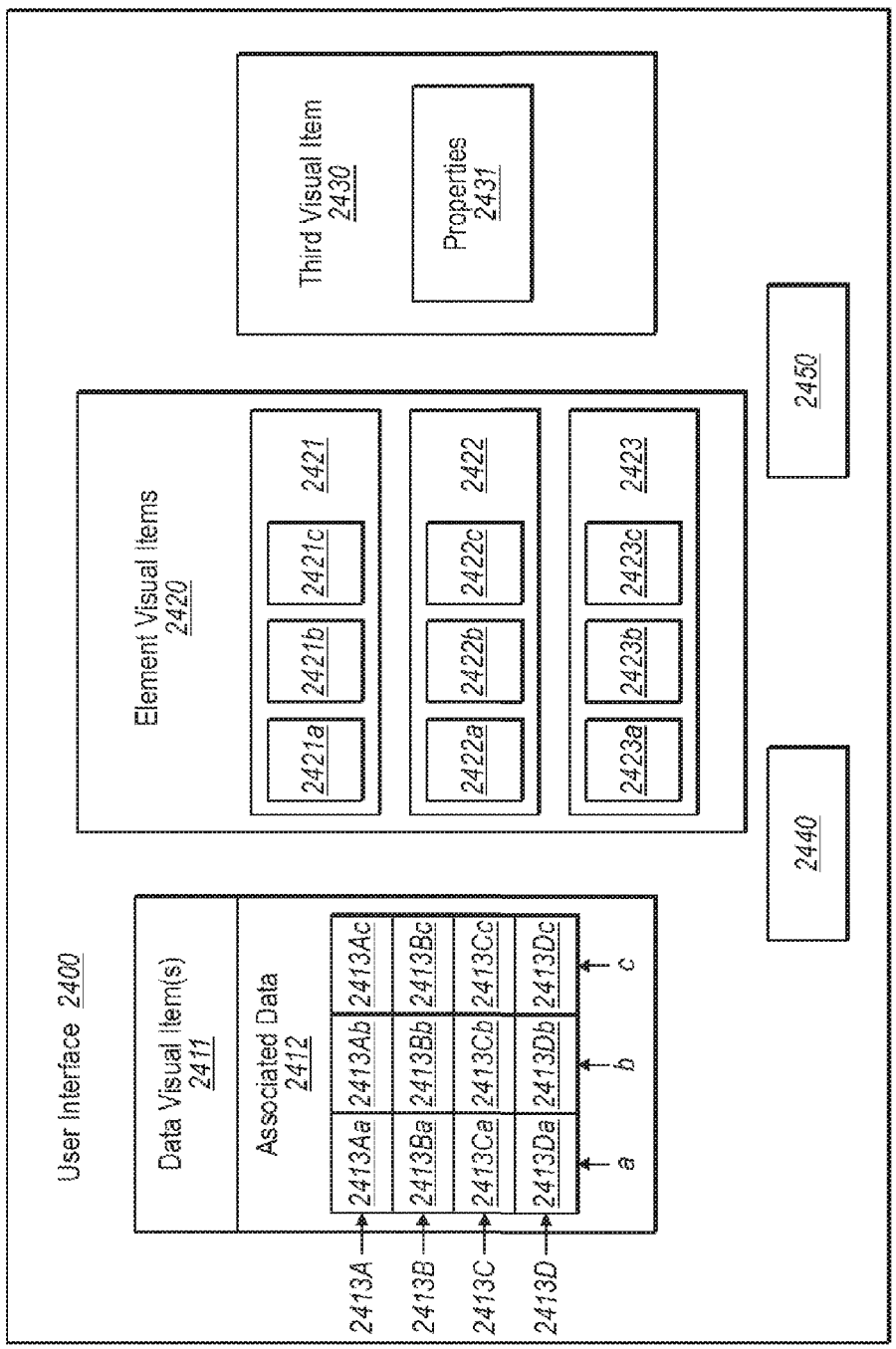
FIG. 24 illustrates a user interface in which various visual items may be integrated and merged.

FIG. 24 abstractly illustrates a user interface 2400 that represents another application example. In this application example, a convenient user interface is described that allows a user to easily construct data-driven visual scenes using the principles described herein.

The user interface 2400 includes a first set 2411 of visual item(s). In this illustrated case the set 2411 includes but a single visual item 2411. However, the principles described herein are not limited to just one visual item within the visual item set 2411. The visual item(s) 2411 have associated data 2412, and thus will sometimes be referred to herein as "data visual item(s)" 2411.

Although not required, in this example, the associated data is subdivided into multiple data groups. Any number of groups will suffice. However, four data groups 2413A, 2413B, 2413C and 2413D are illustrated as being included within the associated data 2412 of FIG. 24. In the illustrated associated data 2412, each of the data groups is organized in parallel with each having associated multiple data fields. In the illustrated case, each of the data groups in the illustrated associated data 2412 includes corresponding fields a, b and c. Fields a, b, and c of data group 2413A will hereinafter be referred to as data fields 2413Aa, 2413Ab and 2413Ac, respectively. Fields a, b, and c of data group 2413B will hereinafter be referred to as data fields 2413Ba, 2413Bb and 2413Bc, respectively. Fields a, b, and c of data group 2413C will hereinafter be referred to as data fields 2413Ca, 2413Cb and 2413Cc, respectively. Finally, fields a, b, and c of data group 2413D will hereinafter be referred to as data fields 2413Da, 2413Db and 2413Dc, respectively.

The user interface 2400 also includes a second set 2420 of visual items. In the illustrated case, the set 2420 includes three corresponding visual items 2421, 2422 and 2423. However, there is not a limit to the number of visual items in the second set 2420, nor is there any requirement that the visual items in the second set be of the same type. Hereinafter, the visual items 2421, 2422, and 2423 may also be referred to as "element visual items". Each visual item 2421, 2422 and 2423 may be, for example, constructed by executing corresponding logic of a respective view component using input parameters. Such view components may be similar to those described with respect to FIG. 5 for the view components 521 through 524. Thus, each of the visual items 2421, 2422 and 2423 is illustrated as having input parameters. Such input parameters may be the input parameters provided to the view component, or might be some other input parameter that drives the rendering of the visual item. As an example only, each of the visual items 2421, 2422 and 2423 are illustrated as each having three input parameters. Specifically, visual item 2421 is illustrated as having input parameters 2421a, 2421b and 2421c. Visual item 2422 is illustrated as having input parameters 2422a, 2422b and 2422c. Visual item 2423 is illustrated as having input parameters 2423a, 2423b and 2423c.

The user interface 2400 also includes a user interaction mechanism 2440. The user interaction mechanism 2440 permits the user (through one or more user gestures) to cause the data 2412 of the data visual item(s) 2411 to be applied to the input parameters of the element visual items 2420. In one embodiment, the user gesture(s) may actually cause the associated data to be bound to the input parameters of the elements visual items 2420. Such user gestures might be a drag or drop operation, a hover operation, a drag and click, or any other user gesture or combination of gestures. Thus, a user may apply or bind data from the data visual item(s) 2410 to the input parameters of the element visual items, thereby changing the appearance of the element visual items, using simple gestures. In one embodiment, this does not even involve a user typing in any of the associated data, and allows a single set of gestures to apply and/or bind data to multiple element visual items. Examples of the user of user gestures to apply or bind data from one data visual item to multiple element visual items will be described further below.

In one embodiment, the user interaction mechanism 2440 permits the user to apply the data 2412 from the data visual item 2411 to the input parameters of the element visual items 2420 on a per data group bases such that 1) one data group of each of the data groups is applied to the set of one or more input parameters for a distinct visual item of the second plurality of visual items, and 2) a single field of the same type from each data group of the plurality of data groups is applied to an input parameter of the set of one or more input parameters for a distinct visual item of the element visual items.

As an example, referring to FIG. 24, the user might use a single set of gestures to simultaneously apply or bind the data field 2413Aa of the data visual item(s) 2411 to input parameter 2421*b* of the element visual item 2421, the data field 2413Ba of the data visual item(s) 2411 to input parameter 2422*b* of the element visual item 2422, and data field 2413Ca of the data visual item(s) 2411 to input parameter 2423*b* of the element visual item 2423. If there were a fourth element visual item, the data field 2413Da could have been applied to the corresponding input parameter for the fourth element visual item.

As a result of this same set of gestures, or perhaps in response to additional sets of gestures, further applications or binding may be made. For instance, in response to user gestures, the data field 2413Ab of the data visual item(s) 2411 could be applied or bound to input parameter 2421*a* of the element visual item 2421, the data field 2413Bb of the data visual item(s) 2411 could be applied or bound to input parameter 2422*a* of the element visual item 2422, and data field 2413Cb of the data visual item(s) 2411 could be applied or bound to input parameter 2423*a* of the element visual item 2423. Additionally, the data field 2413Ac of the data visual item(s) 2411 could be applied or bound to input parameter 2421*c* of the element visual item 2421, the data field 2413Bc of the data visual item(s) 2411 could be applied or bound to input parameter 2422*c* of the element visual item 2422, and data field 2413Cc of the data visual item(s) 2411 could be applied or bound to input parameter 2423*c* of the element visual item 2423.

The user interface 2400 potentially also includes a third visual item 2430 having associated properties 2431. A second user interaction mechanism 2450 permits the user to use a set of gesture(s) to merge the second set of visual items 2420 into the third visual item 2430 such that 1) one or more input parameters of each the second offset 2420 visual items are set using the associated properties 2431 of the third visual item 2430 and/or 2) the properties 2431 of the third visual item 2430 are used to alter the one or more input parameters of each of the second set 2420 of visual items. The gestures used to accomplished this may be a drag and drop operation, a hover operation, or any other user gesture, and may have even been accomplished using, in whole or in part, the same user gestures that were used to apply the data from data visual item(s) 2410 to the element visual items 2420.

For example, if the user gesture(s) (i.e., the second set of gesture(s)) that are used to merge the second set 2420 of visual items and the third visual item 2430 at least partially overlap with the user gesture(s) (i.e., the first set of gesture(s)) that are used to apply or bind data from the data visual item(s) 2411 to the input parameters of the element visual items 2420, then there is at least one common gesture within both the first set of gesture(s) and the second set of gesture(s). However, this is not required at all. There may be, in fact, no common gesture(s) between the first set of gestures and the second set of gesture(s). Thus, distinct user action might be employed to apply data from the data visual item 2411 to the element visual items 2420 as compared to merging the element visual items 2420 with the visual item 2430.

In one embodiment, the data visual item(s) 2411 may each be similar to the visual items constructed in FIG. 5 using view construction modules 521 through 524 of FIG. 5. In that case, the associated data 2412 may be data provided to input parameter(s) of the corresponding view component. This associated data 2412 may even be surfaced as visual in the visual item itself allowing the user to have a view on the associated data. The visual item 2430 may also be similar to the visual item constructed using a view construction module 521 through 524. In that case, perhaps one or more of the properties 2431 of the visual item 2430 may be set using input parameters of the corresponding view component.

The application of the associated data 2412 of the data visual item(s) 2411 to the input parameters of the element visual items 2420 may cause an analytical model to resolve. For instance, FIG. 4 describes an analytics portion 400 of the pipeline 200. By applying the application of the associated data 2412, there might be data that needs to be recalculated in order to further repopulate the input parameters of the element visual items 2420. In addition, the merging of the element visual items 2420 with the third visual item 2430 might also cause a re-solve of the analytics portion 400 to thereby alter input parameters of the visual items 2420 or 2430.

Of course, FIG. 24 is an abstract representation of a user interface. A more concrete example of a user interface that permits a user to designate associated data of a data visual item(s) to be applied to element visual items, and that allows element visual items to be merged with another higher-level visual item will now be presented with respect to FIG. 25 through 29.

Figure 25:
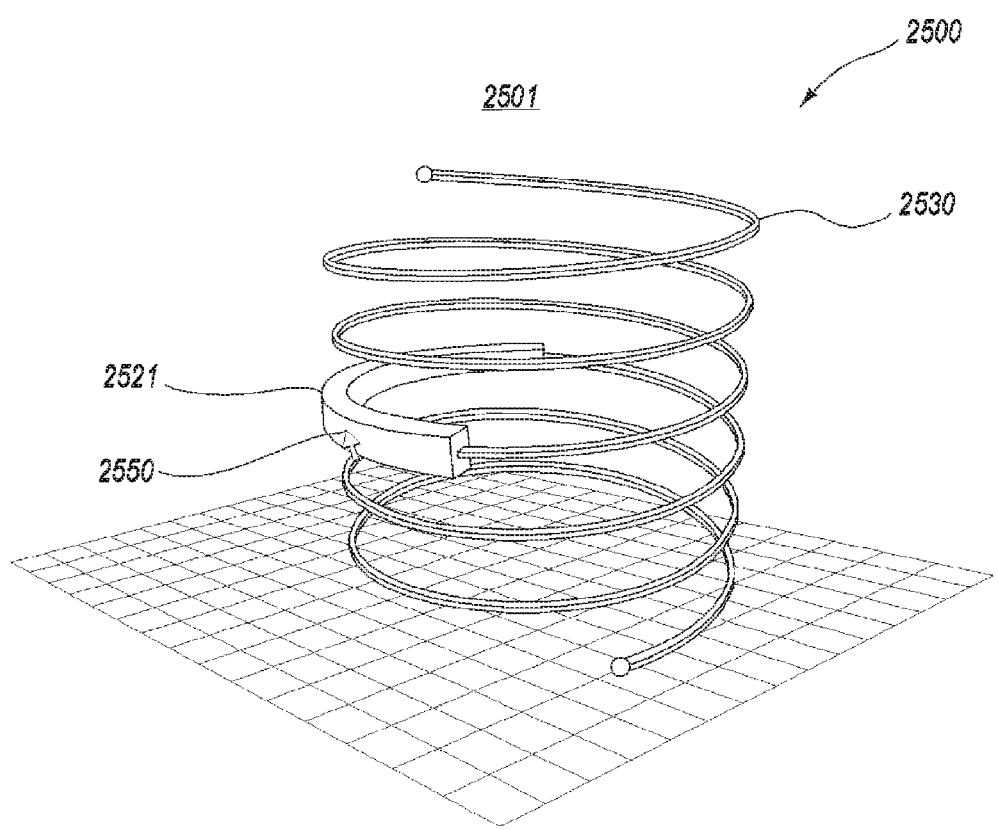
FIG. 25 illustrate a first stage in integration in which a mere helix is shown as a shape upon which data will be mapped.

FIG. 25 illustrates a user interface 2500 in which a helix 2530 is presented. The helix 2530 is a concrete example of the third visual item 2430. In this case, the properties of the helix 2530 (as an example of the properties 2431) might be the radius of curvature, the pitch (or angle of ascension), the color, the line thickness, the line cross-sectional profile, the winding length, the beginning angle, and so forth. Each of the properties might be, for example, input properties provided to a helix view composition element that has construction logic that, when executed, renders the helix. The helix shape type might be one of several shapes that may be dragged and dropped into the work surface 2501 of the user interface. The helix may have its input parameters populated with default values upon being dragged into the work surface, but may have those default values changed.

The user may have also dragged a separate cuboid object 2521 onto the work surface. The cuboid object 2521 is an example of an element visual object 2421 of FIG. 24. A cuboid object 2521 typically has six rectangular-shaped sides that are parallel or perpendicular to each other. Had the cuboid object 2521 been dragged into another part of the work surface other than on the helix 2530, then the cuboid object 2521 might have retained those fundamental cuboid characteristics. However, in this case, the user has gestured (perhaps through dragging the cuboid 2521 onto a portion of the helix 2530 using the pointer 2550) that the cuboid object 2521 and the helix 2530 are to be merged. In this case, the cubiod 2521 has its input parameters adjusted such that its central line follows the helix. This might also be a mechanism for defining a type of the element visual item (e.g., a cuboid in this case) that is to be merged with the helix visual item.

Figure 26:
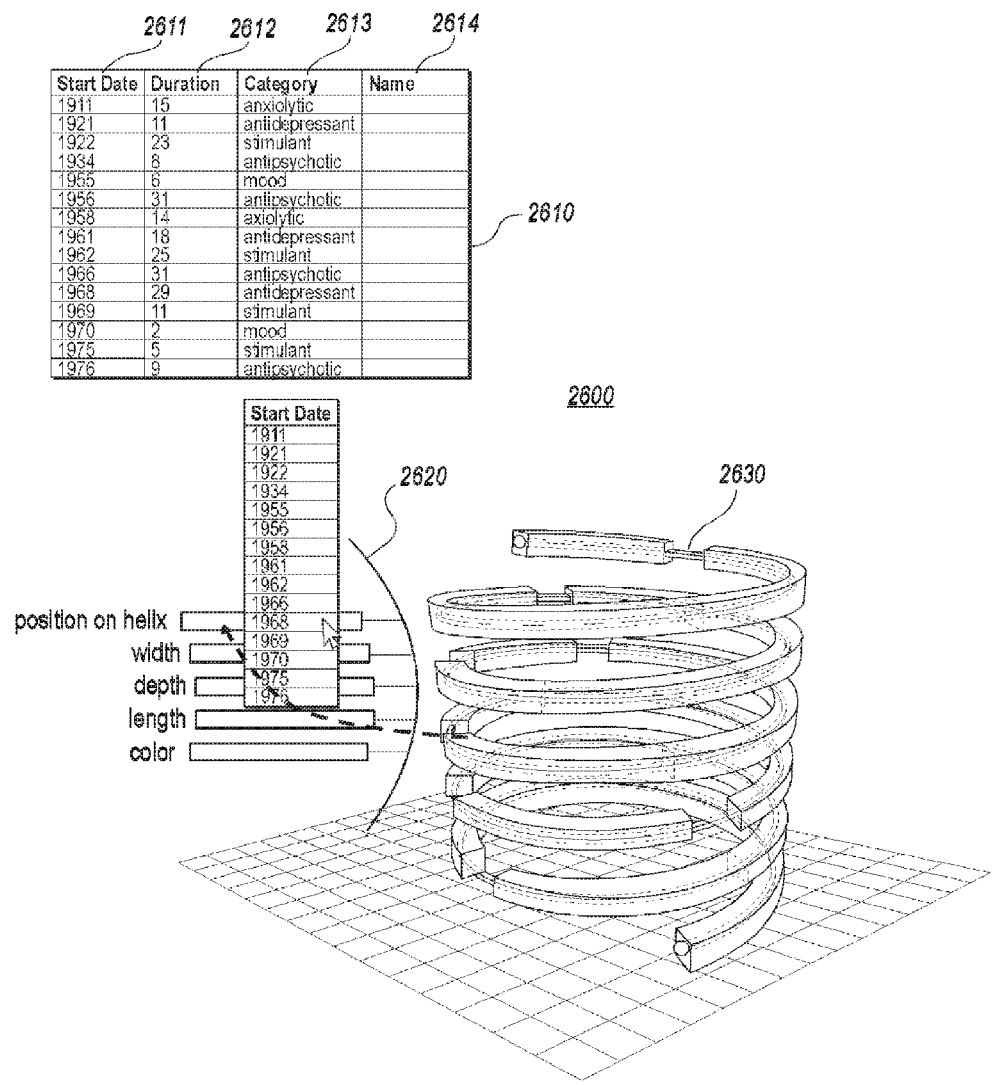
FIG. 26 illustrates a second stage in integration in which the helix of FIG. 25 is tied to a data series.

Given this merging operation, FIG. 26 illustrates another stage 2600 of this particular example of the user interface. Here, the user has acquired a data visual item 2610, in this case, perhaps a spreadsheet document. The spreadsheet document 2610 is an example of the data visual item 2411 of FIG. 24. This spreadsheet document contains a table listing various psychiatric drugs. The data is entirely fictional, but is provided to illustrate this example. The fourth column 2614 lists the name of the drug, one for each row, although in this case, the fields are blank simply because the data is fictional. The third column 2613 lists the category of the drug corresponding to each row. The first column 2611 lists the start date (in years) that the drug corresponding to each row was approved for prescription use. The second column 2612 lists the duration (in years) that the drug corresponding to each row was approved for use. The start date, the duration, the category and the name are examples of the fields of the data groups of the associated data 2412 of FIG. 24. The rows in the spreadsheet 2610 are examples of the data groups of the associated data 2412 of FIG. 24.

Here, an input parameters table 2620 appears to show the user what input parameters have been selected as being a target for population. The user has selected the first column 2611 (i.e., the Start Data field) to populate the "Position on Helix" input parameter. A cuboid visual item is generated for each data group (each row in the chart 2610). The preview 2630 shows the helix 2530, but with a preview of what the merged version of the multiple cuboid elements and the helix would look like.

Figure 27:
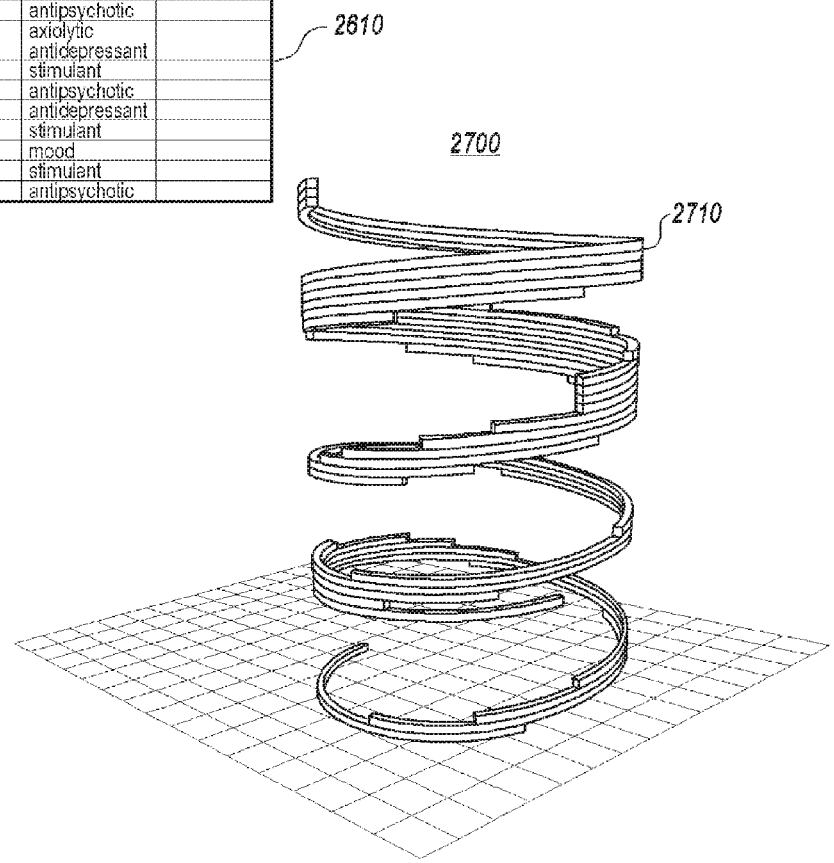
FIG. 27 illustrate a third stage in integration in which the helix of FIG. 25 is tied to two data series.

FIG. 27 shows the user interface 2700. Here, the user has selected that the various cuboids are not to be cropped, but are to be stacked one on top of the other with the helix (now invisible) serving as a base for the stack. The stacked cuboids 2710 represents an example of the elements visual items. Note that properties of the helix visual item have been inherited by the input parameters of each cuboid. In addition, the data from the data visual item 2610 have been inherited by each cuboid. For instance, each cuboid in the stack of cuboids was constructed using a position on the helix corresponding to the start date of the corresponding drug. The length of each cuboid is inherited by the duration of the corresponding drug. In addition, the cuboid inherits position properties and curvature properties from the helix.

Figure 28:
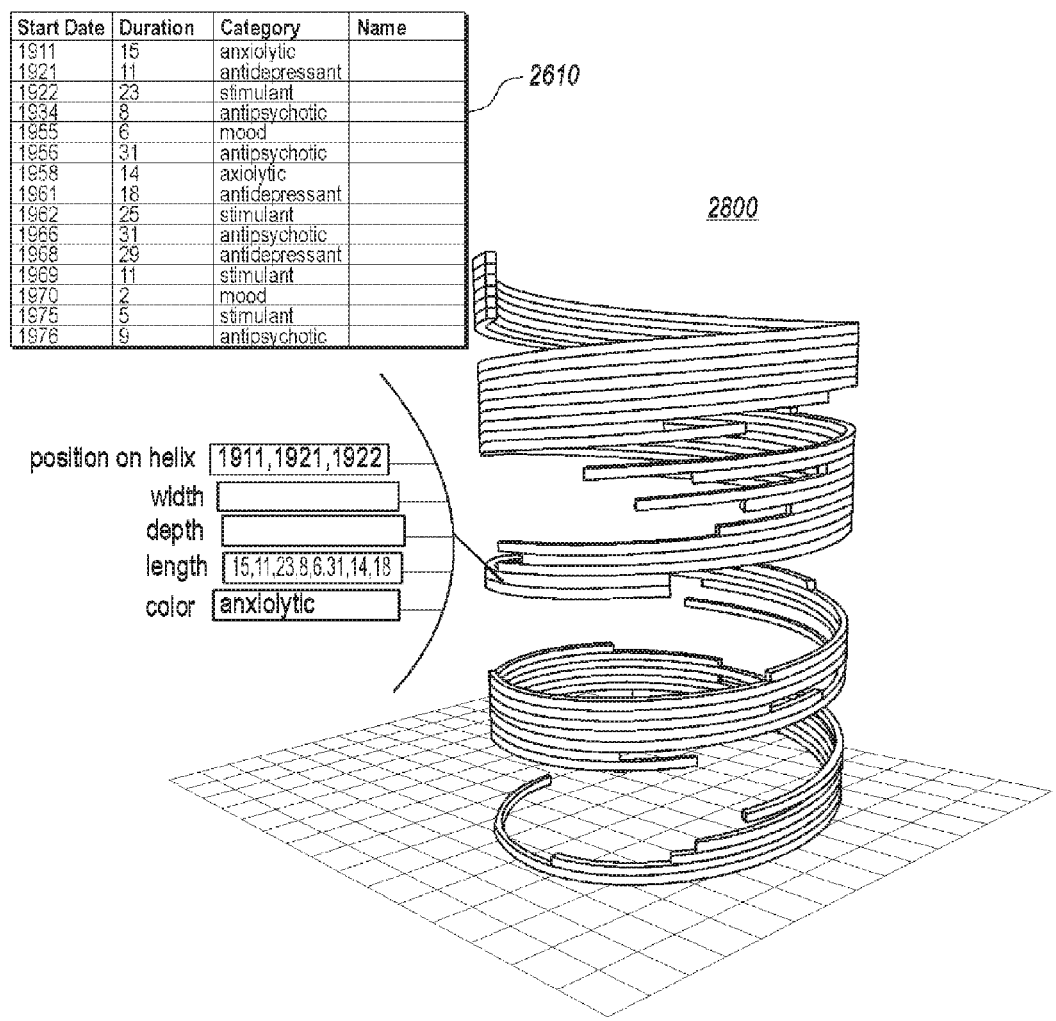
FIG. 28 illustrates a final stage in integration in which the helix of FIG. 25 is tied to the illustrated chart.

FIG. 28 shows the complete visual scene. In this user interface 2800, color may be assigned to each curved cuboid according to the category of the corresponding drug. Thus, the start date of the corresponding drug defines the beginning position of the curved cuboid in the helix. For instance, the user might have used the following gestures to apply the start date data from the spreadsheet visual item 2411 to the cuboid visual items: 1) select the first column of the spreadsheet, and 2) drag the column into the "Position on Helix" section of the input parameter table 2620. Furthermore, the duration of the corresponding drug defines the length of the curved cuboid in the helix. For instance, the user might have used the following gestures to apply the duration data from the spreadsheet visual item 2411 to the cuboid visual items: 1) select the first column of the spreadsheet, and 2) drag the column into the "Length" section of the input parameter table 2320. Finally, the category of the corresponding drug defines the color of the curved cuboid in the helix. The user might have used the following gestures to apply the category data from the spreadsheet visual item 2411 to the cuboid visual items: 1) select the first column of the spreadsheet, and 2) drag the column into the "Color" section of the input parameter table 2620. The user could drag and drop different fields of the spreadsheet into difference sections of the input parameter field to see what visual representation of the data is best given the circumstances.

Using these principles described herein, complex geometries may be constructed and composed with other visual elements and geometries. In order to understand the composition of geometries, four key concepts will first be described. The key concepts include 1) data series, 2) shapes, 3) dimension sets, and 4) geometries.

First, a data series will be described. A data series is a wrapper on data. An example of a data series object was illustrated and described with respect to FIG. 6. A data series object is not the data itself. However, the data series knows how to enumerate the data. For instance, referring to FIG. 6, the enumeration module 601 enumerates the data series corresponding to the data stream object. In addition, the data series has attributes that declare: the range, quantization, and resolution of the plot. Examples of data types that may be wrapped by the data series include a table column, repeating rows in a table, a hierarchy, a dimensional hierarchy, and so forth.

A shape can be a canonical visual item constructed from a canonical view composition. Examples of such canonical visual items include, for example, a point, bar, prism, bubble, a surface patch, am image file, a 2 dimensional, or 3 dimensional shape, and so forth. However, the shape may be a canonical construction from data. Examples, of such a canonical construction from data include a label. Alternatively, a shape might be the result of populating a geometry (the term geometry is to be described further hereinbelow) with a data series and shapes.

Canonical shapes carry metadata that potentially allows a geometry's "binder-arranger" (described below) to be parameterized to handle multiple shapes. The metadata also provides hints for "layout helpers" also described below. The metadata denotes aspects of the shape such as whether the shape is rectilinear or curvilinear, whether the shape is planar or volume occupying, whether the shape is symmetrical about some dimension, whether the shape needs to be read in the textual sense (e.g. a label) shapes, whether the shape can be colored or superimposed with texture, and so forth.

Note that a Shape has no absolute dimensions, but may optionally specify proportions in its dimensions. For instance, a prism may be specified to have a base L and W that is some minimum percentage of its height H. A shape may optionally specify constraints in how multiple instances of the shape may be laid out such as, for example, the minimum distance between two bars.

Regarding the dimension set, this is distinguished from a coordinate system. The dimension set contains as many dimensions as there are dimensions of data to be visualized. The dimensions may be more than the usual Euclidean axis x, y and z, and time t. In a dimension set, some may be Euclidean (e.g. Cartesian or Polar x,y,z, or map coordinates with a z for height). Later, when used by a geometry, the effect of these Euclidean axes is to delineate and control how shapes within a Shape Instance Series are inserted or transformed in at some coordinates, with appropriate scaling, transformation, and distribution. Other dimensions are manifested via layout effects like clustering and stacking Yet other dimensions may involve higher visual dimensions like animation, or motion speed.

As an example, consider visual items that include existing countries. The visual items might each correspond to a shape (describing the shape of the country), and the polar coordinates of the center of the country. There might also be a data series that is to be rendered according to color of the country. For instance, blue might represent a small amount of resources expended in foreign aid on that country. Red might represent a larger amount of resources expended in foreign aid on that country.

Yet another dimension may be animated. For instance, there might be a spinning top associated with each country.

That spinning top dimension for each country may be populated with data regarding the country's political stability, regardless of how that political stability score is derived. Countries with less political stability may have the top animated with a slower motion and greater wobbliness. Countries with greater political stability may have the top animated with faster motion and less wobbliness. Other non-Euclidean dimensions might include texture.

The dimension set may include a declaration of visibility/conditional hiding, scrollability, titling, labeling, subdivision, plottable granularity, permitted range (e.g. whether negatives are allowed), and so forth.

A "Geometry" consists of a container and one or more Binder-Arrangers.

As for containers, a geometry contains the description the visual elements/layout of the container in which the data will be visualized by means of shapes. For example, the simplest possible bar chart specifies the shape of the bounding rectangle, proportionality in the 2/3D dimensions of the container (alternatively, absolute dimensions), the coordinate system (e.g., Cartesian). A more sophisticated visualization may specify additional concepts. For instance, a map may specify subdivisions within the geometry (like zones, streets) that restrict where within the coordinate system a shape may be placed. A quadrant diagram may specify that its Cartesian axes accommodate negative values, color, texture, transparency, and other controllable visual parameters.

A Container may optionally specify metadata that potentially allows a significant part of the intelligence needed in the corresponding binder-arranger to be factored out to a small set of (often solver-based) Layout Helpers. The metadata denotes aspects of the container such as, for example: whether the Euclidean axes (there are more axis types) are rectilinear or curvilinear, whether the container is planar or volume occupying, whether the container is symmetrical about some dimension, and so forth.

Secondly, a Geometry carries with it a declaration of a "binder-arranger" that knows how to 1) Generate a shape instance series by applying the passed in Data Series and original Shape(s) to the DataShapeBindingParams that describe how data values map to dimensional (e.g. height) or visual attributes (e.g. color) of the Shape, and/or how to select from a set of shapes based on data value, and 2) Map the passed in Axis Set to the coordinate system of the Container, and to other visual elements (stacking, clustering, coloring, motion, etc.) of the Container, 3) layout the shape instance series onto one or more dimensions as mapped into the container, per the ShapeAxisBindingParams, and 4) interpolate between laid out shapes where necessary, e.g. to connect lines, or create a continuous surface from little surface-lets or patches.

A populated Geometry (i.e. a Geometry that is instantiated with one or more data series and corresponding shapes) may itself be treated as a shape for the purpose of being passed into another Geometry. For example, in a stacked/clustered bar chart: the innermost geometry has a simple container, a bar in which other bars can be stacked. Populating the innermost geometry results in shapes that go into a second Geometry where the container is a cluster of bars. Finally, the Shape resulting from populating of the second Geometry is fed to the outermost geometry, that knows how to layout shapes along a horizontal axis, and also show their height on the y axis.

In the above stacked/clustered bar chart example, the innermost geometry just had height, the second geometry had (sorted or unsorted) clustering, and the outermost geometry had a simple (i.e. unstacked) vertical dimension and a simple (i.e. unaware of clustering) horizontal dimension. However, the composite stacked/clustered bar chart can also be treated as a single geometry that can take in a dimension set with three aspects: a stack-aware height dimension, a cluster dimension, and a horizontal X dimension.

Layout helpers rely on algorithms or solvers, and help determine the 'correct' or 'optimal' positioning of shapes within a containing geometry, as well as interpolation between shapes. As mentioned above, the idea of layout helpers is to reduce the specificity within binder-arrangers. There are two kinds of layout helpers, local layout helpers that are invoked at the level of a particular binder-arranger, and global layout helpers that look over an entire containing geometry (including at the interim results of multiple B-A's putting shapes within the geometry).

Thus, the pipeline enables complex interactions across a wide variety of domains.

Additional Example Applications

The architecture of FIGS. 1 and 2 may allow countless data-driven analytics model to be constructed, regardless of the domain. There is nothing at all that need be similar about these domains. Wherever there is a problem to be solved where it might be helpful to apply analytics to visuals, the principles described herein may be beneficial. Up until now, only a few example applications have been described including a Feng Shui room layout application. To demonstrate the wide-ranging applicability of the principles described herein, several additional wide-ranging and diverse example applications will now be described.

Additional Example #1

Retailer Shelf Arrangements

Figure 29:
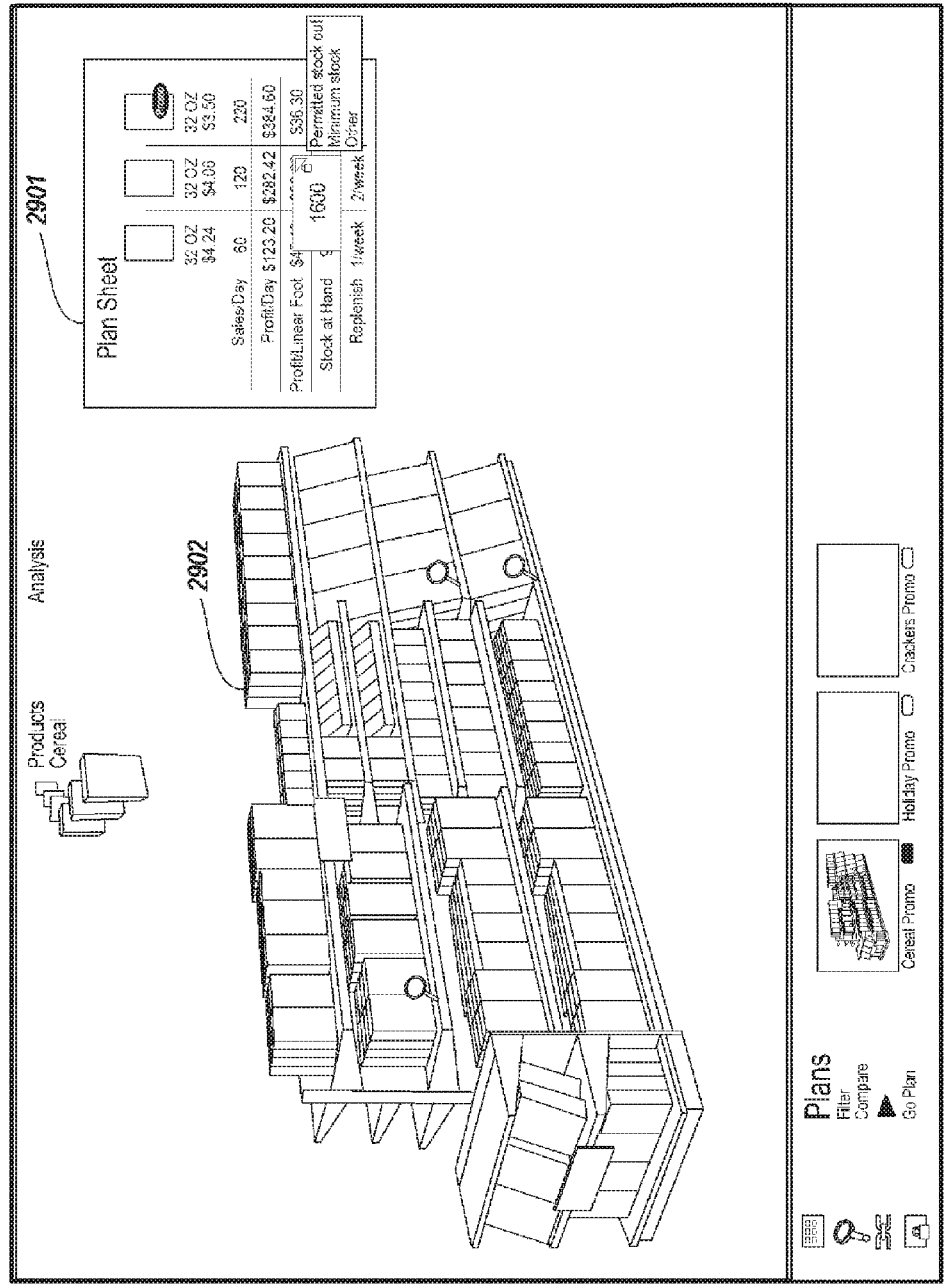

Product salespersons often use 3-D visualizations to sell retailers on shelf arrangements, end displays and new promotions. With the pipeline 201, the salesperson will be able to do what-ifs on the spot. Given some product placements and given a minimum daily sales/linear foot threshold, the salesperson may calculate and visualize the minimum required stock at hand. Conversely, given some stock at hand and given a bi-weekly replenishment cycle, the salesperson might calculate product placements that will give the desired sales/linear foot. The retailer will be able to visualize the impact, compare scenarios, and compare profits. FIG. 29 illustrates an example retailer shelf arrangement visualization. The input data might include visual images of the product, a number of the product, a linear square footage allocated for each product, and shelf number for each product, and so forth. The example of FIG. 29 illustrates that application of charts within virtual worlds. Here, the plan sheet 2901 and the shelf layout 2902 may be analytically related such that changes in the shelf layout 2902 affect the plan sheet 2901, and vice versa.

Additional Example #2

Urban Planning

Figure 30:
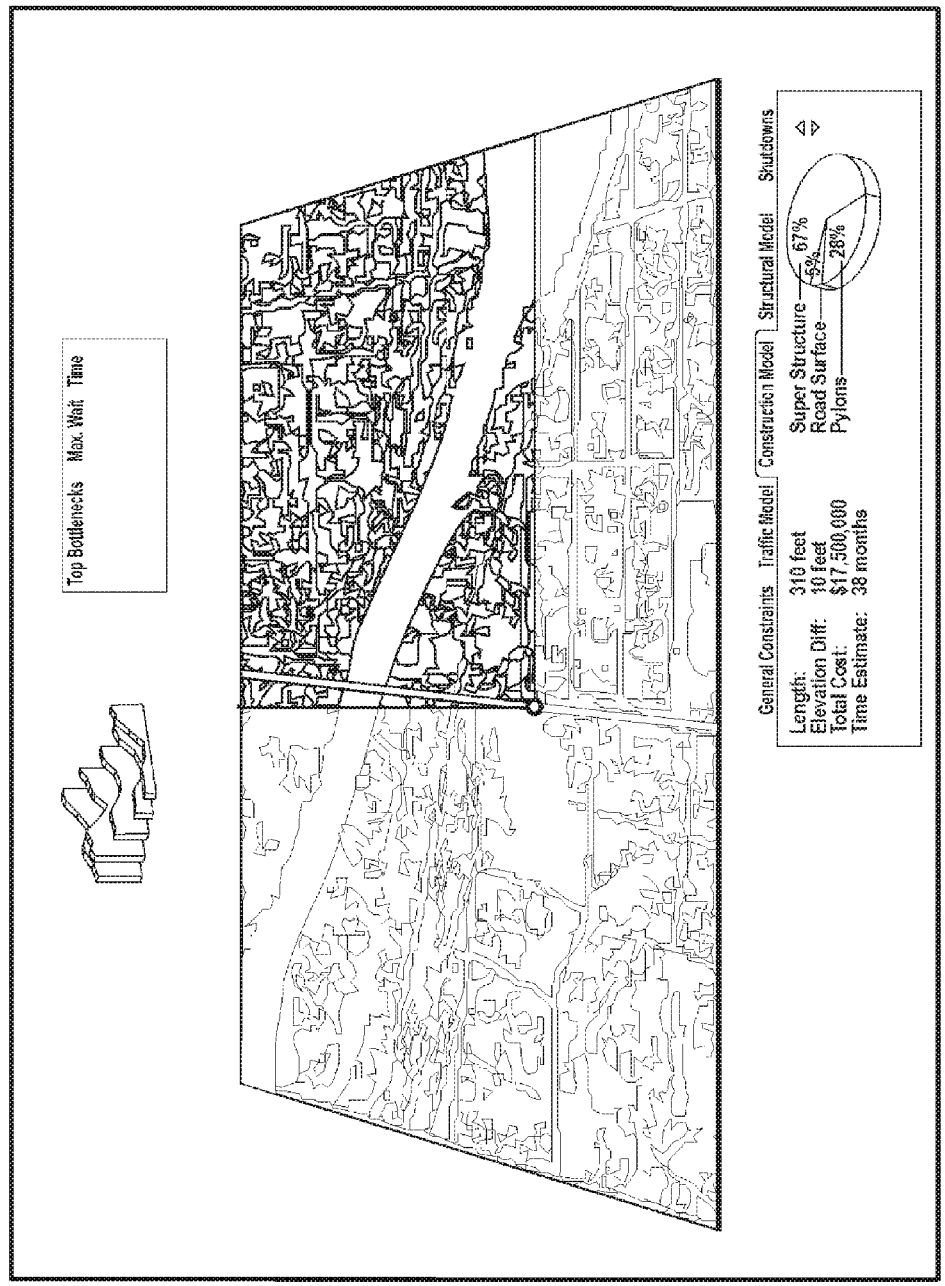

Urban planning mash ups are becoming prominent. Using the principles described herein, analytics can be integrated into such solutions. A city planner will open a traffic model created by experts, and drag a bridge in from a gallery of road improvements. The bridge will bring with it analytical behavior like length constraints and high-wind operating limits. Via appropriate visualizations, the planner will see and compare the effect on traffic of different bridge types and placements. The principles described herein may be applied to any map scenarios where the map might be for a wide variety of purposes. The map might be for understanding the features of a terrain and finding directions to some location. The map might also be a visual backdrop for comparing regionalized data. More recently, maps are being used to create virtual worlds in which buildings, interiors and arbitrary 2-D or 3-D objects can be overlaid or positioned in the map. FIG. 30 illustrates an example visualized urban plan. Note that once again, charts may be functionally and analytically integrated with a map of a virtual world (in this case a city). As the chart changes, so might the virtual world, and vice versa.

Additional Example #3

Visual Education

Figure 31:
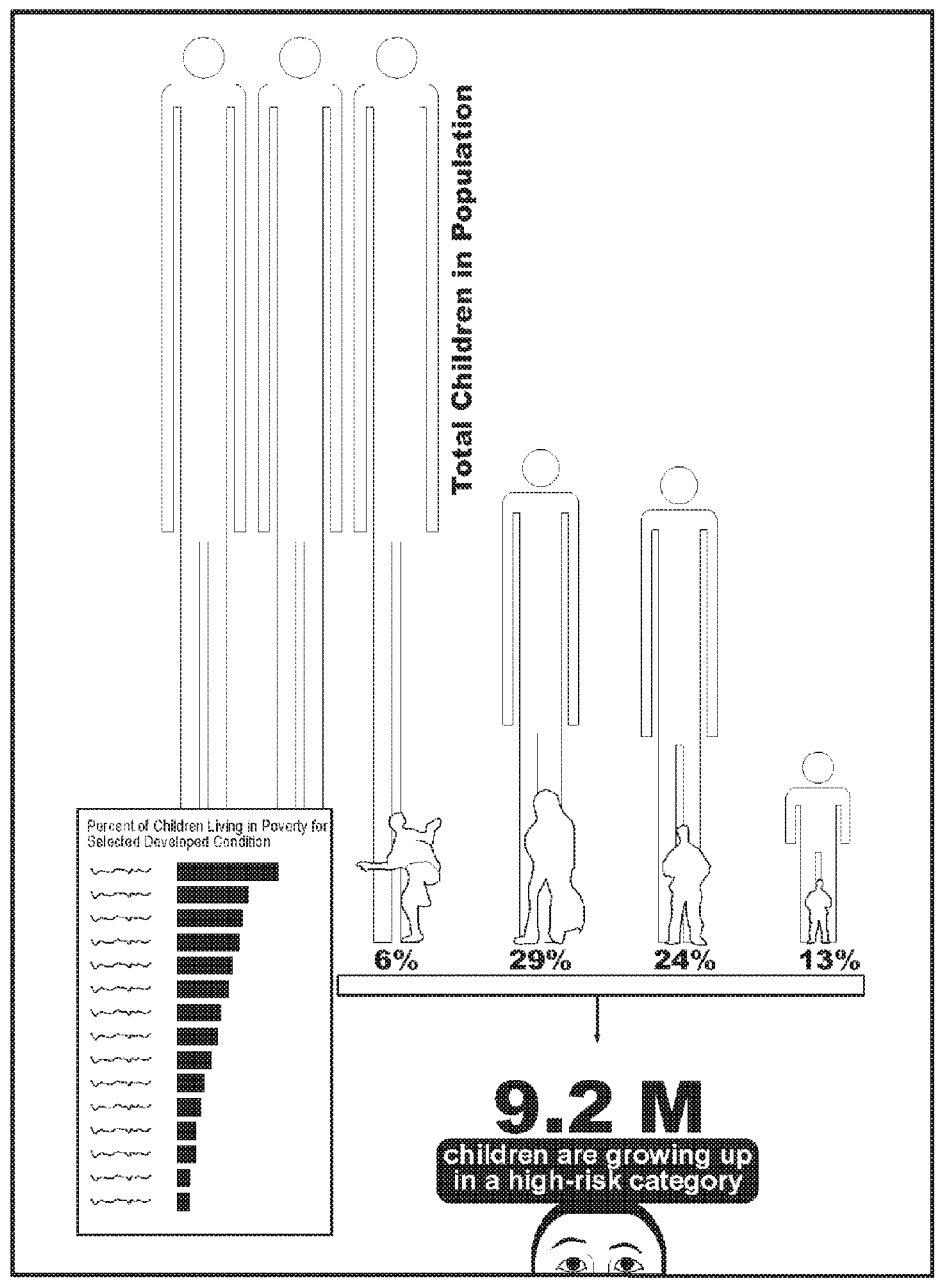
FIG. 31 illustrates a conventional visualization comparing children's education, that the principles of the present invention may apply to thereby creating a more dynamic learning environment.
Figure 32:
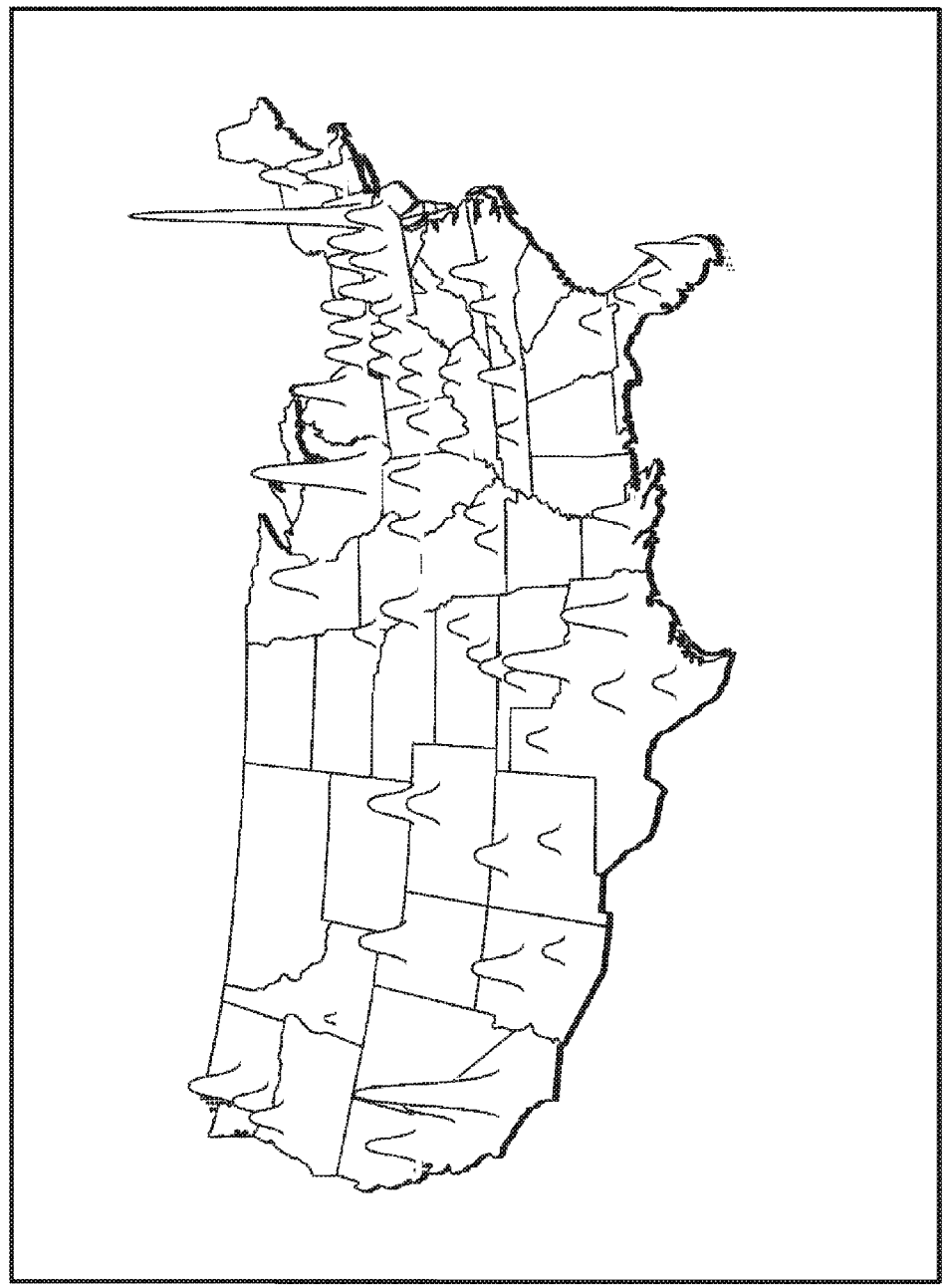
FIG. 32 illustrates a conventional visualization comparing population density, that the principles of the present invention may apply to thereby creating a more dynamic learning environment.

In domains like science, medicine, and demographics where complex data needs to be understood not just by domain practitioners but also the public, authors can use the principles described herein to create data visualizations that intrigue and engage the mass audience. They will use domain-specific metaphors, and impart the authors' sense of style. FIG. 31 is an illustration about children's education. FIG. 32 is a conventional illustration about population density. Conventionally, such visualizations are just static illustrations. With the principles described herein, these can become live, interactive experiences. For instance, by inputting a geographically distributed growth pattern as input data, a user might see the population peaks change. Some visualizations, where the authored model supports this, will let users do what-ifs. That is, the author may change some values and see the effect on that change on other values.

Additional Example #4

Apply View Components to Parametric Targets

Figure 33:
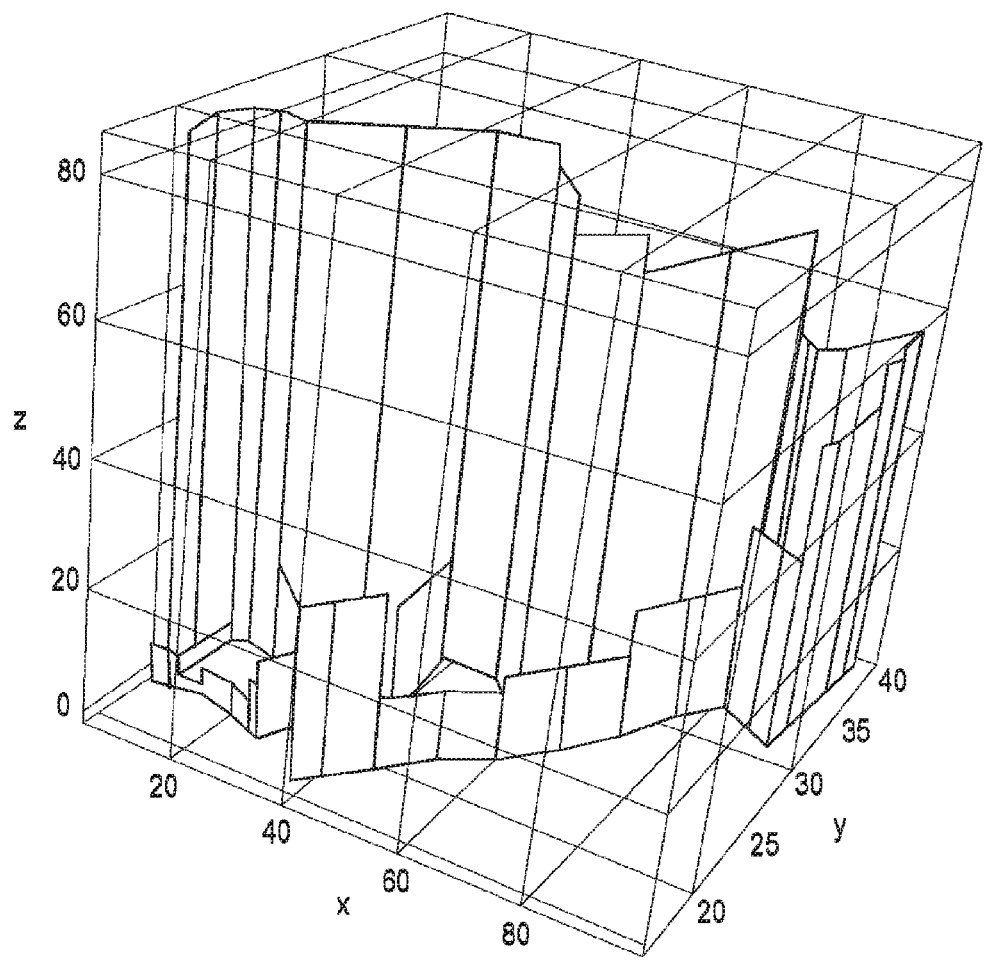
FIG. 33 illustrates a visualization of view components applied to a first parametric target.
Figure 34:
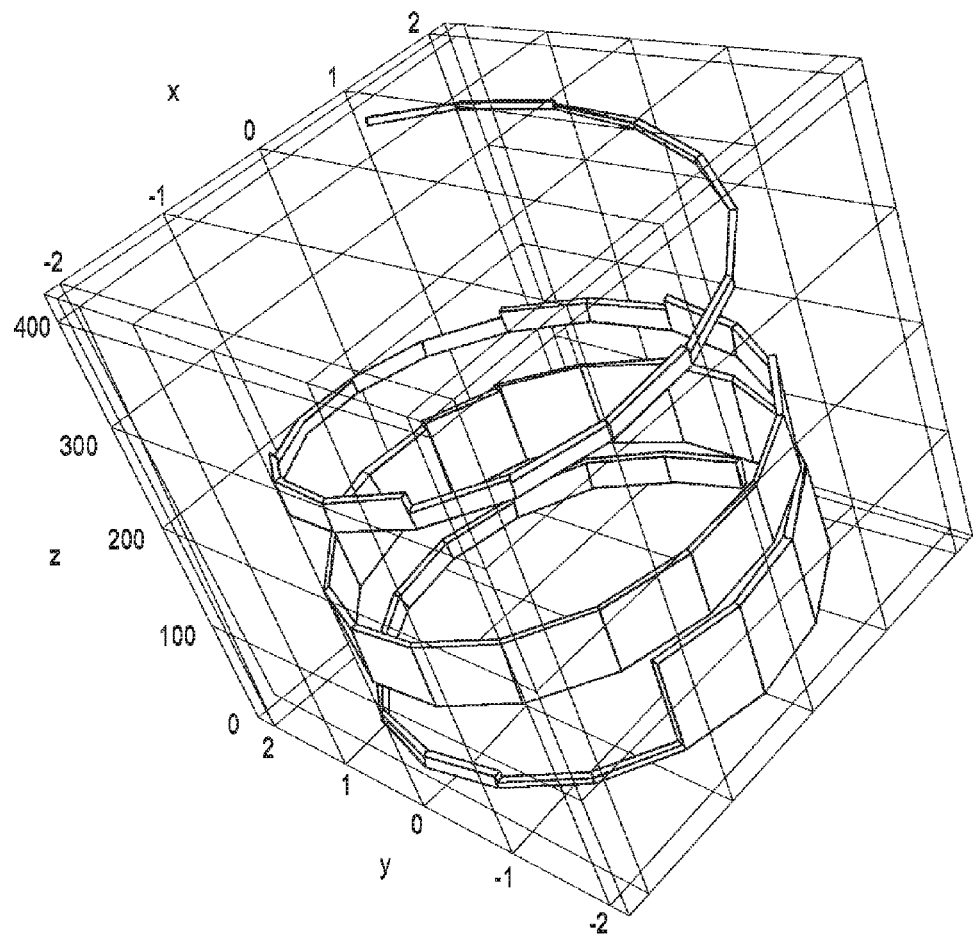
FIG. 34 illustrates a visualization of the view components shown in FIG. 33 applied to a second parametric target.

In some instances, it may be desirable to apply view components to various parametric targets (e.g., other view components), for example, as shown in FIGS. 33 and 34. In particular, the height of the panels in both FIGS. 33 and 34 represent Napoleon's army size during his ill-fated Russian campaign of 1812. In FIG. 33, the panels are applied to a parametric target that represents the actual path that Napoleon's army took. In FIG. 34, the panels are applied to a different parametric target: a helix. Thus, the view components (such as, the panels) may be applied to different parametric targets (such as, a view component representing the actual path that Napoleon's army took or a view component representing a helix).

The view components may be children of the parametric targets to which they are applied. For example, the panels in FIG. 33 may be children of the army path, while the panels in FIG. 34 may be children of the helix in FIG. 34. In addition, a label representing an army size may be a child of a panel whose height represents that army size.

Desirably, solvers tied to the properties of the child view components and solvers tied to the properties of the parent view components may be explicitly composed through a dependency tree or implicitly composed through the interrelationship of property-setters that include such solvers.

Thus, a setting of a property in a child may trigger the re-solving of a property in a parent (sometimes referred to as "escalation"), and a setting of a property in a parent may trigger the re-solving of a property in child (sometimes referred to as "delegation"). For instance, with reference to FIG. 33, a user may attempt to alter the height of a panel, which may trigger a property-setter for the panel to increase the panel's scale. In addition, the panel's scale property-setter may invoke a property-setter for the scale for the set of panels (an escalation). The scale property-setter for the set of panels may then invoke individual scale property-setters for each of the panels (a delegation).

Note in particular, FIG. 33 is an example of the application of a chart to virtual worlds. A "virtual world" is a computerized representation of some real of fictitious map. The map might be two-dimensional or may be three-dimensional. For instance, a city map might include streets, buildings, rivers, and so forth all laid out in a geographic relationship. "Charts" on the other hand represent data series applied to variables. Charts may be applied to virtual worlds using the principles described herein by applying a data series represented by the chart to some aspect of a virtual world. That virtual world aspect might be horizontal or vertical surface, external services of three-dimensional objects, routes, and so forth. The virtual world may represent a real physical space or might just represent a hypothetical area. The virtual world might represent all of a portion of a town, city, state, province, region, building, neighborhood, planet, or any other physical area.

For instance, in the example of FIG. 33, the chart data includes for each of a number of periods of time, the number of people in the Napoleon's army at that point in time. This information may be applied to a route of Napoleon's army. The height of each bar represents the number of soldiers in Napoleon's army in a particular segment of the army's journey. If desired, other geographical features may be included in the map such as rivers, cities, oceans and so forth. Charts may be applied to virtual worlds by applying a chart feature, such as a coordinate system, axis or marker to a virtual world feature, such as a surface.

As other examples of the application of charts to virtual worlds, suppose a company has data representing employee moral. This chart data may be applied to a virtual world such as a three-dimensional rendering of the company campus by rendering the color of the window of each employee a certain color according to moral. For instance, a blue window might represent a happy employee, whereas a red window might represent an unhappy employee. Appropriate analysis may then be made. For instance, one might take a high-level view of the campus map, and determine what buildings are tending more red. It may be, perhaps, that one of the buildings is isolated from the others, resulting in less opportunity for interaction, and lower moral. The company might then reconsider renting that building in the future, and try to procure a building for those employees that is closer to the whole.

Accordingly, the principles described herein provide a major paradigm shift in the world of visualized problem solving and analysis. The paradigm shift applies across all domains as the principles described herein may apply to any domain.

Domain-Specific Taxonomy of Data

Referring back to FIG. 2, the pipeline 201 is data-driven. For instance, input data 211 is provided to data portion 210, analytics data 221 is provided to analytics portion 220, and view data 231 is provided to view portion 230. Examples of each of these data have already been described. Suffice it to say that the volume of data that could be selected by the authoring component 240 may be quite large, especially given the ease of composition in which portions of models can be imported into a model to compose more and more complex models. To assist in navigating through the data, so that the proper data 211, 221 and 231 may be selected, a taxonomy component 260 provides a number of domain-specific taxonomies of the input data.

Figure 35:
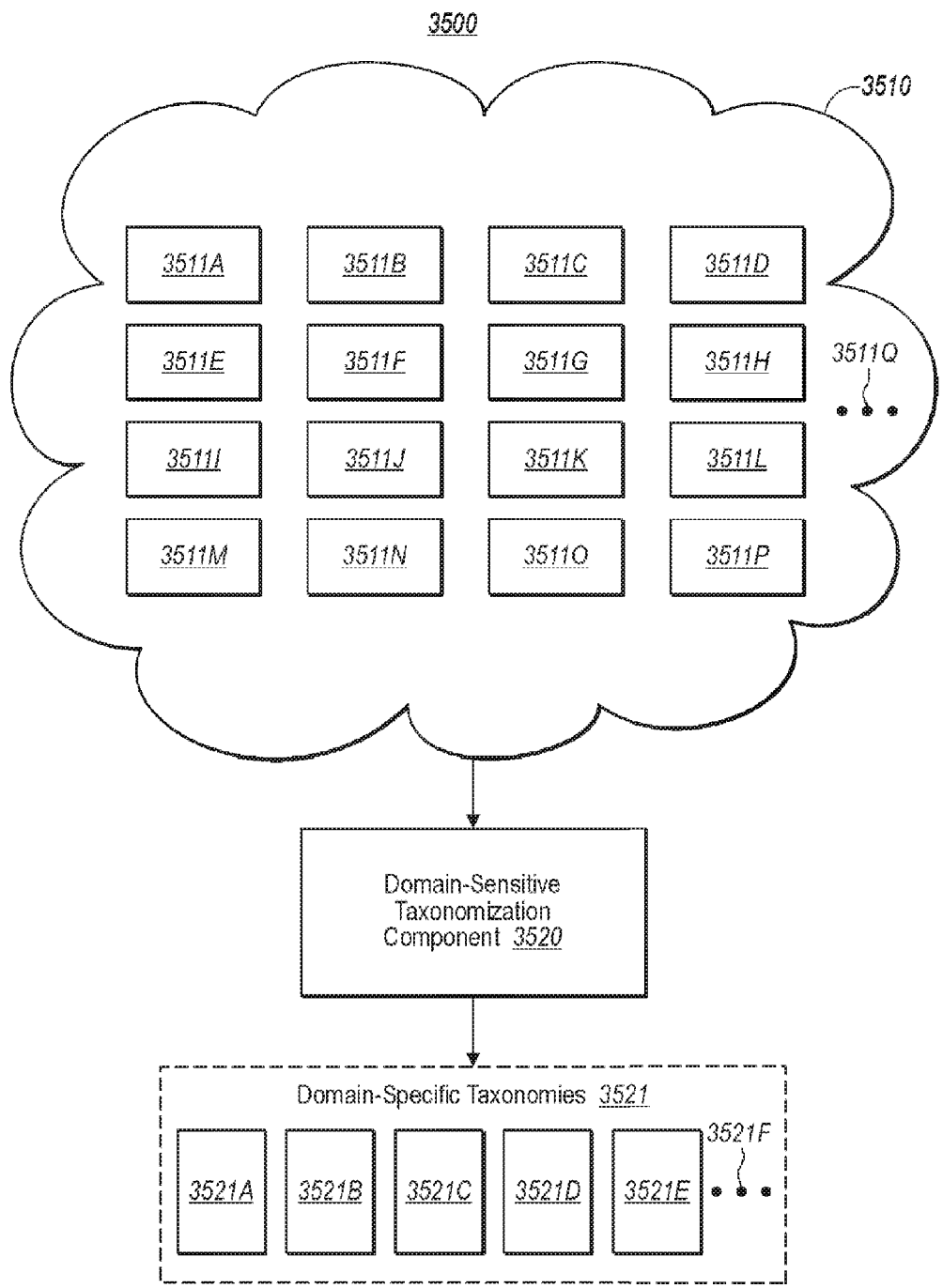
FIG. 35 illustrates a taxonomy environment in which the taxonomy component of FIG. 2 may operate.

FIG. 35 illustrates a taxonomy environment 3500 in which the taxonomy component 260 may operate. Taxonomy involves the classification of items into categories and the relating of those categories. The environment 3500 thus includes a collection of items 3510 that are to be subjected to taxonomization. In FIG. 35, the collection of items 3510 is illustrated as including only a few items altogether including items 3511A through 3511P (referred to collectively as "member items 3511"). Although only a few member items 3511 are shown, there may be any number of items, perhaps even hundreds, thousands or even millions of items that should be categorized and taxonomized as represented by the ellipsis 3511Q. The member items 3511 include the pool of member items from which the authoring component 240 may select in order to provide the data 211, 221 and 231 to the pipeline 201.

A domain-sensitive taxonomization component 3520 accesses all or a portion of the member items 3511, and also is capable of generating a distinct taxonomy of the member items 3511. For instance, the taxonomization component 3520 generates domain specific taxonomies 3521. In this case, there are five domain-specific taxonomies 3521A through 3521E, amongst potentially others as represented by the ellipsis 3521F. There may also be fewer than five domain-specific taxonomies created and managed by the taxonomization component 3520.

As an example, the taxonomy 3521A might taxonomize the member items suitable for a Feng Shui domain, taxonomy 3521B may taxonomize the member items suitable for a motorcycle design domain, taxonomy 3521C may likewise be suitable for a city planning domain, taxonomy 3521D may be suitable for an inventory management domain, and taxonomy 3521E may be suitable for an abstract artwork domain. Of course, these are just five of the potentially countless number of domains that may be served by the pipeline 201. Each of the taxonomies may use all or a subset of the available member items to classify in the corresponding taxonomy.

Figure 36:
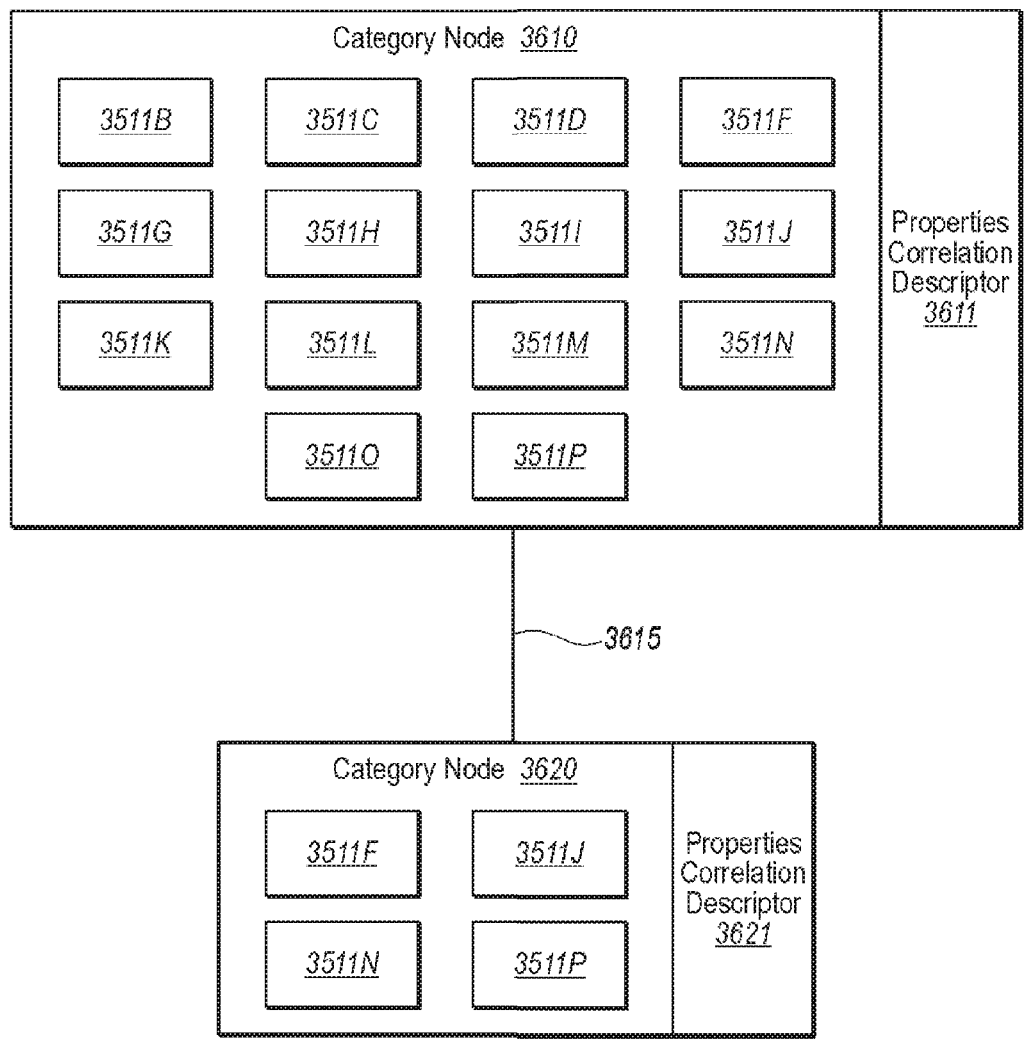
FIG. 36 illustrates an example of a taxonomy of the member items of FIG. 35.

FIG. 36 illustrates one specific and simple example 3600 of a taxonomy of the member items. For example, the taxonomy may be the domain-specific taxonomy 3521A of FIG. 35. Subsequent figures will set forth more complicated examples. The taxonomy 3600 includes category node 3610 that includes all of the member items 3511 except member items 3511A and 3511E. The category node 3610 may be an object that, for example, includes pointers to the constituent member items and thus in the logical sense, the member items may be considered "included within" the category node 3610. The category node 3610 also has associated therewith a properties correlation descriptor 3611 that describes the membership qualifications for the category node 3610 using the properties of the candidate member items. When determining whether or not a member item should be included in a category, the properties correlation descriptor may be used to evaluate the descriptor against the properties of the member item.

In a taxonomy, two categories can be related to each other in a number of different ways. One common relation is that one category is a subset of another. For example, if there is a "vehicle" category that contains all objects that represent vehicles, there might be a "car" category that contains a subset of the vehicles category. The property correlation descriptors of both categories may define the specific relationship. For instance, the property correlation descriptor for the vehicles category may indicate that objects having the following properties will be included in the category: 1) the object is movable, 2) the object may contain a human. The car category property correlation descriptor may include these two property requirements either expressly or implicitly, and may also include the following property requirements: 1) the object contains at least 3 wheels that maintain contact with the earth during motion of the object, 2) the object is automotive, 3) the height of the object does not exceed 6 feet. Based on the property correlation descriptors for each category, the taxonomization component may assign an object to one or more categories in any given domain-specific taxonomy, and may also understand the relationship between the categories.

In FIG. 36, a second category node 3620 is shown that includes another property correlation descriptor 3621. The category node 3620 logically includes all member items that satisfy the property correlation descriptor 3621. In this case, the member items logically included in the category node are a subset of the member items included in the first category node 3610 (e.g. including member items 3511F, 3511J, 3511N and 3511P). This could be because the property correlation descriptor 3621 of the second category node 3620 specifies the same property requirements as the correlation descriptor 3611 of the first category node 3610, except for one or more additional property requirements. The relation between the first category node 3610 and the second category node 3620 is logically represented by relation 3615.

In a vehicle-car example, the relationship between the categories is a subset relation. That is, one category (e.g., the car category) is a subset of the other (e.g., the vehicle category). However, there are a wide variety of other types of relationships as well, even perhaps new relationships that have never been recognized or used before. For example, there might be a majority inheritance relationship in which if a majority (or some specified percentage) of the objects in one category have a particular property value, the objects in another category have this property and inherit this property value. There might be a "similar color" relationship in which if one category of objects has a primary color within a certain wavelength range of visible light, then the other category contains objects having a primary color within a certain neighboring wavelength range of visible light. There might be a "virus mutation" relationship in which if one category contains objects that represent certain infectious diseases that are caused primarily by a particular virus, a related category might include objects that represent certain infectious diseases that are caused by a mutated form of the virus. The examples could go on and on for volumes. One of ordinary skill in the art will recognize after having reviewed this description, that the kinds of relationships between categories is not limited.

Figure 37C:
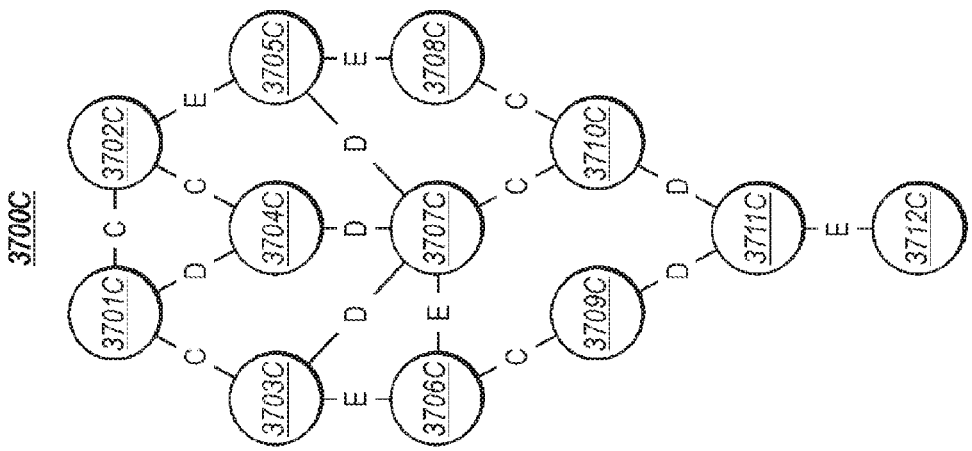
FIGS. 37A through 37C show three examples of taxonomies of related categories.
Figure 37B:
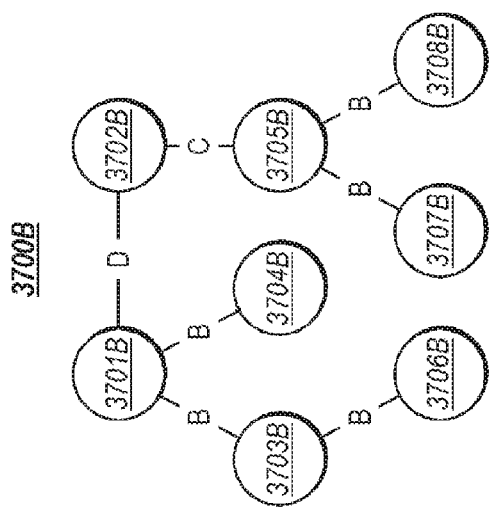
Figure 37A:
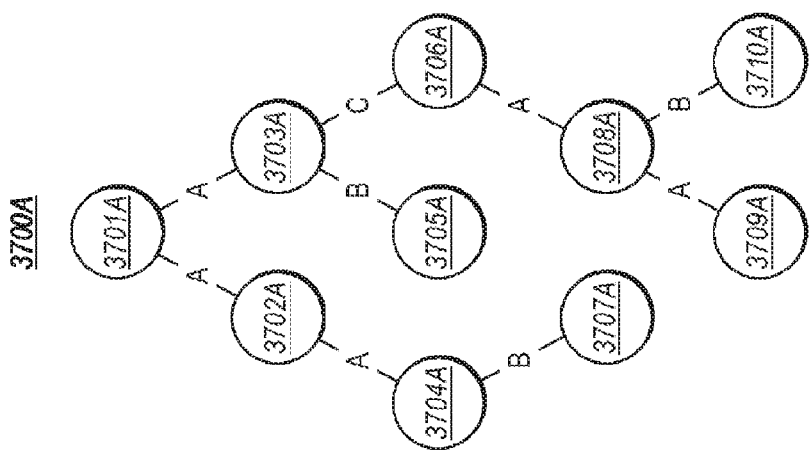

Further a single taxonomy can have many different types of relations. For clarity, various taxonomies will now be described in an abstract sense. Examples of abstractly represented taxonomies are shown in FIGS. 37A through 37C. Then specific examples will be described, understanding that the principles described herein enable countless applications of domain-specific taxonomies in a data-driven visualization.

While the example of FIG. 36 is a simple two category node taxonomy, the examples of FIGS. 37A through 37C are more complex. Each node in the taxonomies 3700A through 3700C of FIGS. 37A through 37C represents a category node that contains zero or more member items, and may have a property correlation descriptor associated with each that is essentially an admission policy for admitting member items into the category node. To avoid undue complexity, however, the member items and property correlation descriptor for each of the category nodes of the taxonomies 3700A through 3700C are not illustrated. The lines between the category nodes represent the relations between category nodes. They might be a subset relation or some other kind of relation without limit. The precise nature of the relations between category nodes is not critical. Nevertheless, to emphasize that there may be a variety of relation types between category nodes in the taxonomy, the relations are labeled with an A, B, C, D, or E.

FIGS. 37A through 37C are provided just as an example. The precise structure of the taxonomies of FIGS. 37A through 37C is not only not critical, but the principles described herein permit great flexibility in what kinds of taxonomies can be generated even based on the same set of input candidate member items. In these examples, the taxonomy 3700A includes category node 3701A through 3710A related to each other using relation types A, B and C. Taxonomy 3700B includes categories 3701B through 3708B related to each other using relation types B, C and D. Taxonomy 3700C includes categories 3701C through 3712C related to each other using relation types C, D and E. In this example, taxonomies 3700A and 3700B are hierarchical, whereas taxonomy 3700C is more of a non-hierarchical network.

As new candidate member items become available, those candidate member items may be evaluated against the property correlation descriptor of each of the category nodes in each the taxonomies. If the properties of the member item have values that permit the member item to satisfy the requirements of the property correlation descriptor (i.e., the admission policy), the member item is admitted into the category node. For instance, perhaps a pointer to the member item is added to the category node. Thus, if new member items have sufficient numbers of properties, new member items may be imported automatically into appropriate categories in all of the taxonomies.

Figure 38:
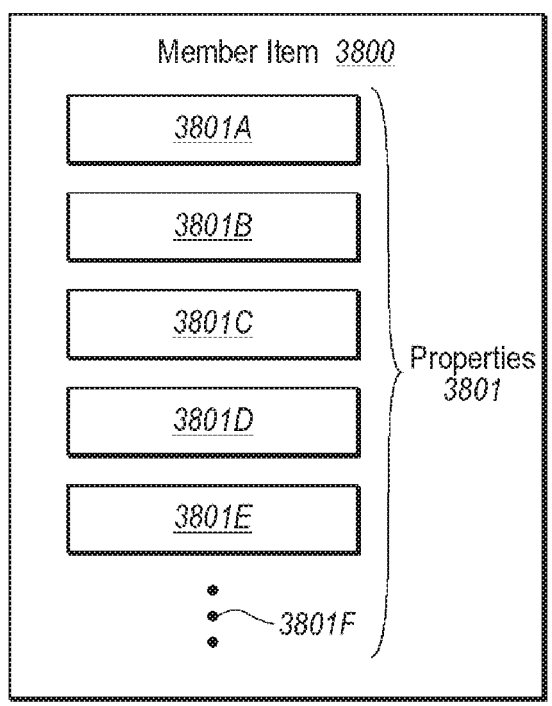
FIG. 38 illustrates a member item that includes multiple properties.

FIG. 38 illustrates a member item 3800 that includes multiple properties 3801. There might be a single property, but there might also be potentially thousands of properties associated with the member item 3800. In FIG. 38, the member item 3800 is illustrated as including four properties 3801A, 3801B, 3801C and 3801D, amongst potentially others as represented by the ellipsis 3801F. There is no limit to what these properties may be. They might be anything that might be useful in categorizing the member item into a taxonomy.

In one embodiment, potential data for each of the data portion 210, the analytics portion 220, and the view portion 230 may be taxonomized. For example, consider the domain in which the author is composing a consumer application that allows an individual (such as a consumer or neighborhood resident) to interface with a map of a city.

In this consumer domain, there might be a taxonomy for view data 231 that can be selected. For instance, there might be a building category that includes all of the buildings. There might be different types of buildings: government buildings, hospitals, restaurants, houses, and so forth. There might also be a transit category that includes railroad, roadways, and canals sub-categories. The roadways category might contain categories or objects representing streets, highways, bikepaths, overpasses, and so forth. The streets category might include objects or categories of visual representations of one way streets, multi-line streets, turn lanes, center lanes, and so forth. There might be a parking category showing different types of visual representations of parking or other sub-categories of parking (e.g., multi-level parking, underground parking, street parking, parking lots, and so forth). Parking might also be sub-categorized by whether or not parking is free, or whether there is a cost.

There might also be a taxonomy of the input data in this consumer domain. For instance, a parking structure might have data associated with it such as, for example, 1) whether the parking is valet parking, 2) what the hourly change is for the parking, 3) the hours that the parking is open, 4) whether the parking is patrolled by security, and if so, how many security officers there are per unit area of parking, 5) the number of levels of the parking, 6) the square footage of the parking if there is but one level, and if multi-level parking, the square footage on each level, 7) the annualized historical number of car thefts that occur in the parking structure, 8) the volume usage of the parking, 9) whether parking is restricted to the satisfaction of one or more conditions (i.e., employment at a nearby business, patronage at a restaurant or mall, and so forth), or any other data that might be helpful. There might also be data associated with other visual items as well, and data that may never affect how the visual items is rendered, but might be used for a calculation at some point.

However, there might also be a taxonomy of the analytics data 221 that is specific to this consumer map domain. For instance, the analytics might present cost-based analytics in one category, time-based analytics in another category, distance-based analytics in yet another category, directory analytics in another category, and routing analytics in another category. Here, the analytics are taxonomized to assist the author in formulating an analytical model for the desired application. For instance, the routing analytics category might include a category for equations that calculate a route, a constraint that specifies what restrictions can be made on the routing (such as shortest route, most use of highways, avoid streets, and so forth), or rules (such as traffic directions on particular roads). Similar subcategories might also be included for the other categories as well.

Now consider another domain, also dealing with the layout of a city, but this time, the domain is city planning Here, there are analytics that are interesting to city planners that are of little to no interest to a consumer. For instance, there might be analytics that calculate how thick the pavement should be given a certain traffic usage, what the overall installation and maintenance cost per linear foot of a certain road type placed in a certain area, what the safety factor of a bridge is given expected traffic patterns forecast for the next 20 years, what the traffic bottlenecks are in the current city plan, what the environmental impact would be if a particular building was constructed in a particular location, what the impact would be if certain restrictions were placed on the usage of that particular building and so forth. Here, the problems to be solved are different than those to be solved in the consumer domain. Accordingly, the taxonomy of the analytics may be laid out much differently for the city planning domain as compared to the consumer domain, even though both deal with a city topology.

On the other hand, a tractor design domain might be interested in a whole different set of analytics, and would use a different taxonomy. For instance, the visual items of a tractor design domain might be totally different than that of a city planning domain. No longer is there a concern for city visual elements. Now, the various visual elements that make up a tractor are taxonomized. As an example, the visual items might be taxonomized using a relation of what can be connected to what. For instance, there might be a category for "Things that can be connected to the seat", "Things that can be connected to the carburetor, "Things that can be connected to the rear axle" and so forth. There might also be a different analytics taxonomy. For instance, there might be a constraint regarding tread depth on the tires considering that the tractor needs to navigate through wet soil. There might be analytics that calculate the overall weight of the tractor or its subcomponents, and so forth.

Figure 39:
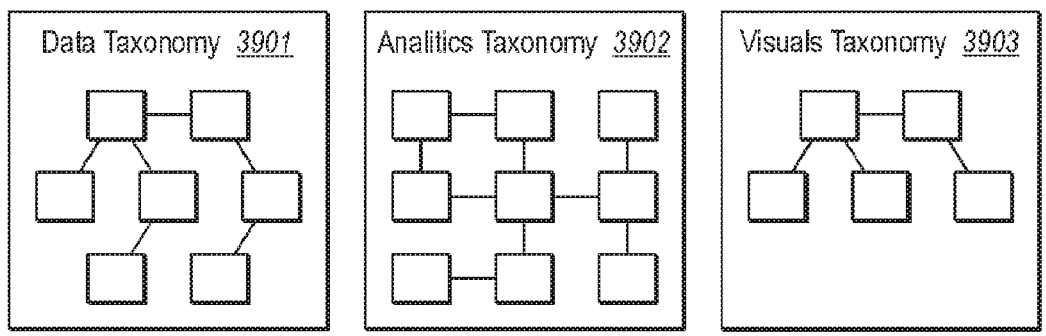
FIG. 39 illustrates a domain-specific taxonomy and represents one example of the domain-specified taxonomies of FIG. 35.

FIG. 39 illustrates a domain-specific taxonomy 3900 and represents one example of the domain-specific taxonomies

3521 of FIG. 35. In one embodiment, the domain-specific taxonomy includes a data taxonomy 3901 in which at least some of the available data items are taxonomized into corresponding related categories, a view component taxonomy 3903 in which at least some of the available view components are taxonomized into a corresponding related view components categories, and an analytics taxonomy 3902 in which at least some of the available analytics are taxonomized into correlating related analytics categories. Examples of such domain specific taxonomies in which data, analytics, and view components are taxonomized in a manner that is specific to domain have already been described.

Figure 40:
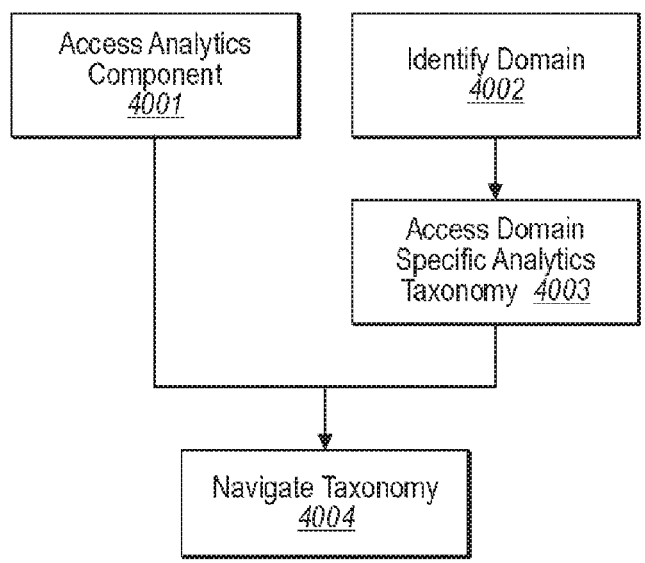
FIG. 40 illustrates a flowchart of a method for navigating and using analytics.

FIG. 40 illustrates a method for navigating and using analytics. The analytics component 220 is accessed (act 4001) along with the corresponding domain specific analytics taxonomy (act 4003). If there are multiple domain-specific analytics taxonomies, the domain may first be identified (act 4002), before the domain-specific analytics taxonomy may be accessed (act 4003).

Then, the analytics taxonomy may be navigated (act 4004) by traversing the related categories. This navigation may be performed by a human being with the assistance of a computing system, or may be performed even by a computing system alone without the contemporaneous assistance of a human being. A computer or human may derive information from the correlation property descriptor for each category that defines that admission policy for analytics to be entered into that category. Information may also be derived by the relationships between categories. The navigation may be used to solve the analytics problem thereby solving for output model parameters, or perhaps for purposes of merging analytics from multiple models. Alternatively, the navigation may be used to compose the analytics model in the first place.

For instance, suppose an analytics taxonomy categorizes relations in terms of the identity of the type of problem to be solved. The composer could begin by reviewing all of those analytics in the problem type category of interest. That category might have related categories that define portions of the problem to be solved. The user could quickly navigate to those related categories and find analytics that are of relevance in the domain.

Search and Exploration

Figure 41:
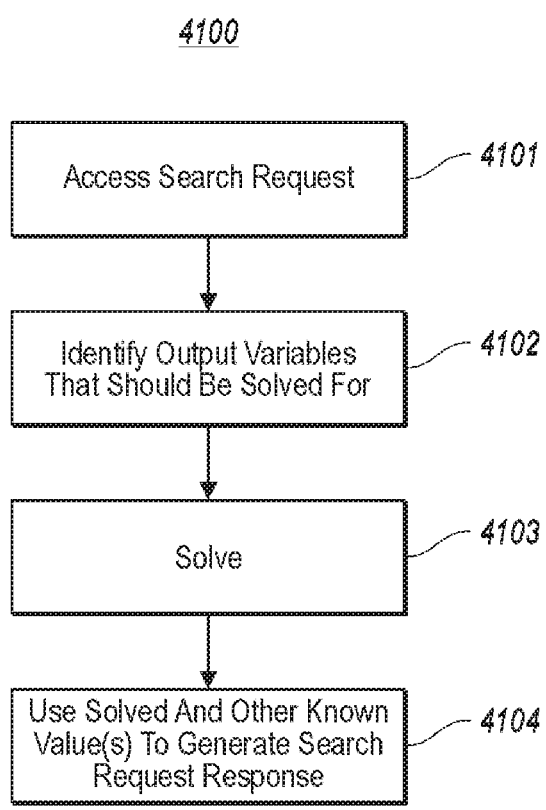
FIG. 41 illustrates a flowchart of a method for searching using analytics.

As previously mentioned, the data-driven analytics model may be used to form analytics intensive search and exploration operations. FIG. 41 illustrates a flowchart of a method 4100 for searching using the data-driven analytics model. The method 4100 may be performed each time the search tool 242 receives or otherwise accesses a search request (act 4101).

The principles described herein are not limited to the mechanism that the user may use to enter a search request. Nevertheless, a few examples will now be provided to show the wide diversity of search request entry mechanisms. In one example, perhaps the search request is text-based and entered directly into a text search field. In another example, perhaps radio buttons are filled in to enter search parameters. Perhaps a slider might also be used to enter a range for the search parameter. The search request generation may have been generated in an interactive fashion with the user. For example, in the case where the user requests real estate that experiences a certain noise level range, the application might generate noise that gets increasingly louder, and ask the user to hit the "Too Much Noise" button when the noise gets louder that the user want to bear.

The search request is not a conventional search request, but may require solving operations of the data-driven analytics model. Before solving, however, the search tool 242 of FIG. 2 identifies any model parameters that should be solved for in order to be able to respond to the request (act 4102). This might be accomplished using, for example, the various taxonomies discussed above. For instance, in the case where the user is searching for real estate that is not in the shadow of a mountain after 9:15 at any point of the year, there might be a model variable called "mountain shade" that is solved for. In the case where the user searches for real estate that experiences certain noise levels, there might be a model variable called "average noise" that is to be solved for given a particular coordinate.

Once the relevant output variables are identified, the analytical relations of the analytics portion 220 are used to solve for the output variables (act 4103). The solved output variable (s) are then used by the search tool 242 to formulate a response to the search request using the solved value(s) (act 4104). Although in some cases the user might interact with the method 4100 as the method 4100 is being executed, the method 4100 may be performed by a computing system without contemporaneous assistance from a human being. The search request may be issued by a user or perhaps even by another computing or software module.

The method 4100 may be repeated numerous times each time a search request is processed. The model variables that are solved for may, but need not, be different for each search request. For instance, there may be three search requests for homes that have a certain price range, and noise levels. For example, there might be a search request for homes in the $400,000 to $600,000 price range, and whose average noise levels are below 50 decibels. The parameters to be solved for here would be the noise levels. A second search request may be for homes in the $200,000 to $500,000 price range, and whose noise levels are below 60 decibels. Here the parameters to be solved for would once again be noise levels. Note, however, that in the second search request, some of the solving operations would have already been done for the search request. For instance, based on the first search request, the system already identified homes in the $400,000 to $500,000 price range whose noise levels were below 50 decibels. Thus, for those houses, there is no need to recalculate the noise levels. Once solved, those values may be kept for future searching. Thus, this allows a user to perform exploration by submitting follow-on requests. The user might then submit a third search request for houses in the $400,000 to $500,000 price range, and having noise levels less than 45 decibels. Since noise levels for those homes have already been solved for, there is no need to solve for them again. Accordingly, the search results can be returned with much less computation. In essence, the system may learn new information by solving problems, and be able to take advantage of that new information to solve other problems.

As previously mentioned, each search request might involve solving for different output model variables. For instance, after performing the search requests just described, the user might submit a search request for houses that are not in the shadow of a mountain. Once the system solves for this, whenever this or another user submits a similar request, the results from the solve may be used to fulfill that subsequent search request. A user might submit a search request for houses that would stay standing in a magnitude 8.0 earthquake, causing a simulation to verify that each house would either stay standing, fall, or perhaps provide some percentage chance that the house would remain standing. For houses for which there was insufficient structural information to perform an accurate simulation, the system might simply state that the results are inconclusive. Once the earthquake simulations are performed, unless there was some structural change to the house that required re-simulation, or unless there was some improved simulation solver, the results may be used whenever someone submits a search requests for houses that could withstand a certain magnitude of earthquake. A user might also perform a search request for houses within a certain price range that would not be flooded or destroyed should a category 5 hurricane occur.

Having described the embodiments in some detail, as a side-note, the various operations and structures described herein may, but need not, be implemented by way of a computing system. Accordingly, to conclude this description, an example computing system will be described with respect to FIG. 25.

Figure 42:
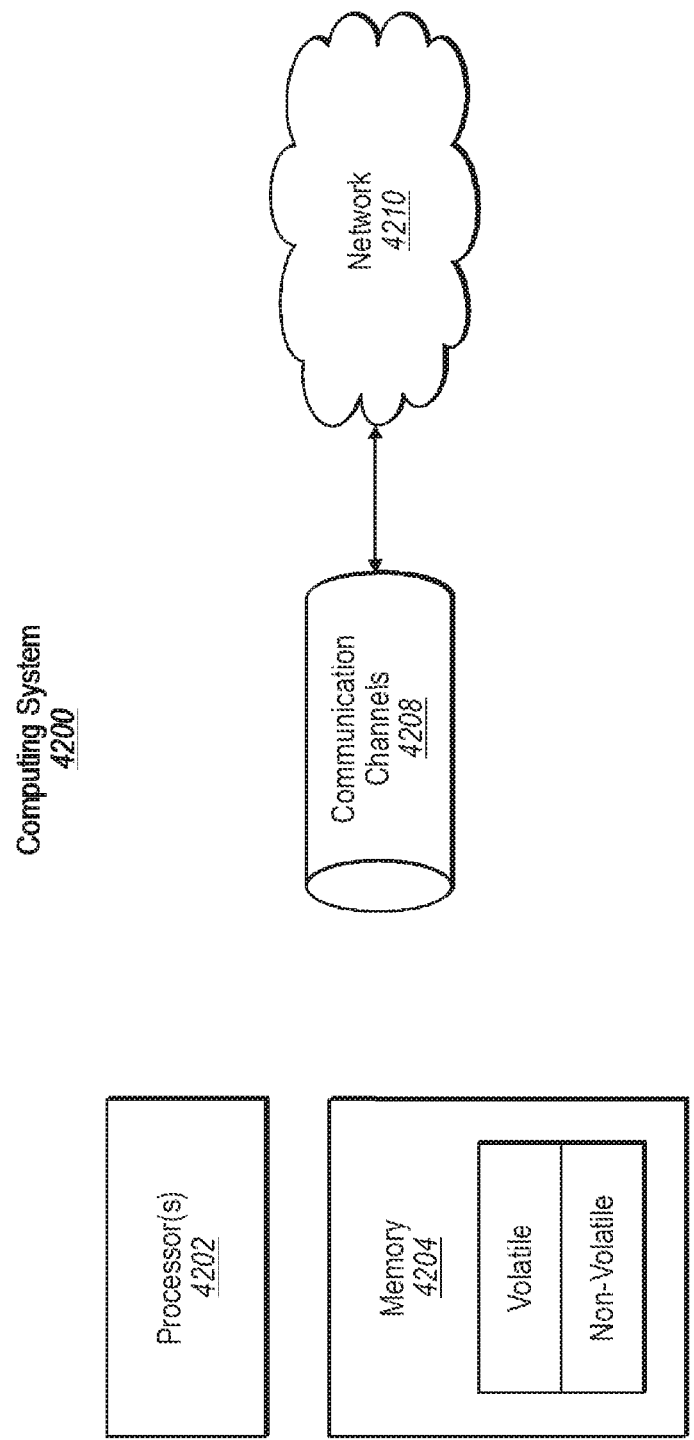
FIG. 42 illustrates a computing system that represents an environment in which the composition framework of FIG. 1 (or portions thereof) may be implemented.

FIG. 42 illustrates a computing system 4200. Computing systems are now increasingly taking a wide variety of forms. Computing systems may, for example, be handheld devices, appliances, laptop computers, desktop computers, mainframes, distributed computing systems, or even devices that have not conventionally been considered a computing system. In this description and in the claims, the term "computing system" is defined broadly as including any device or system (or combination thereof) that includes at least one processor, and a memory capable of having thereon computer-executable instructions that may be executed by the processor. The memory may take any form and may depend on the nature and form of the computing system. A computing system may be distributed over a network environment and may include multiple constituent computing systems.

As illustrated in FIG. 42, in its most basic configuration, a computing system 4200 typically includes at least one processing unit 4202 and memory 4204. The memory 4204 may be physical system memory, which may be volatile, non-volatile, or some combination of the two. The term "memory" may also be used herein to refer to non-volatile mass storage such as physical storage media. If the computing system is distributed, the processing, memory and/or storage capability may be distributed as well. As used herein, the term "module" or "component" can refer to software objects or routines that execute on the computing system. The different components, modules, engines, and services described herein may be implemented as objects or processes that execute on the computing system (e.g., as separate threads).

In the description that follows, embodiments are described with reference to acts that are performed by one or more computing systems. If such acts are implemented in software, one or more processors of the associated computing system that performs the act direct the operation of the computing system in response to having executed computer-executable instructions. An example of such an operation involves the manipulation of data. The computer-executable instructions (and the manipulated data) may be stored in the memory 4204 of the computing system 4200.

Computing system 4200 may also contain communication channels 4208 that allow the computing system 4200 to communicate with other message processors over, for example, network 4210. Communication channels 4208 are examples of communications media. Communications media typically embody computer-readable instructions, data structures, program modules, or other data in a modulated data signal such as a carrier wave or other transport mechanism and include any information-delivery media. By way of example, and not limitation, communications media include wired media, such as wired networks and direct-wired connections, and wireless media such as acoustic, radio, infrared, and other wireless media. The term computer-readable media as used herein includes both storage media and communications media.

Embodiments within the scope of the present invention also include computer-readable media for carrying or having computer-executable instructions or data structures stored thereon. Such computer-readable media can be any available media that can be accessed by a general purpose or special purpose computer. By way of example, and not limitation, such computer-readable media can comprise physical storage and/or memory media such as RAM, ROM, EEPROM, CD-ROM or other optical disk storage, magnetic disk storage or other magnetic storage devices, or any other medium which can be used to carry or store desired program code means in the form of computer-executable instructions or data structures and which can be accessed by a general purpose or special purpose computer. Combinations of the above should also be included within the scope of computer-readable media.

Computer-executable instructions comprise, for example, instructions and data which cause a general purpose computer, special purpose computer, or special purpose processing device to perform a certain function or group of functions. Although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method, implemented at a computer system that includes one or more processors, for formulating a visual scene, the method comprising:
   accessing a plurality of shapes, each shape corresponding to a different object that is to be visually represented within a container, each shape including one or more dimensional attributes that each define a visual size of a corresponding dimension of the shape;
   accessing a data series, the data series including a plurality of data points that are each configured to be applied to at least one of the dimensional attributes of each of the plurality of shapes thereby defining a visual size of at least one dimension of each of the plurality of shapes, individually, when they are visually represented within the container;
   accessing a geometry, the geometry including:
      the container, which is configured to visually contain the plurality of shapes within the visual scene, and within which the data series is visualized when each of the plurality of shapes are visually rendered within the container, the container defining at least a coordinate system of the container and one or more dimensions of the container;
      one or more binding definitions that define how to apply each data point of the plurality of data points to the at least one of the dimensional attributes of a corresponding shape of the plurality of shapes; and
      one or more arrangement definitions that define how to map an axis set to the coordinate system of the container, and how to lay out the plurality of shapes within the one or more dimensions of the container, the one or more arrangement definitions including a plurality of solver-based layout helpers that determine an optimized positioning of each of the plurality of shapes within the container based on their size as defined by the plurality of data points, to arrange each of the plurality of shapes within the container, wherein the plurality of solver-based layout helpers include a local layout help that applies only to a binding definition or an arrangement definition, and a global layout helper that applies to the container generally; and populating the geometry with a visual representation of the data series using the plurality of shapes, including visually rendering each shape within the container according to the one or more binding definitions and the one or more arrangement definitions.

2. The method of claim 1, wherein the container specifies one or more of whether Euclidean axes are rectilinear or curvilinear, whether the container is planar or volume occupying, and whether the container is symmetrical about some dimension.

3. The method of claim 1, wherein the one or more binding definitions also define how to select from one or more of the plurality of shapes based on a data value.

4. The method of claim 1, wherein defining one or more dimensions of the container comprises defining one or more of an absolute dimension of the container, and proportionality of dimensions of the container.

5. The method of claim 1, wherein the container also defines one or more of one or more subdivisions that restrict where in the coordinate system of the container one or more of the plurality of shapes may be placed, and one or more outer boundaries of the container.

6. The method of claim 1, wherein the container also defines a visual attribute that is to be applied to shapes rendered within the container, the visual attribute selected from among a color, a texture, and a transparency.

7. The method of claim 1, wherein the one or more arrangement definitions also define one or more of how to map an axis set to one or more visual elements of the container, and how to interpolate between two or more shapes.

8. The method of claim 1, wherein accessing the data series comprises accessing a data stream object.

9. The method of claim 1, wherein at least one shape of the plurality of shapes is selected from among a point, a bar, a prism, a bubble, a surface patch, an image file, a 2-dimensional shape, and a 3-dimensional shape.

10. The method of claim 1, wherein the data series includes one or more attributes that declare one or more of a range, a quantization, and a resolution of a plot.

11. The method of claim 1, wherein the data series wraps a data type selected from among a table column, a table row, a hierarchy, and a dimensional hierarchy.

12. The method of claim 1, wherein at least one shape of the plurality of shapes is the result of populating another geometry.

13. The method of claim 1, wherein the one or more dimensions include Euclidian dimensions.

14. The method of claim 1, wherein the one or more dimensions include Non-Euclidian dimensions.

15. The method of claim 14, wherein the Non-Euclidian dimensions are selected from among animation, motion speed, clustering, stacking, color, and texture.

16. The method of claim 1, wherein the one or more dimensions include a declaration of one or more attributes selected from among visibility, conditional hiding, scrollability, titling, labeling, subdivision, plottable granularity, and permitted range.

17. The method of claim 1, wherein the one or more solver-based layout helpers include a local layout helper that applies only to a binding definition or an arrangement definition, and a global layout helper that applies to the container generally.

18. The method of claim 1, wherein at least one shape includes a visual attribute that affects an appearance of the at least one shape, and wherein at least one of the plurality of data points is applied to the visual attribute of the at least one shape.

19. The method of claim 1, wherein at least one of the plurality of solver-based helpers also determines how to interpolate between individual shapes with the plurality of shapes.

20. A computer program product comprising one or more hardware storage devices having stored thereon computer-executable instructions that, when executed by one or more processors of a computing system, cause the computing system to formulate a visual scene, including at least the following:

accessing a plurality of shapes, each shape corresponding to a different object that is to be visually represented within a container, each shape including one or more dimensional attributes that each define a visual size of a corresponding dimension of the shape;

accessing a data series, the data series including a plurality of data points that are each configured to be applied to at least one of the dimensional attributes of each of the plurality of shapes thereby defining a visual size of at least one dimension of each of the plurality of shapes, individually, when they are visually represented within the container;

accessing a geometry, the geometry including:
the container, which is configured to visually contain the plurality of shapes within the visual scene, and within which the data series is visualized when each of the plurality of shapes are visually rendered within the container, the container defining at least a coordinate system of the container and one or more dimensions of the container;

one or more binding definitions that define how to apply each data point of the plurality of data points to the at least one of the dimensional attributes of a corresponding shape of the plurality of shapes; and one or more arrangement definitions that define how to map an axis set to the coordinate system of the container, and how to lay out the plurality of shapes within the one or more dimensions of the container, the one or more arrangement definitions including a plurality of solver-based layout helpers that determine an optimized positioning of each of the plurality of shapes within the container based on their size as defined by the plurality of data points, to arrange each of the plurality of shapes within the container, wherein the plurality of solver-based layout helpers include a local layout help that applies only to a binding definition or an arrangement definition, and a global layout helper that applies to the container generally; and populating the geometry with a visual representation of the data series using the plurality of shapes, including visually rendering each shape within the container according to the one or more binding definitions and the one or more arrangement definitions.

21. A computer system, comprising:
one or more hardware processors; and
one or more hardware storage devices having stored thereon computer-executable instructions that are executable by the one or more hardware processors to cause the computer system to formulate a visual scene, the computer-executable instructions including instructions that are executable to configure the computer system to perform at least the following:
access a plurality of shapes, each shape corresponding to a different object that is to be visually represented within a container, each shape including one or more dimensional attributes that each define a visual size of a corresponding dimension of the shape;
access a data series, the data series including a plurality of data points that are each configured to be applied to at least one of the dimensional attributes of each of the plurality of shapes thereby defining a visual size of at least one dimension of each of the plurality of shapes, individually, when they are visually represented within the container;
access a geometry, the geometry including:
the container, which is configured to visually contain the plurality of shapes within the visual scene, and within which the data series is visualized when each of the plurality of shapes are visually rendered within the container, the container defining at least a coordinate system of the container and one or more dimensions of the container;
one or more binding definitions that define how to apply each data point of the plurality of data points to the at least one of the dimensional attributes of a corresponding shape of the plurality of shapes; and
one or more arrangement definitions that define how to map an axis set to the coordinate system of the container, and how to lay out the plurality of shapes within the one or more dimensions of the container, the one or more arrangement definitions including a plurality of solver-based layout helpers that determine an optimized positioning of each of the plurality of shapes within the container based on their size as defined by the plurality of data points, to arrange each of the plurality of shapes within the container, wherein the plurality of solver-based layout helpers include a local layout help that applies only to a binding definition or an arrangement definition, and a global layout helper that applies to the container generally; and
populate the geometry with a visual representation of the data series using the plurality of shapes, including visually rendering each shape within the container according to the one or more binding definitions and the one or more arrangement definitions.

* * * * *